(12) United States Patent
Bostaman et al.

(10) Patent No.: US 8,346,834 B2
(45) Date of Patent: Jan. 1, 2013

(54) INFORMATION PROCESSING DEVICE AND INFORMATION PROCESSING METHOD

(75) Inventors: Anas bin Muhamad Bostaman, Kanagawa (JP); Hideki Yokoshima, Kanagawa (JP); Masayoshi Abe, Tokyo (JP); Yuya Kondo, Kanagawa (JP); Yukitoshi Sanada, Tokyo (JP)

(73) Assignee: Sony Corporation, Tokyo (JP)

( * ) Notice: Subject to any disclaimer, the term of this patent is extended or adjusted under 35 U.S.C. 154(b) by 1373 days.

(21) Appl. No.: 11/946,437

(22) Filed: Nov. 28, 2007

(65) Prior Publication Data

US 2008/0256157 A1 Oct. 16, 2008

(30) Foreign Application Priority Data

Dec. 7, 2006 (JP) ................ P2006-330537

(51) Int. Cl.
*G06F 17/10* (2006.01)
(52) U.S. Cl. ...................... 708/300; 708/306
(58) Field of Classification Search .......... None
See application file for complete search history.

(56) References Cited

U.S. PATENT DOCUMENTS

| 5,471,411 | A | * | 11/1995 | Adams et al. | 708/300 |
|---|---|---|---|---|---|
| 5,561,424 | A | * | 10/1996 | Norsworthy et al. | 341/126 |
| 5,648,922 | A | * | 7/1997 | Han | 708/315 |
| 6,202,074 | B1 | | 3/2001 | Lipka | |
| 6,584,157 | B1 | | 6/2003 | Van Der Zwan et al. | |
| 2003/0080888 | A1 | | 5/2003 | Muhammad et al. | |
| 2004/0218693 | A1 | | 11/2004 | Hickling | |
| 2005/0283510 | A1 | * | 12/2005 | Hennedy | 708/300 |

FOREIGN PATENT DOCUMENTS

| JP | 11-17498 | 1/1999 |
|---|---|---|
| JP | 2003-322985 | 11/2003 |
| WO | WO 2006/077795 | 7/2006 |

OTHER PUBLICATIONS

Ville Eerola et al., "Direct Conversion Using Lowpass Sigma-Delta Modulation", ISCAS 1992, pp. 2653-2656.
K. Muhammad et al., "A Discrete-Time Bluetooth Receiver in a 0.13 um Digital CMOS Process", ISSCC2004, pp. 268-269.
P.P. Vaidyanathan, "Multirate Systems and Filter Banks", Prentice-Hall PTR, pp. 109-111.

* cited by examiner

*Primary Examiner* — Chuong D Ngo
*Assistant Examiner* — Michael D Yaary
(74) *Attorney, Agent, or Firm* — Finnegan, Henderson, Farabow, Garrett & Dunner, L.L.P.

(57) ABSTRACT

An information processing device for processing reception signals converted into digital signals, includes: a first conversion unit for executing sampling rate conversion of each of the digital signals to be computed with each tap coefficient of a K'th-order FIR filter; a filter computing unit for executing computation processing of the K'th order FIR filter on K digital signals each of which have been subjected to sampling rate conversion by the first conversion unit; and a control unit for controlling sampling rate conversion of the digital signals by the first conversion unit, and the computation processing of the K'th order FIR filter by the filter computing unit.

40 Claims, 39 Drawing Sheets

FIG. 19

|     | 0 | 1  | 2  | 3   | 4   | 5   | 6   | 7   | 8   | 9   | 10  | 11  | 12  | 13  | 14  | 15  |
|-----|---|----|----|-----|-----|-----|-----|-----|-----|-----|-----|-----|-----|-----|-----|-----|
| a0  | * | 0  | 32 | 64  | 96  | 128 | 160 | 192 | 224 | 256 | 288 | 320 | 352 | 384 | 416 | 448 | α
| a1  | * | 4  | 36 | 68  | 100 | 132 | 164 | 196 | 228 | 260 | 292 | 324 | 356 | 388 | 420 | 452 |
| a2  | * | 8  | 40 | 72  | 104 | 136 | 168 | 200 | 232 | 264 | 296 | 328 | 360 | 392 | 424 | 456 |
| a3  | * | 12 | 44 | 76  | 108 | 140 | 172 | 204 | 236 | 268 | 300 | 332 | 364 | 396 | 428 | 460 |
| a4  | * | 16 | 48 | 80  | 112 | 144 | 176 | 208 | 240 | 272 | 304 | 336 | 368 | 400 | 432 | 464 |
| a5  | * | 20 | 52 | 84  | 116 | 148 | 180 | 212 | 244 | 276 | 308 | 340 | 372 | 404 | 436 | 468 |
| a6  | * | 24 | 56 | 88  | 120 | 152 | 184 | 216 | 248 | 280 | 312 | 344 | 376 | 408 | 440 | 472 | β
| a7  | * | 28 | 60 | 92  | 124 | 156 | 188 | 220 | 252 | 284 | 316 | 348 | 380 | 412 | 444 | 476 |
| a8  | 0 | 32 | 64 | 96  | 128 | 160 | 192 | 224 | 256 | 288 | 320 | 352 | 384 | 416 | 448 | 480 |
| a9  | 4 | 36 | 68 | 100 | 132 | 164 | 196 | 228 | 260 | 292 | 324 | 356 | 388 | 420 | 452 | 484 |
| a10 | 8 | 40 | 72 | 104 | 136 | 168 | 200 | 232 | 264 | 296 | 328 | 360 | 392 | 424 | 456 | 488 |
| a11 | 12| 44 | 76 | 108 | 140 | 172 | 204 | 236 | 268 | 300 | 332 | 364 | 396 | 428 | 460 | 492 |
| a12 | 16| 48 | 80 | 112 | 144 | 176 | 208 | 240 | 272 | 304 | 336 | 368 | 400 | 432 | 464 | 496 |
| a13 | 20| 52 | 84 | 116 | 148 | 180 | 212 | 244 | 276 | 308 | 340 | 372 | 404 | 436 | 468 | 500 |
| a14 | 24| 56 | 88 | 120 | 152 | 184 | 216 | 248 | 280 | 312 | 344 | 376 | 408 | 440 | 472 | 504 |
| a15 | 28| 60 | 92 | 124 | 156 | 188 | 220 | 252 | 284 | 316 | 348 | 380 | 412 | 444 | 476 | 508 |

|    | 0  | 1  | 2  | 3   | 4   | 5   | 6   | 7   | 8   | 9   | 10  | 11  | 12  | 13  | 14  | 15  | 16  |
|----|----|----|----|-----|-----|-----|-----|-----|-----|-----|-----|-----|-----|-----|-----|-----|-----|
| b0 |    | 0  | 32 | 60  | 92  | 120 | 152 | 180 | 212 | 240 | 272 | 300 | 332 | 360 | 392 | 420 | 452 |
| b1 |    | 4  | 36 | 64  | 96  | 124 | 156 | 184 | 216 | 244 | 276 | 304 | 336 | 364 | 396 | 424 | 456 |
| b2 |    | 8  | [36]| 68 | [96]| 128 |[156]| 188 |[216]| 248 |[276]| 308 |[336]| 368 |[396]| 428 |[456]|
| b3 |    | 12 | 40 | 72  | 100 | 132 | 160 | 192 | 220 | 252 | 280 | 312 | 340 | 372 | 400 | 432 | 460 |
| b4 |    | 16 | 44 | 76  | 104 | 136 | 164 | 196 | 224 | 256 | 284 | 316 | 344 | 376 | 404 | 436 | 464 |
| b5 |    |[16]| 48 |[76] | 108 |[136]| 168 |[196]| 228 |[256]| 288 |[316]| 348 |[376]| 408 |[436]| 468 |
| b6 |    | 20 | 52 | 80  | 112 | 140 | 172 | 200 | 232 | 260 | 292 | 320 | 352 | 380 | 412 | 440 | 472 |
| b7 |    | 24 | 56 | 84  | 116 | 144 | 176 | 204 | 236 | 264 | 296 | 324 | 356 | 384 | 416 | 444 | 476 |
| b8 |    | 28 |[56]| 88  |[116]| 148 |[176]| 208 |[236]| 268 |[296]| 328 |[356]| 388 |[416]| 448 |[476]|

FIG. 33

|  | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| a0 | x | 0 | 32 | 64 | 96 | 128 | 160 | 192 | 224 | 256 | 288 | 320 | 352 | 384 | 416 | 448 |
| a1 | x | 4 | 36 | 68 | 100 | 132 | 164 | 196 | 228 | 260 | 292 | 324 | 356 | 388 | 420 | 452 |
| a2 | x | 8 | 40 | 72 | 104 | 136 | 168 | 200 | 232 | 264 | 296 | 328 | 360 | 392 | 424 | 456 |
| a3 | x | 12 | 44 | 76 | 108 | 140 | 172 | 204 | 236 | 268 | 300 | 332 | 364 | 396 | 428 | 460 |
| a4 | x | 16 | 48 | 80 | 112 | 144 | 176 | 208 | 240 | 272 | 304 | 336 | 368 | 400 | 432 | 464 |
| a5 | x | 20 | 52 | 84 | 116 | 148 | 180 | 212 | 244 | 276 | 308 | 340 | 372 | 404 | 436 | 468 |
| a6 | x | 24 | 56 | 88 | 120 | 152 | 184 | 216 | 248 | 280 | 312 | 344 | 376 | 408 | 440 | 472 |
| a7 | x | 28 | 60 | 92 | 124 | 156 | 188 | 220 | 252 | 284 | 316 | 348 | 380 | 412 | 444 | 476 |
| a8 | 0 | 32 | 64 | 96 | 128 | 160 | 192 | 224 | 256 | 288 | 320 | 352 | 384 | 416 | 448 | 480 |
| a9 | 4 | 36 | 68 | 100 | 132 | 164 | 196 | 228 | 260 | 292 | 324 | 356 | 388 | 420 | 452 | 484 |
| a10 | 8 | 40 | 72 | 104 | 136 | 168 | 200 | 232 | 264 | 296 | 328 | 360 | 392 | 424 | 456 | 488 |
| a11 | 12 | 44 | 76 | 108 | 140 | 172 | 204 | 236 | 268 | 300 | 332 | 364 | 396 | 428 | 460 | 492 |
| a12 | 16 | 48 | 80 | 112 | 144 | 176 | 208 | 240 | 272 | 304 | 336 | 368 | 400 | 432 | 464 | 496 |
| a13 | 20 | 52 | 84 | 116 | 148 | 180 | 212 | 244 | 276 | 308 | 340 | 372 | 404 | 436 | 468 | 500 |
| a14 | 24 | 56 | 88 | 120 | 152 | 184 | 216 | 248 | 280 | 312 | 344 | 376 | 408 | 440 | 472 | 504 |
| a15 | 28 | 60 | 92 | 124 | 156 | 188 | 220 | 252 | 284 | 316 | 348 | 380 | 412 | 444 | 476 | 508 |

|  | 0 | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|---|
| b0 |  | 0 | 28 | 60 | 88 | 120 | 148 | 180 | 208 | 240 | 268 | 300 | 328 | 360 | 388 | 420 | 448 |
| b1 |  | 4 | 32 | 64 | 92 | 124 | 152 | 184 | 212 | 244 | 272 | 304 | 332 | 364 | 392 | 424 | 452 |
| b2 |  | [4] | 36 | [64] | 96 | [124] | 156 | [184] | 216 | [244] | 276 | [304] | 336 | [364] | 396 | [424] | 456 |
| b3 |  | 8 | 40 | 68 | 100 | 128 | 160 | 188 | 220 | 248 | 280 | 308 | 340 | 368 | 400 | 428 | 460 |
| b4 |  | 12 | 44 | 72 | 104 | 132 | 164 | 192 | 224 | 252 | 284 | 312 | 344 | 372 | 404 | 432 | 464 |
| b5 |  | 16 | [44] | 76 | [104] | 136 | [164] | 196 | [224] | 256 | [284] | 316 | [344] | 376 | [404] | 436 | [464] |
| b6 |  | 20 | 48 | 80 | 108 | 140 | 168 | 200 | 228 | 260 | 288 | 320 | 348 | 380 | 408 | 440 | 468 |
| b7 |  | 24 | 52 | 84 | 112 | 144 | 172 | 204 | 232 | 264 | 292 | 324 | 352 | 384 | 412 | 444 | 472 |
| b8 |  | [24] | 56 | [84] | 116 | [144] | 176 | [204] | 236 | [264] | 296 | [324] | 356 | [384] | 416 | [444] | 476 |
| b9 |  | 0 | 32 | 60 | 92 | 120 | 152 | 180 | 212 | 240 | 272 | 300 | 332 | 360 | 392 | 420 | 452 |
| b10 |  | 4 | 36 | 64 | 96 | 124 | 156 | 184 | 216 | 244 | 276 | 304 | 336 | 364 | 396 | 424 | 456 |
| b11 |  | 8 | [36] | 68 | [96] | 128 | [156] | 188 | [216] | 248 | [276] | 308 | [336] | 368 | [396] | 428 | [456] |
| b12 |  | 12 | 40 | 72 | 100 | 132 | 160 | 192 | 220 | 252 | 280 | 312 | 340 | 372 | 400 | 432 | 460 |
| b13 |  | 16 | 44 | 76 | 104 | 136 | 164 | 196 | 224 | 256 | 284 | 316 | 344 | 376 | 404 | 436 | 464 |
| b14 |  | [16] | 48 | [76] | 108 | [136] | 168 | [196] | 228 | [256] | 288 | [316] | 348 | [376] | 408 | [436] | 468 |
| b15 |  | 20 | 52 | 80 | 112 | 140 | 172 | 200 | 232 | 260 | 292 | 320 | 352 | 380 | 412 | 440 | 472 |
| b16 |  | 24 | 56 | 84 | 116 | 144 | 176 | 204 | 236 | 264 | 296 | 324 | 356 | 384 | 416 | 444 | 476 |
| b17 |  | 28 | [56] | 88 | [116] | 148 | [176] | 208 | [236] | 268 | [296] | 328 | [356] | 388 | [416] | 448 | [476] |

FIG. 40

INFORMATION PROCESSING DEVICE AND INFORMATION PROCESSING METHOD

CROSS REFERENCES TO RELATED APPLICATIONS

The present invention contains subject matter related to Japanese Patent Application JP 2006-330537 filed in the Japanese Patent Office on Dec. 7, 2006, the entire contents of which are incorporated herein by reference.

BACKGROUND OF THE INVENTION

1. Field of the Invention

The present invention relates to an information processing device and information processing method, and particularly relates to an information processing device and information processing method suitable for using in cases of converting the sampling rate or oversampled reception signals.

2. Description of the Related Art

Semiconductor devices have become smaller and finer in recent years, and digital circuits have become capable of realizing lower power consumption and high speeds, with a smaller installation area as well. On the other hand, analog circuits cannot be expected to have reduction in installation area like digital circuits, and property deterioration due to the effects of reduced power source voltage, transistor mismatches, and so forth, is unavoidable. From this perspective, there is a need to change functions which had been realized with analog circuits over to digital domain, i.e., a need to reduce analog signal processing units and replace these with digital signal processing units.

The primary functions of the digital domain of a receiver in wireless communication are frequency conversion, orthogonal modulation, channel selection, AGC (Automatic Gain Control), and so forth; changing these over to the digital domain in an effective manner requires an A/D converter with a high operating frequency and a wide dynamic range.

A direct conversion method using lowpass sigma-delta modulation has been proposed as a method for efficiently satisfying such demands (e.g., see Ville Eerola, et al, "Direct Conversion Using Lowpass Sigma-Delta Modulation", ISCAS '92, pp 2653, 2656).

A known reception device 1 described therein will be described with reference to FIG. 1.

An input signal S(t) received by an unshown antenna is supplied to a bandpass filter (BPF) 11, subjected to band-limiting, and supplied to sigma-delta (ΣΔ) A/D converters 12-1 and 12-2.

The sigma-delta A/D converter 12-1 operates with a clock of the same frequency as the carrier wave frequency, and the sigma-delta A/D converter 12-2 operates with a clock having a phase difference of pi/2 as to the input clock of the sigma-delta A/D converter 12-1, each converting supplied RF signals into 1-bit bit strings and performing high order oversampling, thereby converting supplied analog signals into digital signals.

An LPF (Low pass filter) and decimation processing unit 13-1 which has received digital signals from the sigma-delta A/D converter 12-1 filters the supplied signals, performs decimation which is reducing the sampling rate of the supplied signal by a predetermined rate $X_1$ (i.e., multiplies by $1/X_1$), and outputs an I-channel signal. An LPF (Low pass filter) and decimation processing unit 13-2 which has received digital signals from the sigma-delta A/D converter 12-2 performs filtering and decimation of the supplied signals, and outputs a Q-channel signal.

Examples of known methods with receivers using such conversion methods include performing analog processing such as filtering in discrete time domain so as to reduce the operating frequency of the sigma-delta converters (e.g., see K. Muhammad, et al, "A Discrete-Time Bluetooth Receiver in a 0.13 μm Digital CMOS Process", ISSCC 2004, pp 268-269, and US 20030080888 A1, "Sigma-delta (ΣΔ) analog-to-digital converter (ADC) structure incorporating a direct sampling mixer"), arrangements using continuous time domain (e.g., see US 20040218693 A1, "Direct conversion delta-sigma receiver"), and so forth.

With the direct conversion method using sigma-delta modulation, channel selection filtering is realized primarily at the digital domain with very little attenuation of interfering waves being performed within the system bandwidth in the analog domain, so as to realize a fast sampling rate and wide dynamic range.

Also, quantization noise is added to the high-frequency component at the time of sigma-delta modulation, so there is the need for a filter for attenuation of quantization noise in the digital domain. Further, the sampling rate obtained from the output of the sigma-delta modulator is dependent on the channel frequency of the reception signals, and accordingly there is the need to convert to a frequency which the base band demands.

With the direct conversion method using sigma-delta modulation, these need to be realized in the digital domain, and also, there is the need for a flexible configuration regarding filtering and sampling rate conversion functions, in order to be able to handle various wireless systems.

In the case that the output bits of the sigma-delta modulator is 1-bit, there is a technique for realizing a FIR (Finite Impulse Response) filter and decimator without a multiplier, using memory and an adder and so forth (e.g., see U.S. Pat. No. 6,202,074 B1, "Multiplierless digital filtering", and U.S. Pat. No. 6,584,157 B1, "Digital low pass filter").

Next, a known example of a decimation filter outputting 1 bit will be described with reference to FIG. 2.

A 1-bit output series from an unshown sigma-delta modulator is input to an L-bit shift register 31, shifted by a timing of Fs, and 1 bit of serial signal is converted into N bits of parallel signals. An L-bit shift register 32 reads out the data of L bits at a timing of Fs/N, and based on each data, selects a positive or negative value for FIR tap coefficients (a1 or −a1, a2 or −a2, and so on) stored in memory 33, and the selected L tap coefficients are all added by an addition processing unit 34, thereby outputting signals that have been filtered and decimated.

With such a decimation filter, the 1 bit of input series only holds information for selecting whether the FIR filter tap coefficients are positive or negative. That is to say, storing information regarding whether the FIR tap coefficients are positive or negative in the memory 33 does away with the need for a multiplier.

Also, sigma-delta modulators generally have a great OSR (Over Sampling Ratio), so the sampling rate of output is very small as compared to the sampling rate of the input series. Accordingly, the speed demanded for addition processing normally is low.

The configuration of a digital block in IEEE 802.11g OFDM mode, to which the above-described decimation filter method has been applied, is as shown in FIG. 3, for example.

A SINC filter 51 executes moving-average computation. A decimator 52 reduces the sampling rate of the supplied signal by a predetermined rate $X_1$ (i.e., multiplies by $1/X_1$), and in this case, multiples the sampling rate of the input signal by ½ and outputs. A ΣΔ A/D converter 53 converts the supplied RF signal into a bit stream of 1 bit, and performs high order oversampling. An LPF 54 filters high-frequency signals at or above a predetermined frequency band. A decimator 55 multiples the sampling rate of the input signals by 1/32 and outputs.

A sampling rate conversion unit (SRC) 56 converts the input signals having a sampling rate of $Fs_2$ into output signals having a predetermined sampling rate of $Fs_3$. An LPF 57 filters high-frequency components of a predetermined frequency band or higher. A decimator 58 multiples the sampling rate of the input signal by ½ and outputs.

In the case of using a 2412 MHz channel, the output frequency has been multiplied by ½ at the decimator 52 and multiplied by 1/32 at the decimator 55 and accordingly is 37.6875 MHz, so a sampling rate conversion unit 56 needs to convert this into an integer multiple of 20 MHz as demanded by a baseband chip which performs downstream processing, e.g., 40 MHz.

In the case of converting the sampling rate from 37.6875 MHz to 40 MHz for the frequency of the signals supplied to the sampling rate conversion unit 56, a method is normally employed wherein up-sampling is performed to a clock which realizes the lowest common multiple of the two clocks, passed through a filter for removing aliasing, and then down-sampling is performed (e.g., see P. P. Vaidyanathan, "Multi-rate systems and filter banks", Prentice-Hall P T R).

FIG. 4 illustrates a further detailed configuration example of the sampling rate conversion unit 56.

An up-sampler 61 up-samples the frequency 37.6875 MHz of the signals supplied to the sampling rate conversion unit 56 640 times. An LPF 62 filters high-frequency signals at or above a predetermined frequency band to remove aliasing. A decimator 63 multiples the 24120 MHz signal frequency by 1/603 times to yield 40 MHz, which is then output.

Next, a different method for a sampling rate conversion unit will be described with reference to FIG. 5. Here, a sampling rate converter 71 which converts the frequency Fs of an input sample to 1.5 Fs will be described.

A resample processing unit 81 converts the frequency Fs of an input sample to 1.5 Fs. A CIC (Cascaded Integrator-Comb) filter is a filter which does not include a multiplier, with a comb filter which is a type of a FIR (Finite Impulse Response) being connected with a integrator which is a type of IIR (Infinite Impulse Response) in multiple stages. This filter is applicable to wideband signals, and exhibits steepness. A decimator 83 multiplies the frequency of the input signals by ½ and outputs.

Input/output of the resample processing unit 81 will be described with reference to FIG. 6. In the event of converting the frequency Fs of an input sample to 1.5 Fs, there is the need to output three samples as to two samples of signals input, so one sample of output needs to be interpolated with data of some sort. This means that with input signals shown in FIG. 7, aliasing is generated every 1.5 Fs×⅓=0.5 Fs frequency, as shown in FIG. 8. As shown in FIG. 6, using data of one timing earlier for the data to be inserted for interpolation allows aliasing signals to be attenuated, since this is equivalent to adding SINC filter properties (moving-average filter properties) to the aliasing signals generated. Further, output signals of a CIC filter 82 which is the addition average of every two samples of the 1.5 Fs signals can realize the SINC filter properties shown in FIG. 9, and accordingly can further attenuate aliasing components interfering at the time of decimation.

Symbols thus obtained are effected by aliasing if further subjected to ½ times decimation at the decimator 83. FIG. 10 shows the frequency properties of the output signals of the decimator 83. At this stage, aliasing signals are generated at 0.25 Fs and 0.5 Fs, but there is no program as long as the aliasing signals are attenuated to a permissible range at the SINC filter. Also, if the desired signal is a narrowband signal and aliasing signals do not interfere with the band, the effects thereof can be alleviated at a digital filter downstream.

Accordingly, as shown in FIG. 11, the decimation filter system shown in FIG. 5 is equivalent to having formed a two-stage SINC filter of SINC filters 91 and 92 between the resample processing unit 81 which performs 1.5 times up-sampling and the ½ times decimator 83, meaning that the implementation cost is very small.

A configuration example of a known digital block in IEEE 802.11g OFDM mode, to which the above-described sampling rate conversion method has been applied, is as shown in FIG. 12. Portions which correspond to those described with reference to FIGS. 3 and 5 are denoted with the same reference numerals, and description thereof will be omitted here.

With the arrangement in FIG. 12, in order to reduce implementation costs, the sampling rate of the output series of the upstream digital filter is set to 302 MHz using a ¼ times decimator 101, which is then input to the sampling rate conversion unit 71 including the resample processing unit 81 described with reference to FIG. 5. Interpolation processing is executed at the sampling rate conversion unit 71 using data of the previous timing, whereby the input 302 MHz signals are converted to 360 MHz and filtered, and the series thereof is subjected to 9-sample-addition and decimation at a decimator 102, so as to be output at 40 MHz. High-frequency component signals are filtered by the LPF 57 and the sampling rate of the input signals are multiplied by ½ at the decimator 58, thereby outputting signals of 20 MHz as demanded by the baseband chip.

SUMMARY OF THE INVENTION

In the case of using the method described with reference to FIGS. 3 and 4, the clock frequency for realizing the lowest common multiple of 37.6875 MHz and 40 MHz is 24120 MHz, and when installation of the downstream digital filter is taken into consideration, this is impractical from the perspective of power consumption and installation area.

Thus, the implementation costs of non-integer-ratio sampling rate conversion is generally great in implementation cost in digital domain, and reduction in implementation costs can only come through accepting property degradation.

Conversely, a system such as the decimation filter shown in FIG. 5 is equivalent to a two-stage configuration of SINC filters, so the implementation cost is very small. However, in the event of using SINC filters as an anti-aliasing filter, problems occur which necessitate consideration of property degradation, such as insufficient attenuation of aliasing, attenuation of the amplitude in the desired band, and so forth.

In order to minimize such effects, resampling is preferably performed at as high a frequency as possible, and the frequency range to be converted is set to or above the minimum desired band. Resampling at high frequency means that aliasing occurs further away from the desired band, which can be sufficiently attenuated by the SINC filters. That is to say, resampling at high frequency means that aliasing is not generated in the desired band, and the aliasing signals can be further attenuated using digital filters downstream. Also, this arrangement increases the notch frequency at the first-stage SINC filter, so the attenuation of the desired band is also smaller.

However, this also means that in the event that resampling is not performed at a high frequency, aliasing cannot be sufficiently attenuated unless using a steep filter, raising implementation costs.

That is to say, implementation costs of the sampling rate conversion block can be reduced by using the decimation filter system shown in FIG. 5 at higher frequencies, but in the event that resampling is executed at high frequencies, the speed demanded of the upstream digital filter increases, so power consumption increases markedly.

That is to say, combining known methods only results in either the power consumption increasing due to the speed demanded of the upstream digital filter increasing, or the implementation cost of sampling rate conversion increasing due to the need to use a steep filter.

There has been recognized a need to realize low power consumption and conformity to multiple standards while keeping the implementation cost of sampling rate conversion.

An information processing device for processing reception signals converted into digital signals, according to an embodiment of the present invention, includes: a first conversion unit for executing sampling rate conversion of each of the digital signals to be computed with each tap coefficient of a K'th-order FIR filter; a filter computing unit for executing computation processing of the K'th order FIR filter on K digital signals each of which have been subjected to sampling rate conversion by the first conversion unit; and a control unit for controlling sampling rate conversion of the digital signals by the first conversion unit, and the computation processing of the K'th order FIR filter by the filter computing unit.

The first conversion unit may execute sampling rate conversion by subjecting each of the digital signals to thinning out, interpolation, or filtering processing.

The first conversion unit may include: a second conversion unit for receiving input of the digital signals, and converting a predetermined L data groups out of the digital signals that have been input, into output of K series corresponding to the tap coefficients of the K'th-order FIR filter; K third conversion units for subjecting the L data groups output from the second conversion unit to interpolation and rate conversion, and outputting N data groups, N being a data count different from the data count L; and K addition processing units for adding data included in the N data groups output from the third conversion unit, and outputting.

The second conversion unit may output, as K series corresponding to the tap coefficients of the K'th order FIR filter, the L data groups, each delayed by integer multiples of an interval M (wherein M is an integer of 1 or greater) from predetermined signals in the digital signals that have been input.

The second conversion unit may receive input of the digital signals which are serial signals, convert into L-bit parallel signals, and output as the L data groups, and also output data with an operation clock 1/J (wherein J is an integer of 1 or greater) of the sampling frequency of the digital signals which are serial signals.

The second conversion unit may further include a plurality of signal holding units for holding the digital signals; with the plurality of signal holding unit sequentially holding the digital signals, thereby receiving input of the digital signals which are serial signals, converting into L-bit parallel signals, and outputting as the L data groups, and also outputting data with an operation clock 1/J (wherein J is an integer of 1 or greater) of the sampling frequency of the digital signals which are serial signals.

Of the K third conversion units, the third conversion unit which outputs a data series corresponding to the i'th ($0 \leq i \leq K$) tap coefficient may receive input of the L data groups delayed by $i, i+M, i+2M, \ldots, i+(L-1)M$ samples from the current timing, and execute interpolation processing by making selection regarding each input signal of the L data groups, based on control of the control unit, whether to output to one output terminal, output to two output terminals, or output to neither output terminal.

The third conversion unit may receive input of the L data groups at a first rate which is 1/J times the sampling frequency of the digital signals, and output the N data groups that have been interpolated, at a second rate which is different from the first rate.

The control unit may include: a first signal generating unit for generating first control signals for selecting, of the L data groups input to the third conversion units, signals to be output to two output terminals; and a second control signal generating unit for generating second control signals for selecting a start point of signals selected from the L data groups input to the third conversion unit as the N data groups output from the third conversion unit, and third control signals for instructing initialization of a delay amount from the start point in the previous output.

The second control signal generating unit may calculate the difference between the count of signals of the L data groups input to the third conversion unit at an immediately-preceding timing that have been output to two output terminals, and a predetermined threshold value, generate the second control signals for increasing the amount of the delay from the start point in the previous output by the difference that has been calculated, and supply the second control signals to the third control unit.

The second control signal generating unit may increment a counter value of a first counter by a predetermined value for each first rate which is 1/J times the sampling frequency of the digital signal supplied to the third conversion unit, generate the second control signals instructing initialization of the delay amount in the event that the counter value of the first counter exceeds a predetermined threshold, and supply the second control signals to the third control unit.

The N data groups may be parallel signals of N bits; with the predetermined value being a value determined by the first rate, and a second rate which is the rate of the N-bit parallel signals output from the third conversion unit.

The N data groups may be parallel signals of N bits; with the first control signal generating unit incrementing the counter value of a second counter for each sampling rate corresponding to a value obtained by subtracting, from the sampling rate of the digital signals supplied to the second conversion unit, the delay interval M between each data of the L data groups input to the third conversion unit, and also increment the counter value of a third counter by 1, and in the event that the counter value of the second counter has exceeded a predetermined threshold, initializing the counter value of the second counter, holding the counter value of the third counter, and incrementing the counter value of the third counter by 2, and generating the first control signal indicating which of the input signals the signals to be output to two output terminals are, for each rate of the N-bit parallel signals output from the third conversion unit, based on the counter value of the third counter that is held, supply the first control signal to the third control unit, and initialize the counter value of the third counter.

The predetermined value may be a value determined by the sampling rate of the digital signals supplied to the second conversion unit, the delay interval M between each data of the L data groups input to the third conversion unit, the number of bits N, and the rate of the N-bit parallel signals output from the third conversion unit.

The N data groups may be parallel signals of N bits; with the first control signal generating unit incrementing the counter value of a second counter by a predetermined value for each sampling rate corresponding to a value obtained by subtracting, from the sampling rate of the digital signals supplied to the second conversion unit, the delay interval M between each data of the L data groups input to the third conversion unit, and in the event that the counter value of the second counter has exceeded a predetermined threshold, initializing the counter value of the second counter, and incrementing the counter value of the third counter, and generating the first control signal indicating the count of the signals to be output to two output terminals, for each rate of the N-bit parallel signals output from the third conversion unit, based on the counter value of the third counter that is held, supply the first control signal to the third control unit, and initialize the counter value of the third counter.

The predetermined value may be a value determined by the sampling rate of the digital signals supplied to the second conversion unit, the delay interval M between each data of the L data groups input to the third conversion unit, the number of bits N, and the rate of the N-bit parallel signals output from the third conversion unit.

The N data groups may be parallel signals of N bits; with interpolation processing executed by the third conversion unit interpolating signals at a rate of one sample per Fin/(MN−Fout−Fin) samples, based on a sampling rate Fin of the digital signals supplied to the second conversion unit, the delay interval M between each data of the L data groups input to the third conversion unit, the number of bits N, and a rate Fout of the N bits of parallel signals output from the third conversion unit.

Of the K third conversion units, the third conversion unit which outputs a data series corresponding to the i'th ($0 \leq i \leq K$) tap coefficient may receive input of the L data groups delayed by i, i+M, i+2M, . . . , i+(L−1)M samples from the current timing, and execute interpolation processing by making selection regarding each input signal of the L data groups, based on control of the control unit, whether to output to one output terminal, output to two output terminals, output to three output terminals, or output to no output terminal.

The control unit may include: a first signal generating unit for generating first control signals for selecting, of the L data groups input to the third conversion unit, signals to be output to three output terminals; and a second control signal generating unit for generating second control signals for selecting a start point of signals selected from the L data groups input to the third conversion unit as the N data groups output from the third conversion unit, and third control signals for instructing initialization of a delay amount from the start point in the previous output.

The third conversion unit may execute interpolation processing such that two systems of output, interpolated on the average at a similar rate; with the second control signal generating unit calculating the difference between the count of signals of the L data groups input to the third conversion unit at an immediately-preceding timing that have been output to two output terminals at the time of output of either of the two systems of output, and a predetermined threshold value, generating the second control signals for increasing the amount of the delay from the start point in the previous output by the difference that has been calculated, and supplying the second control signals to the third control unit.

The second control signal generating unit may increment a counter value of a first counter by a predetermined value for each first rate which is 1/J times the sampling frequency of the digital signal supplied to the third conversion unit, generate the second control signals instructing initialization of the delay amount in the event that the counter value of the first counter exceeds a predetermined threshold, and supply the second control signals to the third control unit.

The N data groups may be parallel signals of N bits; with the first control signal generating unit incrementing the counter value of a second counter by a predetermined value for each sampling rate corresponding to a value obtained by dividing the sampling rate of the digital signals supplied to the second conversion unit by the delay interval M between each data of the L data groups input to the third conversion unit, and also incrementing the counter values of a third counter and a fourth counter by 1, and in the event that the counter value of the second counter has exceeded a predetermined first threshold, initializing the counter value of the second counter, holding the counter value of the third counter, incrementing the counter value of the third counter by 2, and initializing the fourth counter, in the event that the counter value of the fourth counter is equal to a predetermined second threshold, holding the counter value of the third counter and incrementing the counter value of the fourth counter by 2, and generating the first control signal indicating which of the input signals the signals to be output to three output terminals are, for each rate of the N-bit parallel signals output from the third conversion unit, based on the counter value of the third counter that is held, supplying the first control signal to the third control unit, and initializing the counter value of the third counter.

The N data groups may be parallel signals of N bits; with the third conversion unit generating X sets of N/X-bit signals in which signals have been interpolated at a rate of one sample per Fin/(MNFout−Fin) samples, based on a sampling rate Fin of the digital signals supplied to the second conversion unit, the delay interval M between each data of the L data groups, the number of bits N, and a rate Fout of the N bits of parallel signals output from the third conversion unit.

The third conversion unit may include: a plurality of interpolation processing units; and a synthesizing unit for synthesizing output signals of the plurality of interpolation processing unit to generate the N data groups; with the plurality of interpolation processing units which the third conversion unit has outputting a data series corresponding to, of the K third conversion units, the i'th ($0 \leq i \leq K$) tap coefficient, receiving input of the L data groups delayed by i, i+M, i+2M, . . . , i+(L−1)M samples from the current timing, and executing interpolation processing by making selection regarding each input signal of the L data groups, based on control of the control unit, whether to output to one output terminal, output to two output terminals, or output to neither output terminal, and output N data each; and synthesizing data output from each of the plurality of interpolation unit, so as to generate the N data groups.

The control unit may include: a first signal generating unit for generating, for each of the plurality of interpolation unit of the third conversion unit, first control signals for selecting, of the L data groups input to the plurality of interpolation unit, signals to be output to two output terminals; and a second control signal generating unit for generating second control signals for selecting a start point of signals selected from the L data groups input to the plurality of interpolation unit of the third conversion unit as data output from the interpolation unit, and third control signals for instructing initialization of a delay amount from the start point in the previous output.

The second control signal generating unit may calculate the difference between the count of signals of the L data groups input to the interpolation unit at an immediately-preceding timing that have been output thereby to two output terminals, and a predetermined threshold value, generate the second control signals for increasing the amount of the delay from the start point in the previous output by the difference that has been calculated, and supply the second control signals to the interpolation unit.

The second control signal generating unit may increment a counter value of a first counter by a predetermined value for each first rate which is 1/J times the sampling frequency of the digital signal supplied to the third conversion unit, generate the second control signals instructing initialization of the delay amount in the event that the counter value of the first counter exceeds a predetermined threshold, and supply the second control signals to the third control unit.

The N data groups may be parallel signals of N bits; with the first control signal generating unit incrementing the counter value of a second counter by a predetermined value for each sampling rate corresponding to a value obtained by dividing the sampling rate of the digital signals supplied to the second conversion unit by the delay interval M between each data of the L data groups input to the third conversion unit, and also incrementing the counter values of a third counter and a fourth counter by 1, and in the event that the counter value of the second counter has exceeded a predetermined first threshold, initializing the counter value of the second counter, holding the counter value of the third counter, incrementing the counter value of the third counter by 2, and initializing the fourth counter, in the event that the counter value of the fourth counter is equal to a predetermined second threshold, holding the counter value of the third counter and incrementing the counter value of the fourth counter by 2, and generating, for each of the interpolation unit, the first control signal indicating which of the input signals the signals to be output to two output terminals are, for each rate of the N-bit parallel signals output from the third conversion unit, based on the counter value of the third counter that is held, supply the first control signal to the plurality of interpolation unit of the third control unit, and initialize the counter value of the third counter.

The N data groups may be parallel signals of N bits; with the interpolation units generating N-bit signals in which signals have been interpolated at a rate of one sample per Fin/(MNFout−Fin) samples, based on a sampling rate Fin of the digital signals supplied to the second conversion unit, the delay interval M between each data of the L data groups, the number of bits N, and a rate Fout of the N bits of parallel signals output from the third conversion unit.

The filter computing unit may include: a tap coefficient storage unit for storing tap coefficients corresponding to a plurality of wireless systems; with a tap coefficient corresponding to a currently-used wireless system being selected from the tap coefficients corresponding to a plurality of wireless systems stored by the tap coefficient storage unit, and the K'th-order FIR filter computation processing being executed on K digital signals subjected to sampling rate conversion by the first conversion unit.

The first conversion unit may include: a second conversion unit for receiving input of the digital signals, and output, as K series corresponding to the tap coefficients of the K'th order FIR filter, L data groups, each delayed by integer multiples of an interval M (wherein M is an integer of 1 or greater) from predetermined signals in the digital signals that have been input; K third conversion units for subjecting the L data groups output from the second conversion unit to interpolation processing and rate conversion, and outputting N data groups, N being a data count different from the data count L; and K addition or selection processing units for adding data included in the N data groups output from the second conversion unit, or selecting one of predetermined signals from the N data groups output from the second conversion unit.

The addition or selection processing unit may output, based on a modulation scheme of the reception signals, one or the other of addition results of the signals of the N data groups output from the second conversion unit, or the predetermined signal selected from the N data groups output from the second conversion unit.

In the event that the reception signals are reception signals to which the IEEE 802.11a or IEEE 802.11g standards have been applied, the addition or selection processing unit may output addition results of the N data groups output from the second conversion unit in the event that the modulation scheme thereof is 16-QAM or 64-QAM, and output the predetermined signal selected from the N data groups output from the second conversion unit in the event that the modulation scheme thereof is BPSK or QPSK.

The first conversion unit may include: a second conversion unit for receiving input of the digital signals, and output, as K series corresponding to the tap coefficients of the K'th order FIR filter, L data groups, each delayed by integer multiples of an interval M (wherein M is an integer of 1 or greater) from predetermined signals in the digital signals that have been input; K third conversion units for subjecting the L data groups output from the second conversion unit to interpolation processing and rate conversion, and outputting N data groups, N being a data count different from the data count L; and K selection processing units for selecting one of predetermined signals from the N data groups output from the second conversion unit.

An information processing method of an information processing device for processing reception signals converted into digital signals, according to an embodiment of the present invention, includes the steps of: executing sampling rate conversion of each of the digital signals to be computed with each tap coefficient of a K'th-order FIR filter; and executing computation processing of the K'th order FIR filter on K digital signals each of which have been subjected to sampling rate conversion.

Sampling rate conversion executed on each of the digital signals may be sampling rate conversion including thinning out, interpolation, or filtering processing, to which each of the digital signals is subjected.

The executing sampling rate conversion of each of the digital signals to be computed with each tap coefficient of a K'th-order FIR filter may include the steps of: decimating the digital signals to be computed with each tap coefficient of a K'th-order FIR filter by a predetermined rate M; subjecting the decimated signals to interpolation processing and sampling rate conversion; and adding the signals that have been subjected to interpolation and sampling rate conversion, and outputting.

Signals that have been subjected to interpolation and sampling rate conversion may be parallel signals of N samples; with, in the interpolation processing, signals being interpolated at a rate of one sample per Fin/(MNFout−Fin) samples, based on a sampling rate Fin of the digital signals, the decimation rate M, the number of samples N to be added, and a rate Fout of the N samples of parallel signals to be added.

The executing sampling rate conversion of each of the digital signals to be computed with each tap coefficient of a K'th-order FIR filter may include the steps of: decimating the digital signals to be computed with each tap coefficient of the K'th-order FIR filter by a predetermined rate M; subjecting the decimated signals to interpolation processing and rate conversion; and either adding the signals that have been subjected to interpolation and sampling rate conversion, or selecting one predetermined signal from the predetermined N sample signals, and outputting.

In the adding of signals subjected to interpolation and rate conversion or selecting and outputting one predetermined signal from signals which have been subjected to interpolation and rate conversion, either the addition results or the selected predetermined signal may be output, based on a modulation scheme of the reception signals.

In the outputting of addition results or selecting and outputting of one predetermined signal, in the event that the reception signals are reception signals to which the IEEE 802.11a or IEEE 802.11g standards have been applied, addition results of the N samples may be output in the event that the modulation scheme thereof is 16-QAM or 64-QAM, and the predetermined signal selected from the N samples may be output in the event that the modulation scheme thereof is BPSK or QPSK.

The executing sampling rate conversion of each of the digital signals to be computed with each tap coefficient of a K'th-order FIR filter may include the steps of: decimating the digital signals to be computed with each tap coefficient of the K'th-order FIR filter by a predetermined rate M; subjecting the decimated signals to interpolation processing and rate conversion; and selecting one predetermined signal from N predetermined sample signals that have been subjected to interpolation and rate conversion, and outputting.

According to an embodiment of the present invention, reception signals converted into digital signals are obtained, sampling rate conversion is performed for each of the digital signals to be computed with each tap coefficient of a K'th-order FIR filter, and computation processing of the K'th order FIR filter is performed on K digital signals which have been subjected to sampling rate conversion.

The term "network" refers to an arrangement wherein at least two devices are connected, such that information can be transferred from one device to another device. Devices communicating via a network may be each standalone devices, or may be internal blocks making up a single device.

Also, the term "communication" includes not only wireless communication and cable communication as a matter of course, but also includes communication wherein wireless communication and cable communication coexist, for example, an arrangement wherein wireless communication is performed for a certain section, and cable communication is performed for another section. Further, arrangements may be made wherein, for example, communication from one device to another device is made over cable, while communication from the other device to the one device is made wirelessly.

An information processing device which controls reception signals may be included in a reception device, or may be a standalone device. Also, the reception device may be a standalone device, or may be a block in a transmission/reception device or information processing device which performs reception processing.

Thus, according to embodiments of the present invention, sampling rate conversion and filtering functionality can be realized, and particularly, sampling rate conversion and filtering functionality can be realized without raising power consumption by raising the speed demanded by digital filters, or using steep filters. Accordingly, low power consumption and capabilities to handle multiple standards can be realized while keeping the implementation costs of digital filters and sampling rate conversion.

BRIEF DESCRIPTION OF THE DRAWINGS

FIG. 19 is a diagram illustrating input/output of the selector in FIG. 15;

FIG. 33 is a diagram illustrating input/output of the selector in FIG. 30;

FIG. 40 is a diagram illustrating input/output of a first selector and the second selector in FIG. 38;

DESCRIPTION OF THE PREFERRED EMBODIMENTS

The embodiments of the present invention will be described below with reference to the diagrams.

A digital block having a sampling rate converting function wherein the present invention is applied is arranged to execute signal processing which is basically the same as a known case described with reference to FIG. 12 with a receiving device, without increasing the sampling frequency of the digital filter output, wherein a favorable receiving signal without aliasing can be obtained.

Figure 13:
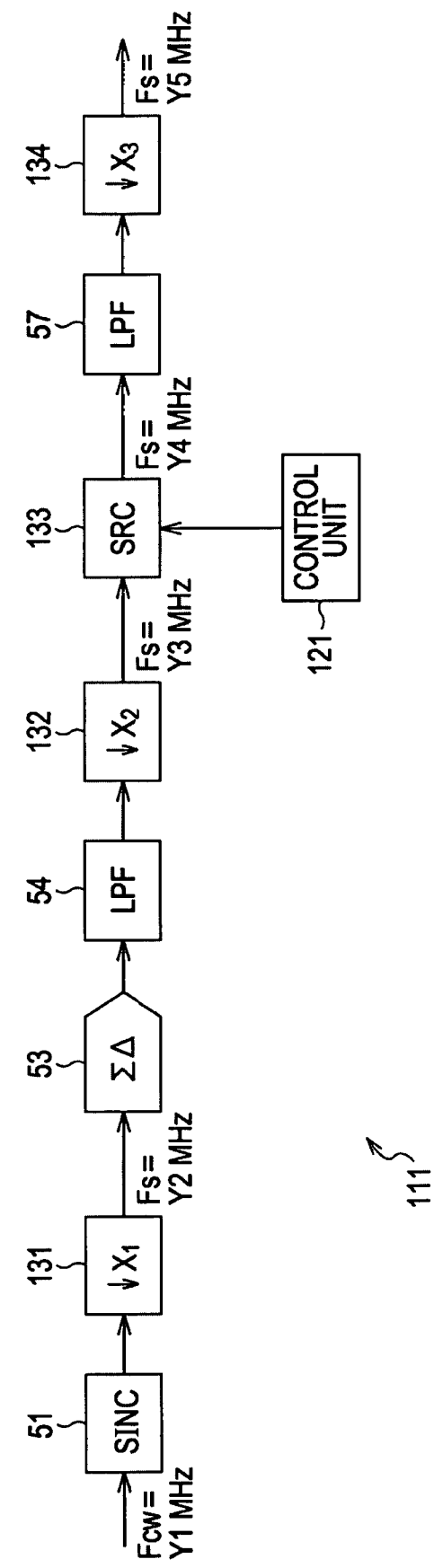
FIG. 13 is a block diagram illustrating the configuration of a digital block in known IEEE 802.11g OFDM mode, to which the decimation filter method has been applied.

FIG. 13 is a block diagram showing the configuration of a digital block 111 in IEEE 802.11g OFDM mode wherein a decimation filter method is applied.

Figure 1:
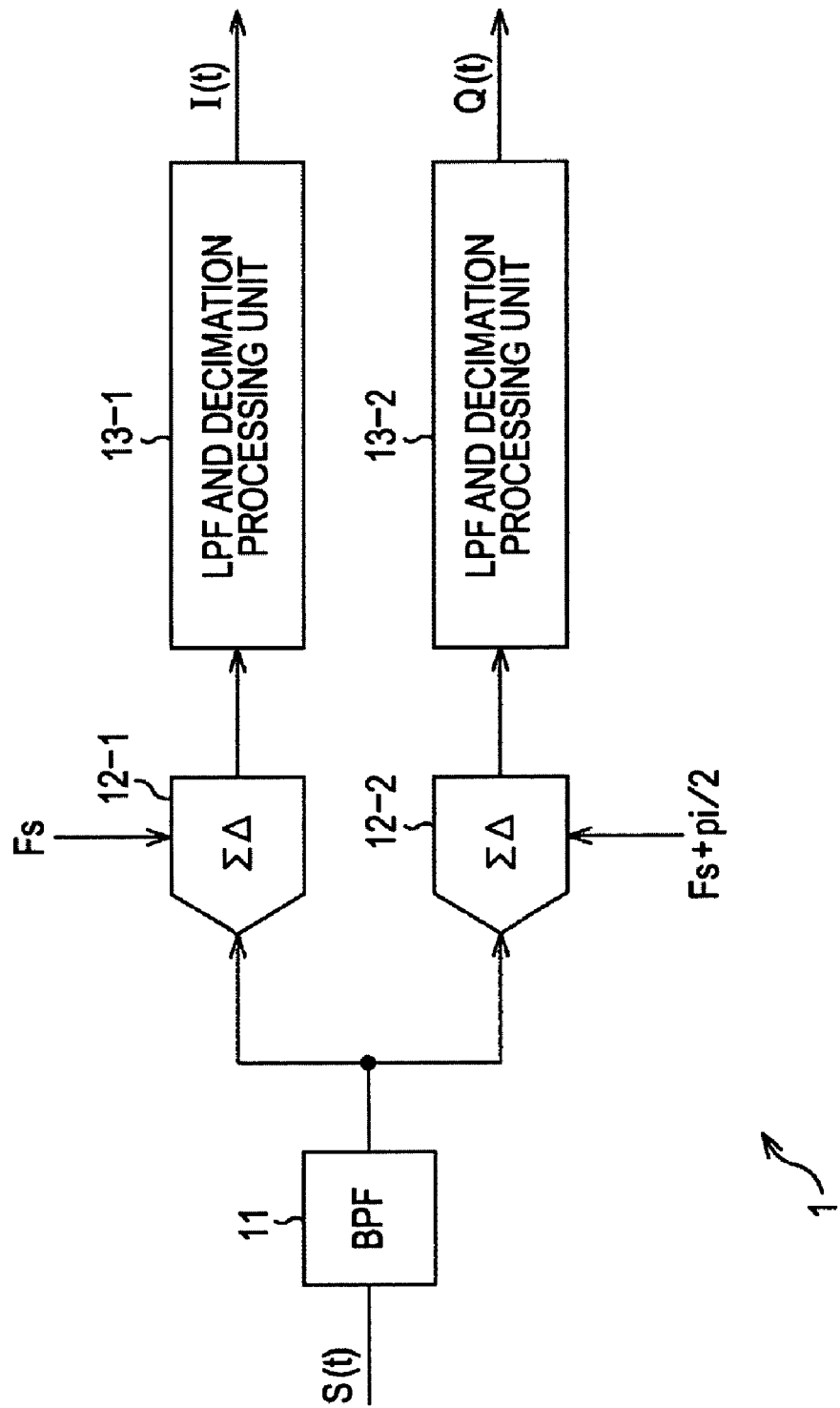
FIG. 1 is a diagram for describing a reception device 1.
Figure 2:
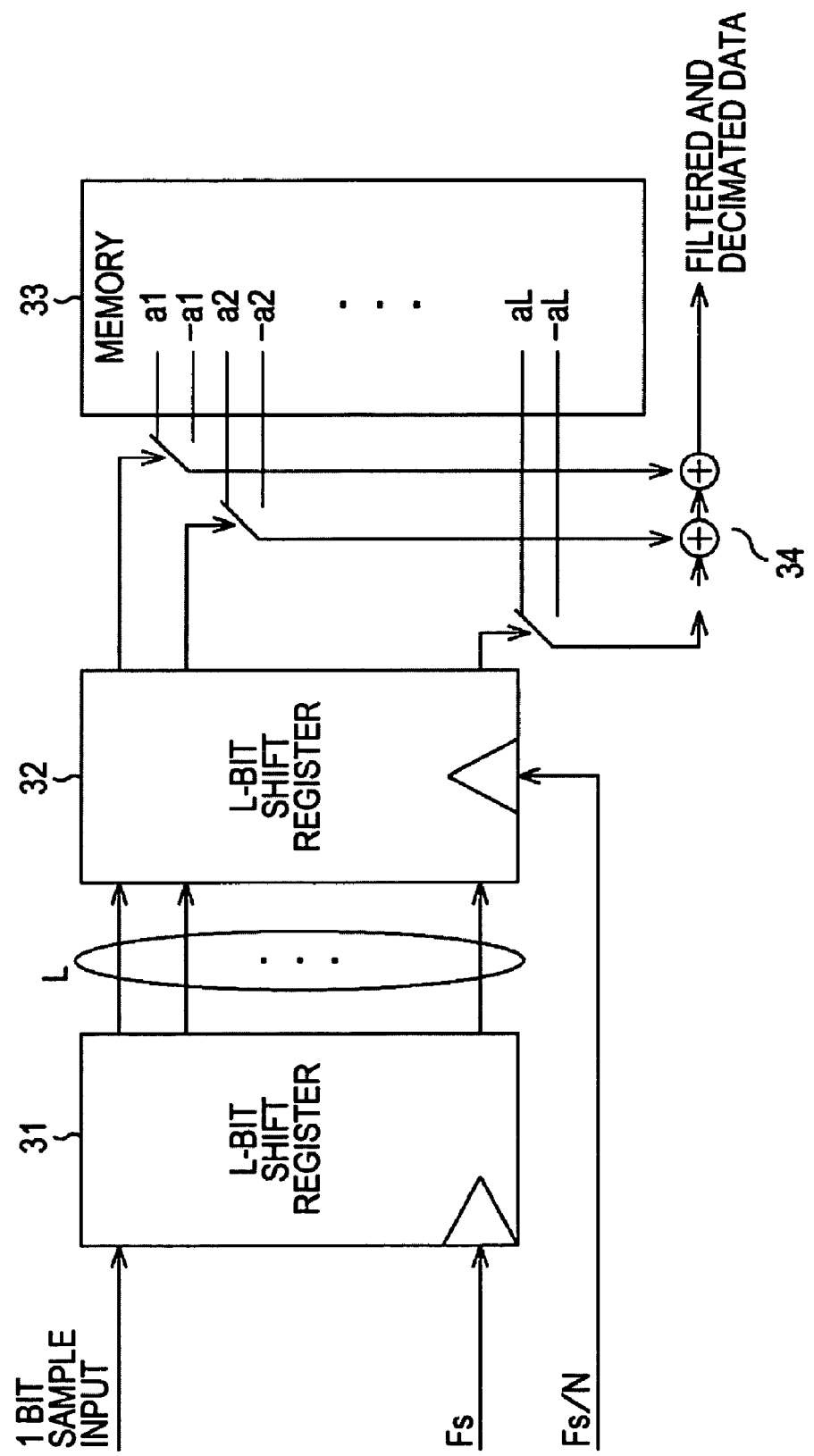
FIG. 2 is a diagram for describing a known example of a decimation filter at the time of 1-bit output.
Figure 3:
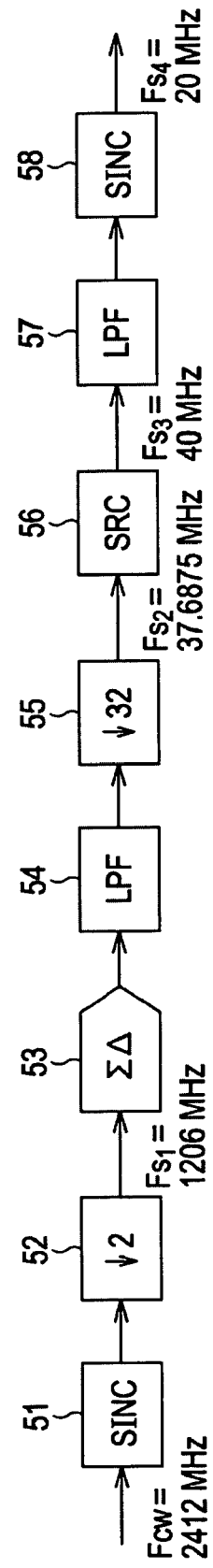
FIG. 3 is a diagram for describing the configuration of a digital block in known IEEE 802.11g OFDM mode.
Figure 4:
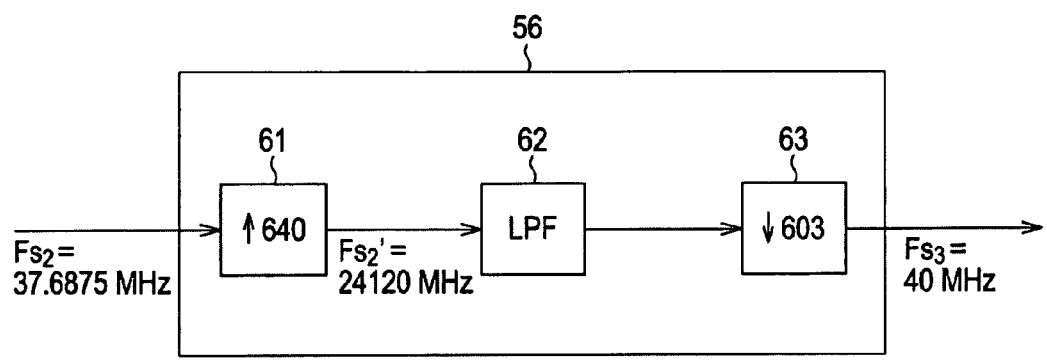
FIG. 4 is a block diagram illustrating the configuration of a sampling rate conversion unit shown in FIG. 3.
Figure 5:
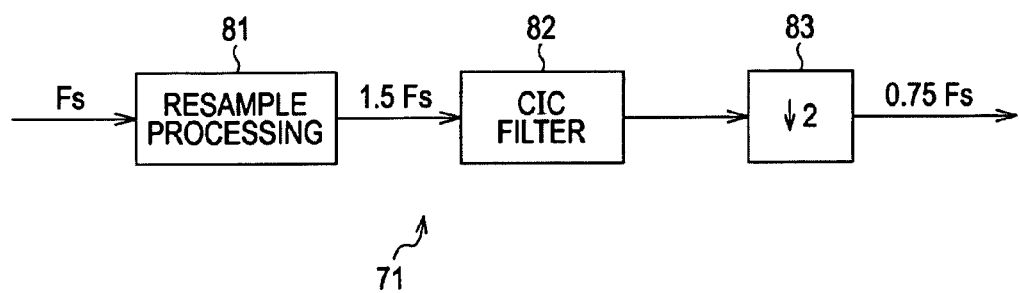
FIG. 5 is a diagram for describing a different method of a known sampling rate conversion unit.
Figure 6:
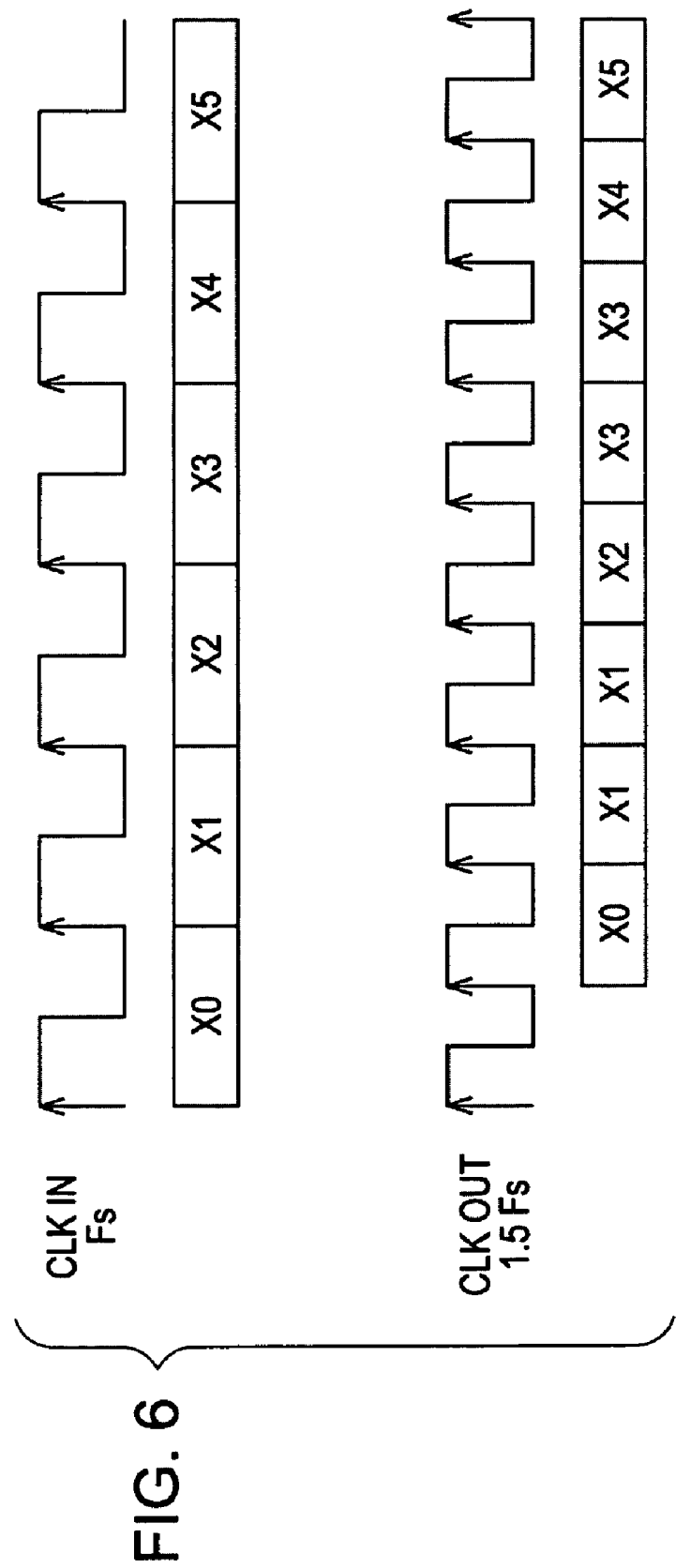
FIG. 6 is a diagram for describing input/output of a resample processing unit shown in FIG. 5.
Figure 7:
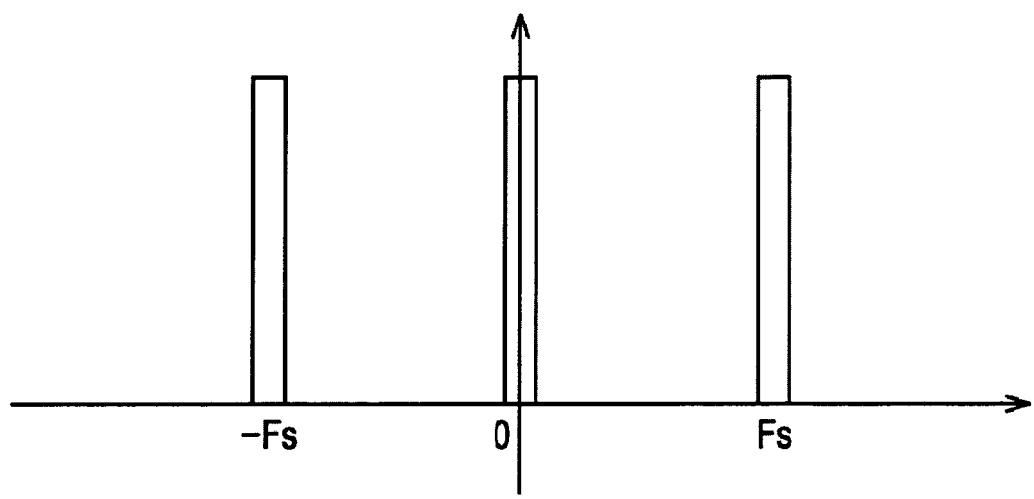
FIG. 7 is a diagram illustrating input signals of the resample processing unit shown in FIG. 5.
Figure 8:
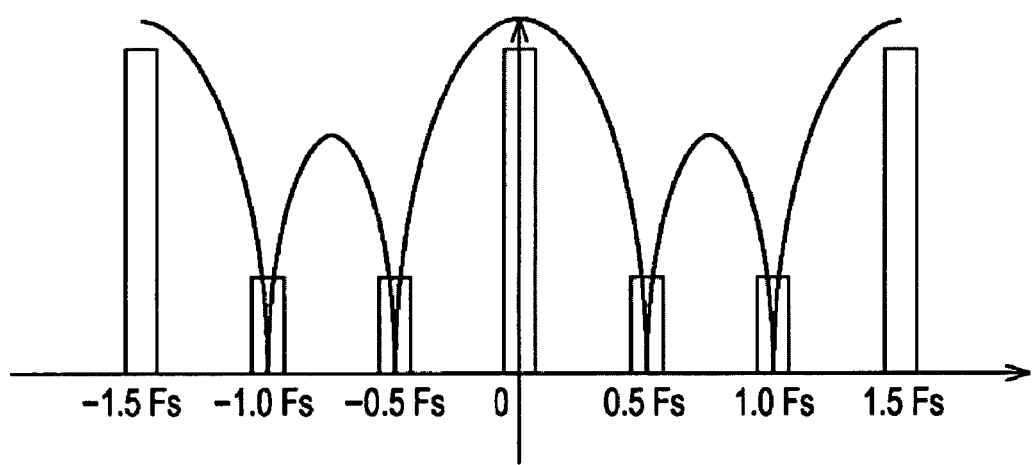
FIG. 8 is a diagram illustrating aliasing occurring in input signals of the resample processing unit shown in FIG. 5.
Figure 9:
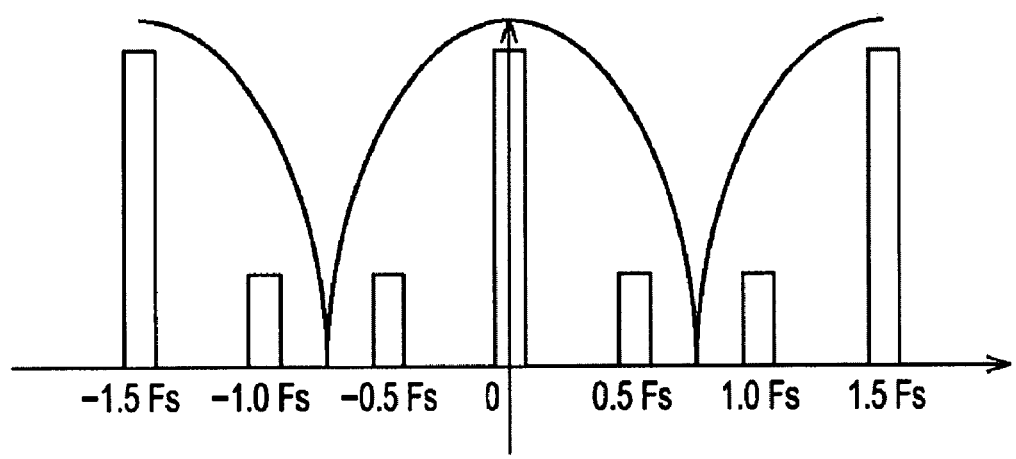
FIG. 9 is a diagram for describing SINC filter properties.
Figure 10:
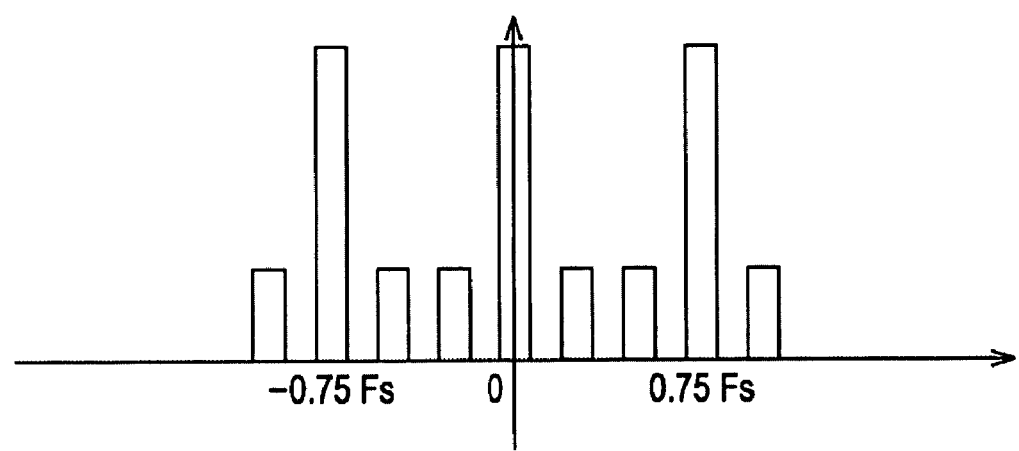
FIG. 10 is a diagram for describing properties of output signals of a decimator.
Figure 11:
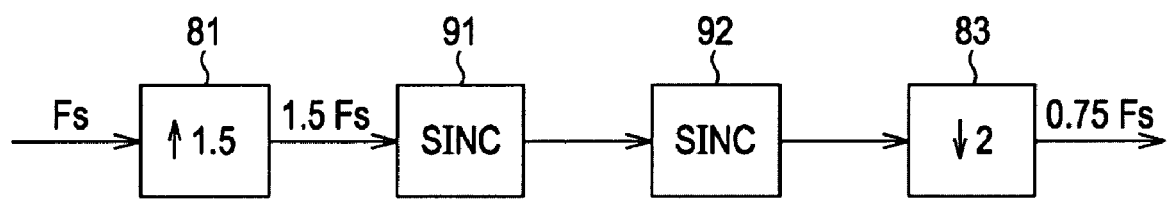
FIG. 11 is a diagram illustrating an equivalent system to the decimation filter in FIG. 5.

Note that the portions corresponding to the known case described with reference to FIG. 3 uses the same reference numerals, and the description thereof will be omitted as appropriate.

A SINC filter 51 receives an input signal with frequency Y1 MHz and executes moving average calculations. A decimator 131 reduces the sampling rate of the supplied signal at a predetermined ration $X_1$, (i.e. decimates at a predetermined ratio of $X_1$, or multiplies by $1/X_1$). Let us say that the output frequency of the decimator 131 is Y2 MHz. A ΣΔ A/D converting unit 53 converts a supplied RF signal into a 1-bit row, and subjects this to high order over-sampling. An LPF 54 filters out signals of high-frequency components of a predetermined frequency band or higher. A decimator 132 reduces the sampling rate of the input signal by a predetermined ratio $X_2$ (i.e. decimates at a predetermined ratio of $X_2$, or multiplies by $1/X_2$). Let us say that the output frequency of the decimator 131 is Y3 MHz.

The control unit 121 receives external input of information for receiving channel frequency or frequency demanded by an unshown signal processing unit at a latter stage of processing for the receiving signal, via an unshown operation input unit or an input terminal receiving a supplied control signal or the like, for example.

A sampling rate conversion unit (SRC) 133 converts the input signal of sampling rate Fs=Y3 MHz to an output signal of a predetermined sampling rate Fs=Y4 MHz. The details of the sampling rate conversion unit 133 will be described later.

An LPF 57 filters a high-frequency component signal greater than a predetermined frequency bandwidth. A decimator 58 reduces the sampling rate Y4 MHz of the input signal by a predetermined ratio $X_3$ (multiplies by $1/X_3$). Let us say that the output frequency of the decimator 134, i.e. the frequency of the output signal of the digital block 111 shown in FIG. 13 is Y5 MHz.

The ratio of reduction of the sampling rate for the supplied signals at the decimator 131, decimator 132, and decimator 134 differ by input channel and by the frequency demanded by the unshown signal processing unit at a latter stage of processing for the receiving signal, and are designed as appropriate.

The receiving device which is configured to include a digital block 111 having the sampling rate conversion unit 133 with application to the present invention is arranged such that a suitable reception signal without aliasing can be obtained, without increasing the sampling frequency of the digital filter output.

For example, upon the input signal series of 1.2 GHz being converted into 360 MHz sampling-rate, this is decimated to ⅑, and converted to 40 MHz. With this case as an example, the principle of such operations will be described.

For example, in the event that an input signal series of a sampling rate 1.2 GHz is expressed as in Expression (1) and a tap coefficient of a k'th order FIR filter is expressed in Expression (2), the output signal subjected to filtering and thinned out to ¼ is expressed in Expression (3).

$$X = [x_0, x_1, x_2, \ldots] \quad (1)$$

$$H = [h_0, h_1, h_2, \ldots, h_{K-1}] \quad (2)$$

$$Y = [y_0, y_1, y_2, \ldots] = [h_0, h_1, h_2, \ldots, h_{K-1}] \begin{bmatrix} X_{k-1} & X_{k+3} & X_{k+7} & \ldots \\ X_{k-2} & X_{k+2} & X_{k+6} & \ldots \\ \vdots & \vdots & \vdots & \\ x_0 & x_4 & x_8 & \ldots \end{bmatrix} \quad (3)$$

The output signal shown in Expression (3) has the input signal series of the sampling rate 1.2 GHz thinned out to ¼, so this is a signal of 300 MHz.

Next, the 300 MHz signal is subjected to sampling rate conversion to 360 MHz. Let us say that the 300 MHz clock frequency is Fa, the sampling interval is Ta, the 360 MHz clock frequency is Fd, and the sampling interval is Td, wherein the ratio of sampling intervals between both clocks is expressed with the following Expression (4).

$$\frac{T_d}{T_a} = \frac{F_a}{F_d} = \frac{300 \times 10^6}{360 \times 10^6} = \frac{5}{6} = 1 - \frac{1}{6} \quad (4)$$

Expression (4) indicates that the 360 MHz signal is at the sixth sample timing when the 300 MHz signal is at the fifth sample timing. That is to say, in the case that the 300 MHz signal is at the fifth sample timing, the data for the sixth sample of the 360 MHz output signal must be interpolated. In this case, interpolation employing input data with the previous timing at the ratio of one sample to five samples must be performed. The signal series thereof can be expressed with the following Expression (5).

$$Z' = [y_0, y_1, y_2, y_3, y_4, y_5, \ldots] \quad (5)$$

Next, this signal series is decimated to ⅑ by nine samples being added together. The 40 MHz output signal obtained by the 360 MHz output signal decimated to ⅑ is expressed with the following Expression (6), wherein one sample $Z_0$ of the output signals is expressed with Expression (7).

$$Z = [z_0, z_1, \ldots] = [1,1,1,1,1,1,1,1,1,] \begin{bmatrix} y_0 & y_8 & \ldots \\ y_1 & y_9 & \\ y_2 & y_9 & \\ y_3 & y_{10} & \\ y_4 & y_{11} & \\ y_4 & y_{12} & \\ y_5 & y_{13} & \\ y_6 & y_{14} & \\ y_7 & y_{14} & \ldots \end{bmatrix} \quad (6)$$

$$\begin{aligned} z_0 &= y_0 + y_1 + y_2 + y_3 + y_4 + y_5 + y_6 + y_7 \quad (7)\\ &= h_0(X_{K-1} + X_{K+3} + X_{K+3} + X_{K+3} + X_{K+3} + X_{K+3} + X_{K+3} +\\ &\quad X_{K+3} + X_{K+3}) + h_1(X_{K-2} + X_{K+2} + X_{K+6} + X_{K10} + X_{K+4} +\\ &\quad X_{K+4} + X_{K+8} + X_{K+2} + X_{K+6}) + \ldots \end{aligned}$$

With Expression (7), we can see that even if rate conversion by interpolation for each input data corresponding to each tap coefficient, and decimation by addition, is executed, and filtering processing is performed as to the results thereof, the computation results are the same as that of a known method.

The Expression (7) is expressed as the following Expression (8). Also, with Expression (8) $V_k$ is expressed with Expression (9) and H is expressed with Expression (10).

$$\begin{aligned} Z &= [z_0, z_1, \ldots] \quad (8)\\ &= [h_0, h_1, h_2, \ldots, h_{K-1}] \end{aligned}$$

$$\begin{bmatrix} x_{K-1} + x_{K+3} + x_{K+7} + x_{K+11} + x_{K+15} + x_{K+15} + x_{K+19} + x_{K+23} + x_{K+27} & x_{K+31} + \ldots + x_{K+55} \ldots \\ x_{K-2} + x_{K+2} + x_{K+6} + x_{K+10} + x_{K+14} + x_{K+14} + x_{K+18} + x_{K+12} + x_{K+26} & x_{K+30} + \ldots + x_{K+54} \ldots \\ \vdots & \vdots \\ x_0 + x_4 + x_8 + x_{12} + x_{16} + x_{16} + x_{20} + x_{24} + x_{28} & x_{32} + \ldots + x_{56} \ldots \end{bmatrix}$$

$$H[V_0 + V_4 + V_8 + V_{12} + V_{16} + V_{16} + V_{20} + V_{24} + V_{28}, V_{32} + \ldots V_{56}, \ldots]$$

$$V_J = [X_{J+K-1}, X_{J+K-1}, \ldots, X_J]^T \quad (9)$$

$$H = [h_0, h_1, h_2, \ldots, h_{K-1}] \quad (10)$$

Figure 12:
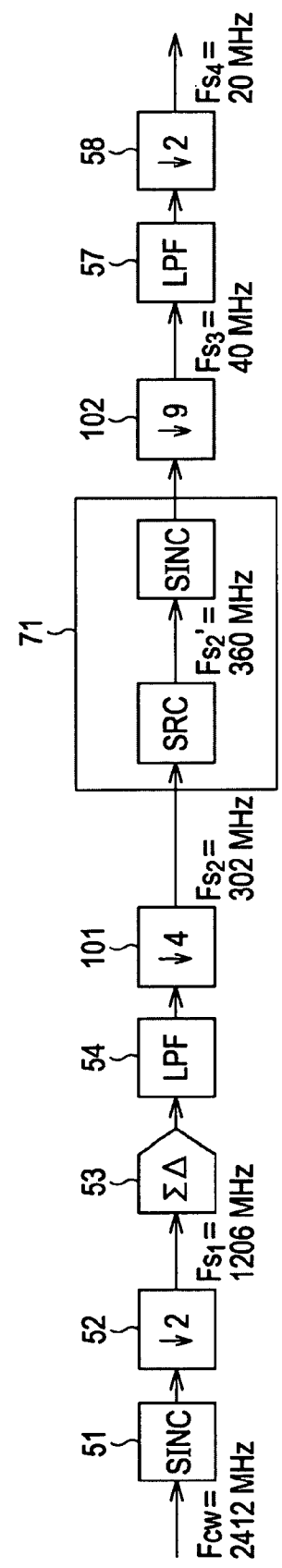
FIG. 12 is a diagram illustrating a configuration example of a digital block in known IEEE 802.11g OFDM mode.

That is to say, we can see from Expression (8) that, in order to execute signal processing at a receiver basically the same as the known case described with FIG. 12, without raising the frequency of output sampling of the digital filter, and obtain a favorable receiving signal with no aliasing, decimation by addition and interpolation for each input series group is performed, with the data from the input signal data XL of a certain point-in-time to the data XL+K-1 (L=0, 1, 2, 3) delayed by the amount of order of the FIR as one group of an input series group, and finally, by performing filter computation employing the obtained series and FIR filter tap coefficient.

Figure 14:
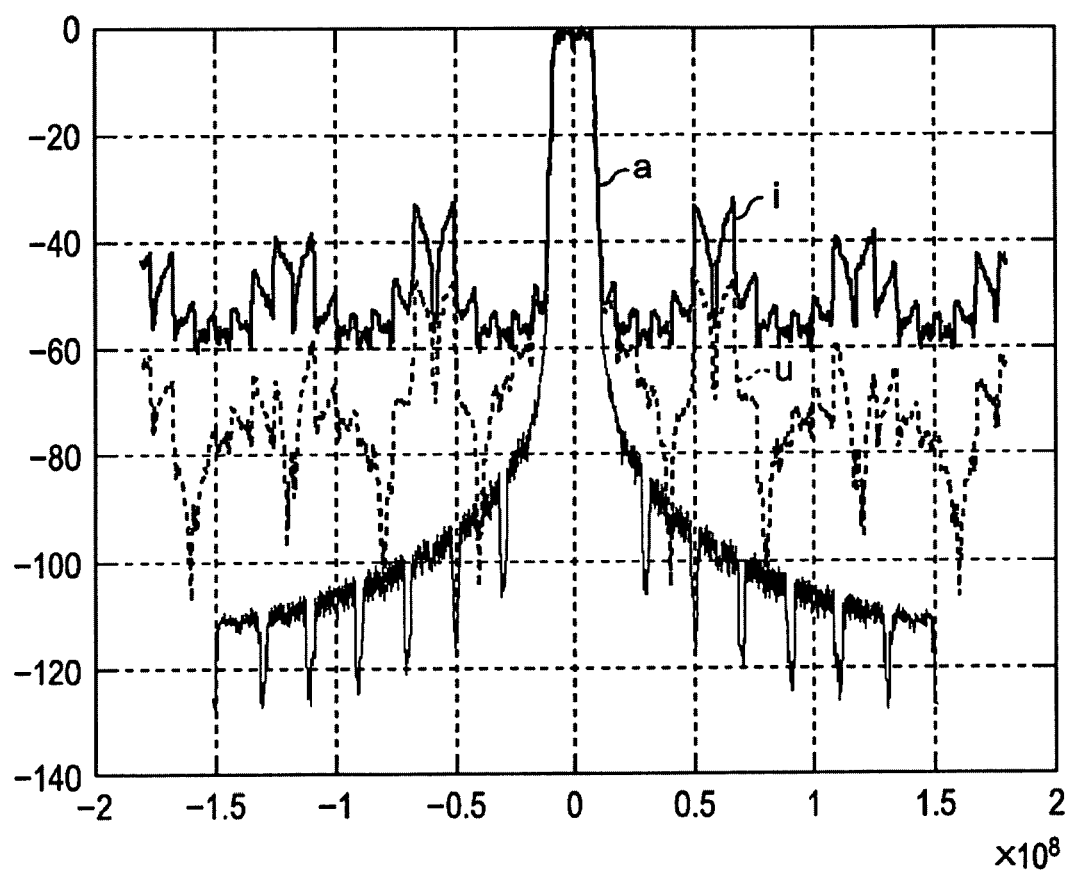
FIG. 14 is a diagram illustrating frequency properties at a sampling rate conversion unit.

FIG. 14 shows frequency properties at the sampling rate conversion unit 133 which operates in IEEE 802.11g OFDM mode. The "a" shown in the diagram indicates a 301.5 MHz OFDM signal wherein the input 2412 MHz signal is decimated to ¼, the "i" shown in the diagram indicates an OFDM signal converted to 360 MHz by interpolation processing by repeating the same signal as to the 301.5 MHz OFDM signal (for example, interpolation processing executed by repeating the input signal corresponding to the fifth sample of the 300 MHz input signal as the fifth sample and sixth sample of the 360 MHz output signal), and the "u" shown in the diagram indicates a signal having added a SINC filter as to the 360 MHz OFDM signal with the moving average processing from adding nine samples together.

As shown with "i" in the diagram, a case wherein a SINC filter is not added downstream, compared to a case wherein a SINC filter is added downstream as shown with "u" in the diagram is 15 to 20 db greater at the peak value of aliasing. Also, to compute the EVM properties in the case of 64 QAM, this becomes −37 db in the case wherein a SINC filter is not added at downstream shown with "i" in the diagram, and becomes −48 db in the case that a SINC filter is added downstream as shown with "u" in the diagram. With the IEEE 802.11g OFDM mode, there are four types of applicable modulation schemes of BPSK, QPSK, 16 QAM, and 64 QAM, wherein the required EVM property for each is different. Generally, for BPSK and QPSK, roughly EVM <−20 dB is demanded, and for 16 QAM and 64 QAM, roughly EVM <−30 dB is demanded. To consider such demand specifications for BPSK or QPSK, properties wherein the SINC filter downstream is omitted is sufficient, whereby processing becomes simpler by not executing addition average processing, and selecting only one piece of data of the predetermined member of data, i.e. executing the thinning out processing at a predetermined ratio.

That is to say, a portion of Expression (8) can be expressed with the following Expression (10).

$$Z = H[V_0, V_{32}, \ldots] \quad (11)$$

Note that with 16 QAM or 64 QAM, the demanded property thereof is strict, so the SINC filter downstream needs to be realized, and in this case, the computations shown in the above Expression (8) needs to be executed.

Thus, if control can be performed with the sampling rate conversion unit 133 as to whether or not a SINC filter is realized based on the selected modulation scheme, signal processing can be efficiently simplified.

Figure 15:
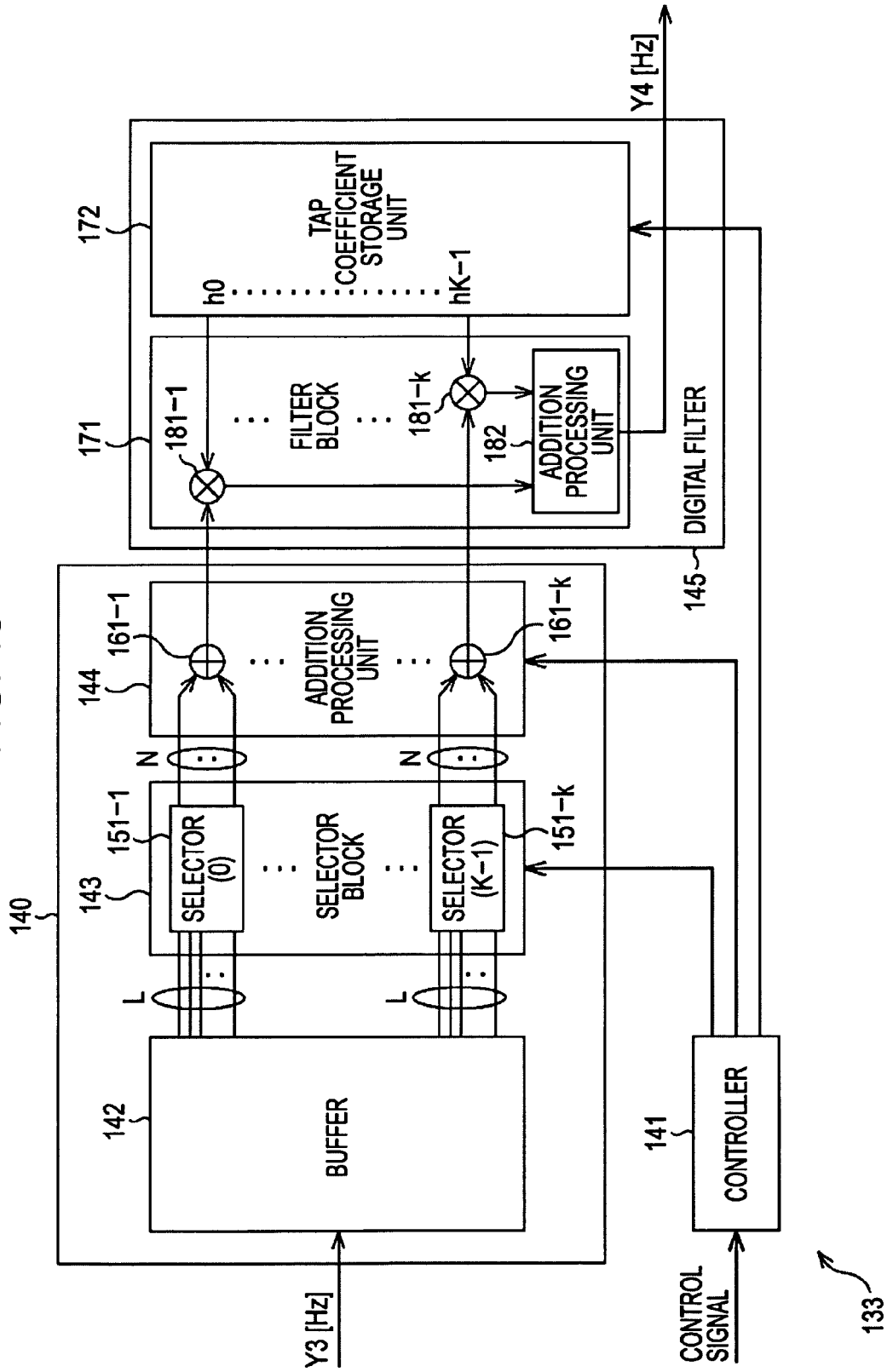
FIG. 15 is a block diagram illustrating the configuration of the sampling rate conversion unit.

FIG. 15 is a block diagram showing a detailed configuration example of the sampling rate conversion unit 133.

The sampling rate convert 133 is made up of a controller 141, rate converting processing unit 140, and digital filter 145. The rate converting processing unit 140 is made up of a buffer 142, selector block 143, and addition processing unit 144.

The controller 141 controls the operations of the buffer 142, selector block 143, addition processing unit 144, and digital filter 145, based on the control signal supplied from the control unit 121. The function details of the controller 141 will be described later with reference to FIG. 16.

The rate converting processing unit 140 executes processing to convert the sampling rate of a supplied digital signal, and generates K series of digital signals computed with the respective tap coefficients of the K'th order FIR filter at the digital filter 145.

The buffer 142 holds the supplied 1-bit serial signal and also supplies an L-bit signal corresponding to a signal with predetermined timing to the K-series corresponding to the number of tap coefficients and selector block 143. That is to say, the buffer 142 holds the input data for executing the processing wherein data from an input signal data XL at a certain point-in-time to data XL+K−1 (L=0, 1, 2, 3, . . . ) delayed by the amount of order of the FIR as one group of an input series group. The circuit configuration example of buffer 142 will be described later with reference to FIG. 17.

The selector block 143 is configured with K selectors of selectors 151-1 through 151-K. Each of selectors 151-1 through 151-K execute processing to selecting an input signal and output for interpolating necessary signals for converting the sampling rate from a predetermined input sampling rate to a predetermined output sampling rate. The output signal is N-bits corresponding to the coefficient of the addition average processing (or thinning out processing) as to the L-bit signal input into each of the selector 151-1 through selector 151-K included in the selector block. Of the selector 151-1 through selector 151-K included in the selector block 143, as an example thereof, the configuration example of the selector 151-K will be described later with reference to FIG. 18. That is to say, the selector block 143 executes the interpolation processing of the interpolation and addition for decimation.

With the description below, if there is no need to individually distinguish the selector 151-1 through selector 151-K, this will simply be called selector 151.

The addition processing unit 144 is configured of K addition or output selection units 161, wherein, based on the control of the controller 141, N-bit output of the selector 151 is added and output, or alternatively, only 1-bit of the N-bit output is output. That is to say, the addition processing unit 144 executes addition processing of the interpolation and addition for decimation, or thinning out processing which is executed instead of the addition processing. The configuration example of the addition processing unit 144 will be described later with reference to FIG. 20.

The digital filter 145 is made up of a filter block 171 and a tap coefficient storage unit 172. That is to say, the digital filter 145 employs the tap coefficient of the FIP filter and the series obtained by the addition or thinning out, to execute filter computation.

A filter block 171 finds the results obtained by multiplying a tap coefficient to the output of the addition processing unit 144, based on the information held in the tap coefficient storage unit 172.

The filter block 171 has provided thereto a multiplying unit 181-1 through multiplying unit 181-$k$ and an adder 182.

The tap coefficient storage unit 172 stores the tap coefficients. That is to say, the multiplying unit 181-1 through multiplying unit 181-$k$ of the filter block 171 multiplies the tap coefficient by the output of the addition processing unit 144 and supplies this to the adder 182. The adder 182 adds the multiplication results of the multiplying unit 181-1 through multiplying unit 181-$k$ and outputs this.

Note that the tap coefficient storage unit 172 may be arranged to store a portion of the results obtained by multiplying the tap coefficient to the output of the addition processing unit 144, instead of storing the tap coefficients. The configuration of the filter block 171 differs depending on the information stored in the tap coefficient storage unit 172. The differing configuration examples of the digital filter 145 will be described later with reference to FIGS. 21 through 23.

Also, if the tap coefficient of the FIR filter stored in the tap coefficient storage unit 172 is rewritten, this can be easily applied to other wireless applications, and even with a digital filter with a relatively larger order, this can be implemented with low power consumption.

With the digital filter 145, for example, a tap coefficient corresponding to multiple wireless systems is stored in the tap coefficient storage unit 172, and based on control by the controller 141, the tap coefficient corresponding to the currently employed wireless system can be selected and computations performed.

Figure 16:
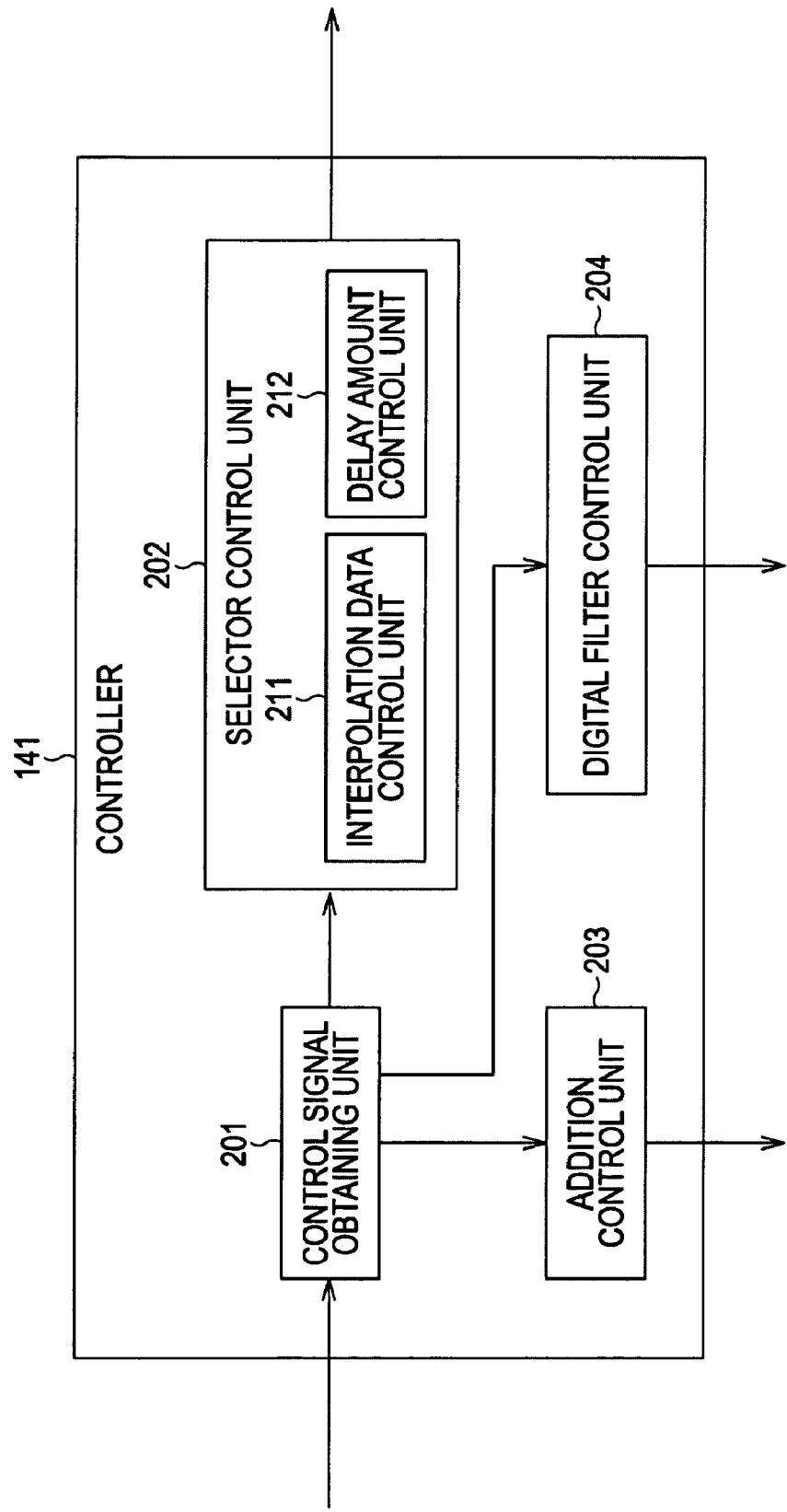
FIG. 16 is a functional block diagram illustrating functionality of the controller shown in FIG. 15.

FIG. 16 is a function block diagram showing the functions of the controller 141.

The controller 141 has functions for a control signal obtaining unit 201, selector control unit 202, addition control unit 203, and digital filter control unit 204.

The control signal obtaining unit 201 obtains the control signal supplied from the control unit 121, and supplies this to the selector control unit 202, addition control unit 203, and digital filter control unit 204. The control signal includes information such as the frequency of in the input signal and frequency of the output signal of the digital block, and whether the modulation scheme in OFDM mode is one of BPSK, QPSK, 16 QAM, or 64 QAM.

The selector control unit 202 controls the processing of the selector block 143, and is configured with an interpolation data control unit 211 and delay amount control unit 212.

The interpolation data control unit 211 generates a control signal for controlling to interpolation processing which is executed with the selector 151 of the selector block 143, i.e. processing to interpolate a signal by outputting employing input data at a previous timing at the ratio of one sample to a predetermined number of samples, based on the control signal supplied from the control signal obtaining unit 201, and supplies this to the selector 151 of the selector block 143.

Also, by executing the interpolation processing, changing the delay amount of the output signal as to the input signal to each of the selectors 151 becomes necessary. The delay amount control unit 212 generates a control signal for controlling the delay amount, based on the control signal supplied from the control signal obtaining unit 201, and supplies this to the selector 151 of the selector block 143.

In the case that the modulation scheme in OFDM mode is either 16 QAM or 64 QAM out of the BPSK, QPSK, 16 QAM, or 64 QAM, based on the control signal supplied from the control signal obtaining unit 201, the addition control unit 203 executes addition processing for the supplied N-bit signal, and in the case that the modulation scheme is either BPSK or QPSK, controls the addition processing unit 144 to output 1-bit of the supplied N-bit signal.

The digital filter control unit 204 controls the processing for the digital filter 145. For example, the digital filter control unit 204 controls the digital filter 145 to select and compute a tap coefficient corresponding to the currently employed wireless system from the tap coefficients corresponding to multiple wireless systems stored in the tap coefficient storage unit 172 of the digital filter 145.

Figure 17:
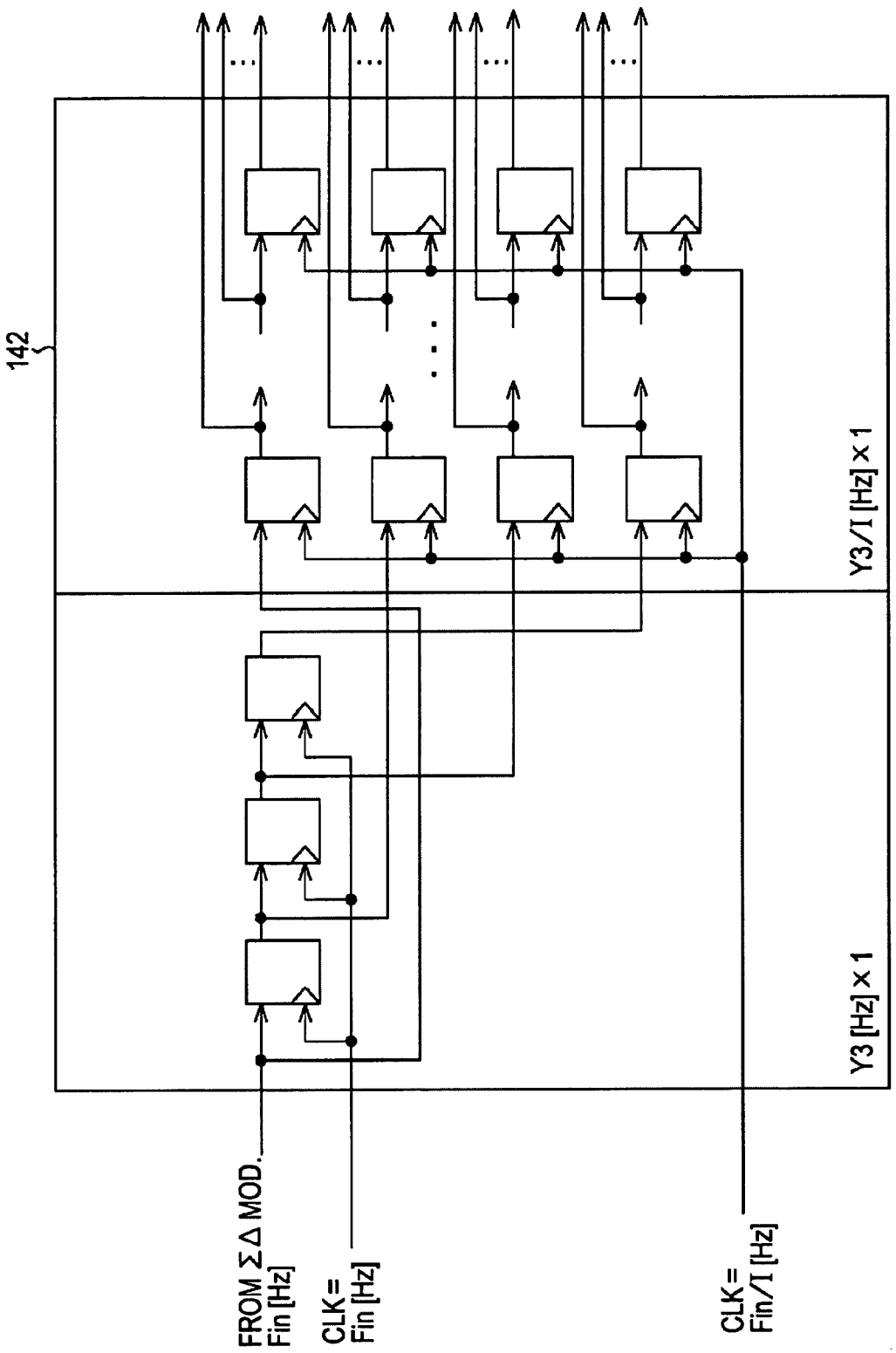
FIG. 17 is a diagram illustrating a circuit configuration example of a buffer in FIG. 15.

Next, the circuit configuration example of the buffer 142 in FIG. 15 is shown in FIG. 17. The buffer 142 buffers the supplied 1-bit serial signal by employing multiple flip-flops, converts this to a 4-bit parallel signal, and holds the input data with each flip-flop which is directly connected downstream. The buffer 142 then supplies the data from an input signal data XL at a certain point-in-time to data XL+K−1 (L=0, 1, 2, 3, . . . ) delayed by the amount of K'th order of the FIR as one group of an input series group, to the K selectors 151 included in the selector block 143.

Figure 18:
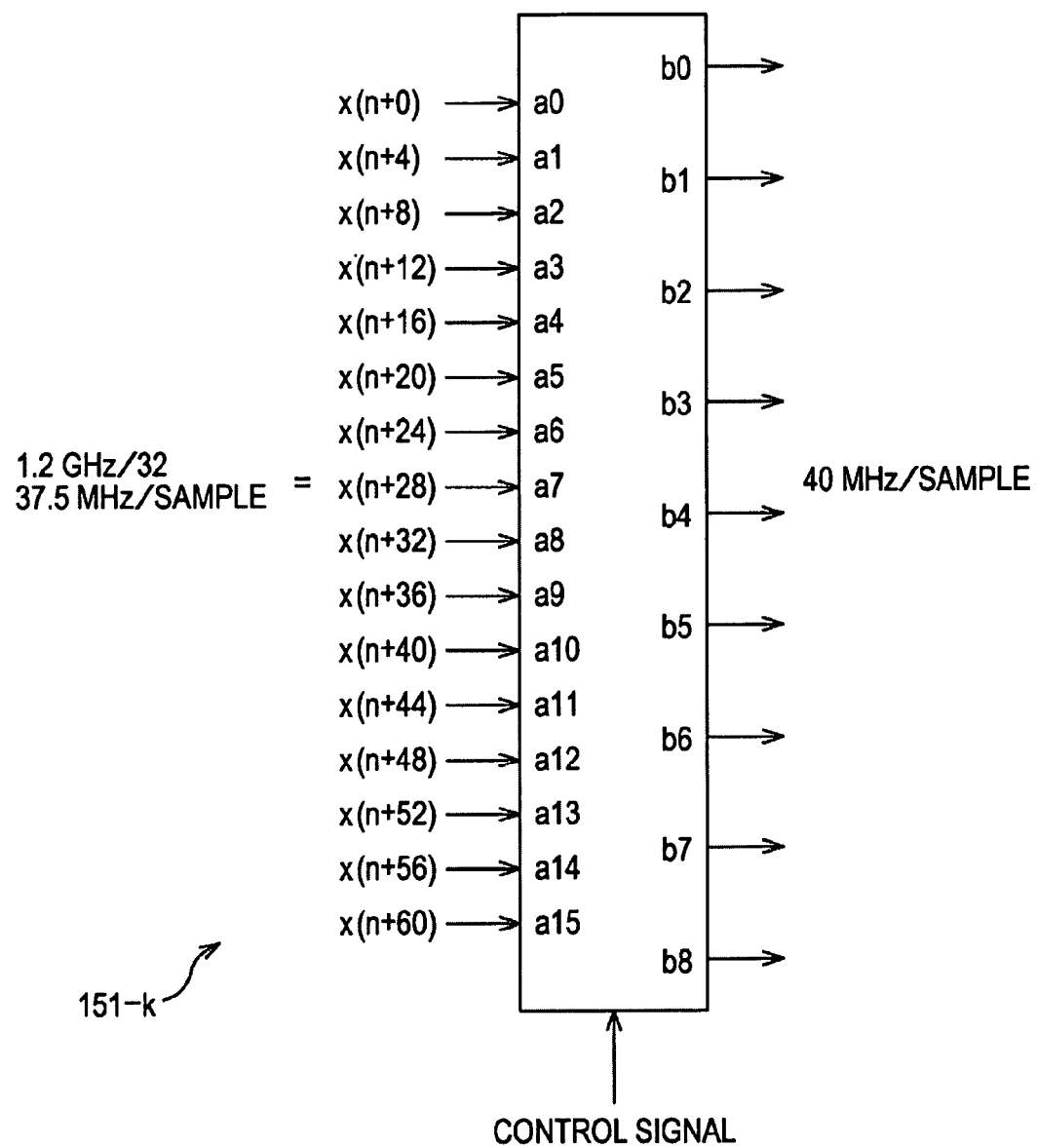
FIG. 18 is a diagram illustrating a configuration example of a selector in FIG. 15.

Next, of the selector 151-1 through selector 151-K included in the selector block 143 in FIG. 15, a configuration example of the selector 151-K is shown in FIG. 18 as one example thereof. A case of executing the sampling rate conversion processing from 300 MHz to 360 MHz with the selector 151-K will be described below.

Note that with an implementation, with the buffer 142, processing is executed to convert the 1.2 GHz 1-bit input data into an N-bit parallel signal and hold this as an input series group of one group, assuming that N at this time is N=32. That is to say, by arranging a configuration wherein the selector 151 obtains an input signal with 1.2 GHz/32=37.5 MHz, while outputting a 40 MHz signal, the sampling rate conversion from 300 MHz to 360 MHz can be equivalently processed.

An L-bit signal is input from the buffer 142 is input into the selector 151-K. Here, let us say that a 16-bit signal is supplied from the buffer 142 as to one selector 151 for every 37.5 MHz (1.2 GHz/32) simultaneously.

Let us say that the signal input terminals for the selectors 151-K are a0 through a15, and a 16-bit signal is supplied for every 37.5 MHz simultaneously. That is to say, in the case that a certain signal n is supplied to the input terminal a0 at a certain timing with a 1-bit signal series supplied to the buffer 142, the signal supplied to input terminal a0 through a15 is a signal wherein ¼ decimation from 1.2 GHz to 300 MHz is executed equivalently, whereby at the same time the signal supplied to the input terminal a1 is a signal delayed four counts from the signal n, and the signal supplied to the input terminal a2 is a signal delayed eight counts from the signal n, and similarly, the signals delayed by four counts each are each supplied to the input terminals a1 through a15.

Also, the selector 151-K outputs a N-bit signal to the addition processing unit 144. Let us say that the signal output terminals are b0 through b9, and a 9-bit signal is output simultaneously for every 40 MHz. Which is the signals of the input signals will be output is controlled based on a control signal supplied from a controller 141.

In the case of converting 300 MHz to 360 MHz, as described with Expression (4), if the 300 MHz clock is subjected to five sample counts, the 360 MHz sample at the timing thereof need to be interpolated. When we consider that such interpolation is executed with 40 MHz timing, interpolation at the first timing needs to be executed at the timing for the fifth sample at 300 MHz.

FIG. 19 shows input/output to the selector 151-K. The upper portion of FIG. 19 shows an input signal to the selector 151-K. The 0, 1, 2, 3, . . . on the horizontal axis show the timing at which the L-bit signal is input from the buffer 142, and advances one timing for every 37.5 MHz. Conversely, the values 4, 8, 12, 16, . . . show the delay amount at the time each signal is input into the buffer 142, in the case that a signal supplied to the input terminal a8 at input timing 0 is employed as a reference. As described above, the signals supplied to the input terminals a0 through a15 are signals wherein ¼ decimation is executed equivalently from 1.2 GHz to 300 MHz, whereby the signals delayed by a multiple of a positive integer four counts from the signal input in the input terminal a0 are each supplied to input terminals a1 through a15.

That is to say, if we consider the signals supplied simultaneously to the input terminals a0 through a15 every 37.5 MHz as converted to a serial signal, this is equivalent to a signal having a frequency of 300 MHz which is ¼ of 1.2 GHz.

The selector 151-K appropriately selects a portion of the input signal, interpolates this at a predetermined ratio, and executes processing to output this at 40 MHz.

The lower portion of FIG. 19 shows the output signal from the selector 151-K. The 0, 1, 2, 3 . . . on the horizontal axis show the output timing of a 9-bit signal from the selector 151-K, which advances 1 timing for every 40 MHz.

With an output timing 1 which is delayed 1 timing from the input timing 0, wherein the signal supplied to the input terminal a8 at input timing 0 is employed as a reference, a 9-bit signal is output. In the case of converting 300 MHz to 360 MHz, as described with reference to Expression (4), if a 300 MHz clock of the input signal is subjected to five sample counts, it becomes necessary to interpolate the 360 MHz output signal sample at the timing thereof. When we consider this as a 9-bit signal group output every 40 MHz, at the timing 1 serving as the first output, this corresponds to interpolating a 360 MHz output signal employing the fifth sample at 300 MHz.

That is to say, at the timing 1 serving as the first output in order to convert 300 MHz to 360 MHz, the input data "16" to the input terminal a12 of the selector 151-K needs to be output to two output terminals. Accordingly, the input data "16" to the input terminal a12 is output from the output terminals b4 and b5.

At the timing 2 which is the next output timing, the state thereof has already been advanced by three samples (output) at timing 1, so first, interpolating at the timing of the second sample with a 300 MHz output signal is necessary, while further, interpolating at the timing of the seventh sample is also necessary. That is to say, at the output timing 2, in order to convert 300 MHz to 360 MHz, the input data "36" and "56" input into the input terminal a9 and input terminal a14 of the selector 151-K needs to be output to two output terminals. Accordingly, the input data "36" to the input terminal a9 is output from the output terminals b1 and b2, while the input data "56" to the input terminal a14 is output from the output terminals b7 and b8.

Also, of the signals input/output at one time, the selection of the count and location of the input data output to two terminals is controlled based on the control signals supplied from the controller 141. The detailed processing for the controller 141 to generate the control signal for causing the selector 151 to select the count and location of the input data output to the two terminals will be described later with reference to FIG. 25 or FIG. 29.

Also, the count and location of input data output to the two output terminals are specified simultaneously, but of the signals output at once, the count of input signals output to the two output terminals, i.e. the count of signals interpolated of the signals output at once, are found, and by randomly setting the locations for insertion, aliasing can be further attenuated.

Also, if the control information for the count and location of the input data output to the two terminals can be obtained, the control information wherein only location information differs can be obtained by adding the offset which is set beforehand to the location information. Also, even if a table corresponding to a certain location information is prepared beforehand, similarly, the location of the input data output to two terminals, i.e. an input signal employed for interpolation processing, can be changed.

Also, with the input timing 0, one input signal is interpolated at the time of output, whereas at the input timing 1, two input signals are interpolated at the time of output. Accordingly, the signals input in the input terminals a8 through a15 are output at the input timing 0, but the signals input in the input terminals a8 through a14 are output at the input timing 1, i.e. the signal input in the input terminal a15 is not output. In such a case, at the next input timing 2, if the output data is selected from the same input data location as the input timing 0 and 1, the signal to be output (the signal "60" input in the input terminal a15) cannot be output.

Thus, with the input/output shown in FIG. 19, in the case that two data are interpolated and output, the delay amount of the signal output at the next timing needs to be shifted by one. Specifically, in order to output the signal "60" input in the input terminal a15 at the input timing 1 at the input timing 2 which is the next timing, the selector 1451 must output the signal input in the input terminals a7 through a14 at the input timing 2 at the output timing 3. That is to say, the starting location of a signal selected as the output signal from the input signals input in the selector 151-$k$ is shifted as shown by α in FIG. 19.

The count of interpolated output data and delay amount of the signals output find the difference between the interpolated data count and the set threshold, whereby control can be performed by delaying by the difference value thereof. In the case of the input/output shown in FIG. 19, the setting value of the threshold is 1. That is to say, the shifting amount shown by α in FIG. 19 is found by (interpolated data amount −1). A specific example of this control will be described later with reference to the flowchart in FIG. 28.

Also, the sampling spacing of the input signals to the selector 151 and the sampling spacing of the output signals from the selector 151 differ, whereby the delay amount of the output signals need to be initialized, based on the ratio of the respective sampling spacing. Specifically, in the event that the clock frequency of the input signal to the selector 151 is Fa, the sampling spacing is Ta, the clock frequency of the output signal is Fd, and the sampling spacing is Td, the sampling spacing of the input signal to the selector 151 is 37.5 MHz, and the sampling spacing of the output signal from the selector 151 is 40 MHz, whereby the next Expression (12) can be obtained.

$$\frac{T_d}{T_a} = \frac{F_a}{F_d} = \frac{37.5 \times 10^6}{40 \times 10^6} = 1 - \frac{1}{16} \qquad (12)$$

This indicates that with the selector 151-$k$, the 15th timing of 37.5 MHz and the 16th timing of 40 MHz correspond with one another, so the input data at these timings are not updated. In order to avoid such a situation, the input data which has been shifted and output at the 16th timing of 40 MHz, i.e. the 15th timing of 37.5 MHz can be set to the initial state of delay amount zero. In other words, based on the input signal of the input timing 14 which is the 15th input signal, in addition to the output timing 15 which is the 16th output signal, the output signal 16 which is the 17th output signal is to be output. Thus, processing for the controller 141 to generate the control signal for initializing the delay amount in a predetermined timing determined by the frequency of the input signal and output signal will be described later with reference to FIG. 26.

Figure 20:
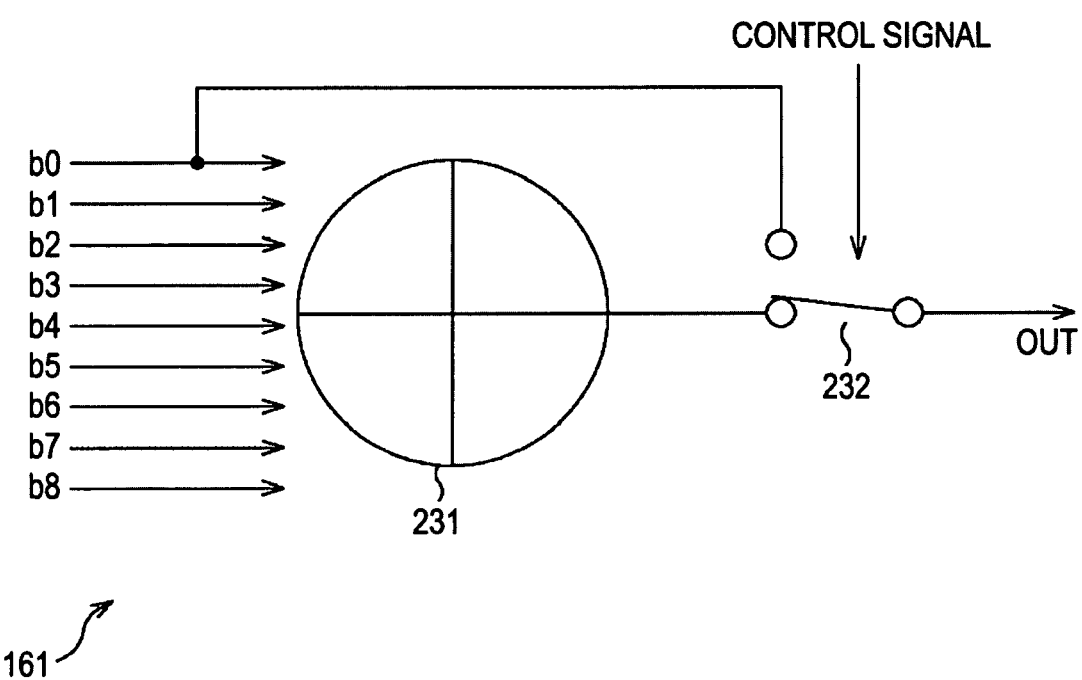
FIG. 20 is a diagram illustrating a configuration example of an addition or output selection unit of an addition processing unit in FIG. 15.

In FIG. 20, a configuration example of the addition or output selecting unit 161 of the addition processing unit 144 is shown. The addition or output selecting unit 161 of the addition processing unit 144 is made up of an adder 231 which adds the output of the N-bit (here, 9-bit) of the selector 151 and a switch 232 to select whether the addition results from the adder 231 is output or whether only 1-bit from the N-bits of output of the selector 151 is output. The switch 232 supplies either the addition results from the adder 231 or only the 1-bit from the N-bits of output of the selector 151 to the digital filter 145 based on control signals supplied from the addition control unit 203 of the controller 141. Specifically, with the switch 232, in the case that the modulation scheme in OFDM mode is 16 QAM or 64 QAM, out of the BPSK, QPSK, 16 QAM, and 64 QAM, the addition results from the adder 231 are output, and in the case this is BPSK or QPSK, 1-bit of the N-bits of signal supplied is output.

Next, a different configuration example of the digital filter 145 will be described with reference to FIG. 21 through FIG. 23. The digital filter 145 is configured with a filter block 171 and tap coefficient storage unit 172, but depending on the information mode held by the tap coefficient storage unit 172, the configuration of the filter block 171 differs.

A second configuration example of the digital filter 145 will be described with reference to FIG. 21. For example, in the case that the multiplication results between the input series and tap coefficient are stored in the tap coefficient storage unit 172, the filter block 171 does not need to provide the multiplying units 181-1 through 181-$k$, and based on the addition results supplied from the addition processing unit 144 (one of the output signals from the selector 151 which is thinned out and supplied thereto), that which corresponds to the multiplication results of the input series and tap coefficient is selected from the tap coefficient storage unit 172, and supplied to the adder 182.

A third configuration example of the digital filter 145 will be described with reference to FIG. 22. For example, in the case that the input series is subjected to grouping, and the multiplication results of the input series subjected to grouping and tap coefficient are stored in the tap coefficient storage unit 172, for example, in a table format, the filter block 171 does not need to provide the multiplying unit 181-1 through multiplying unit 181-$k$, and based on the multiple addition results supplied from the addition processing unit 144 (of the output signals from the selector 151 which are thinned out and supplied), an input series subjected to grouping which corresponds to the output from the addition processing unit 144 is extracted from the table held in the tap coefficient storage unit 172, whereby the corresponding multiplying results are supplied to the adder 182.

Figure 21:
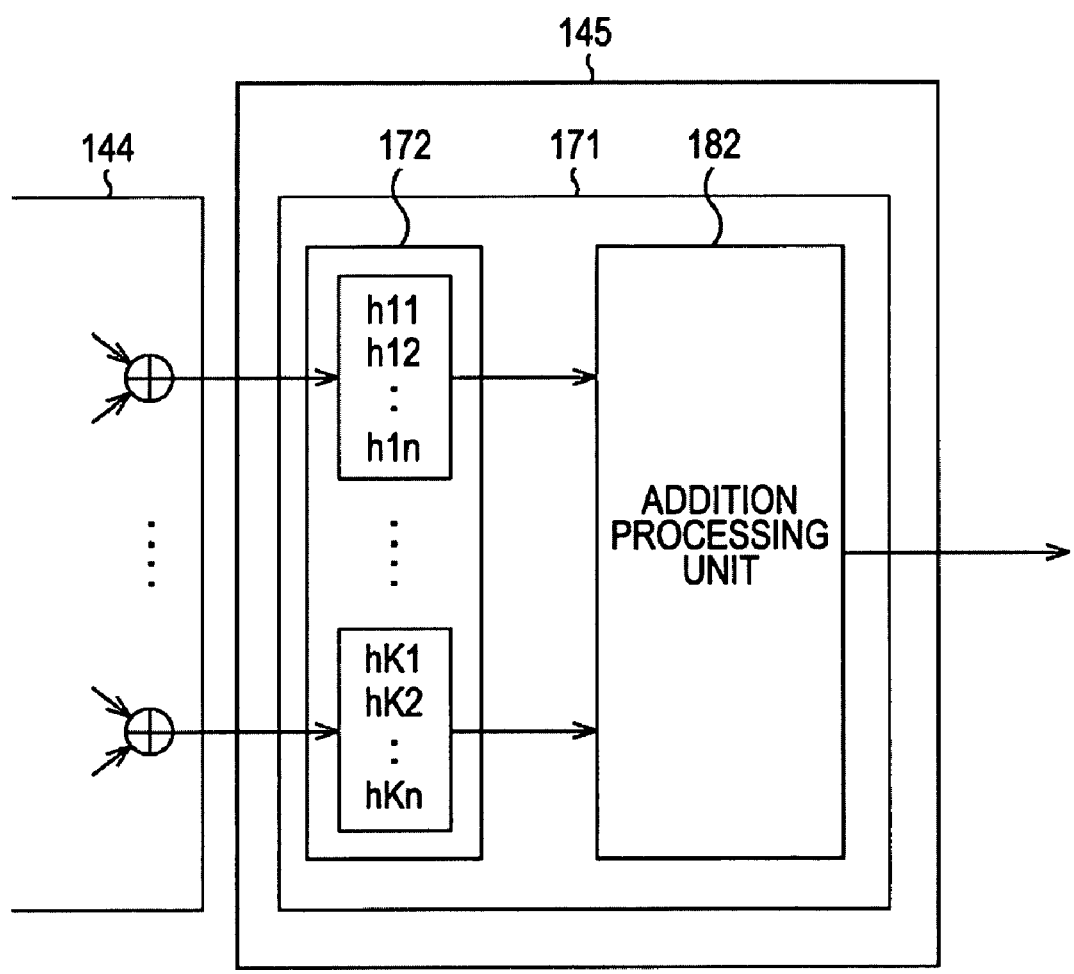
FIG. 21 is a diagram illustrating a configuration example of a digital filter in FIG. 15.
Figure 22:
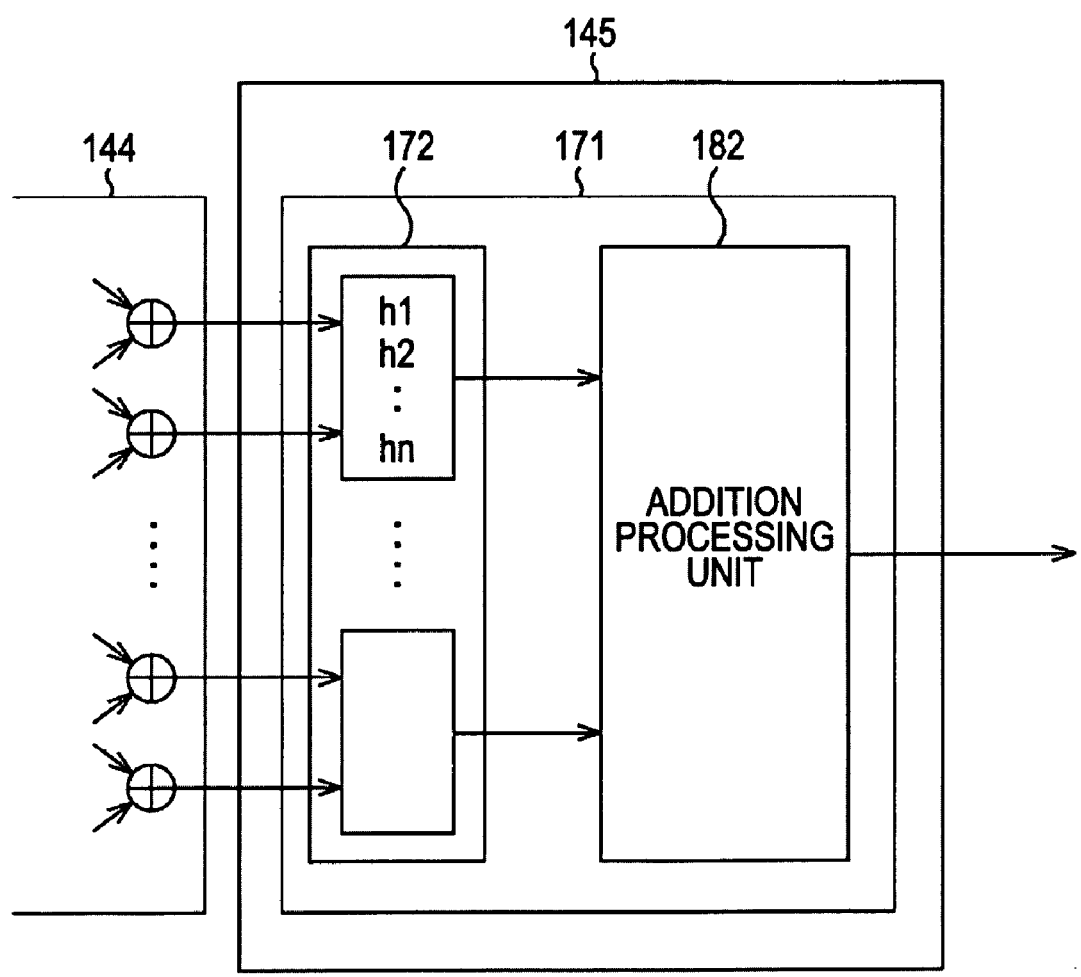
FIG. 22 is a diagram illustrating a configuration example of a digital filter in FIG. 15.

The capacity of the tap coefficient storage unit 172 of the digital filter 145 in the configuration in FIG. 22 is necessary as compared to the case in FIG. 21, but the processing with the adder 182 is simplified with the configuration in FIG. 22.

A fourth configuration example of the digital filter 145 will be described with reference to FIG. 23. For example, in the case that multiplication results as to all combinations of input series are stored in the tap coefficient storage unit 172 (for example, stored in a table format by order corresponding to the input series), the filter block 171 does not need to provide the multiplying unit 181-1 through multiplying unit 181-$k$ nor the adder 182, and extracts and outputs the multiplying results corresponding to the table held in the tap coefficient storage unit 172, based on the K addition results supplied from the addition processing unit 144 (one of the output signals from the selector 151 which are thinned out and supplied).

Figure 23:
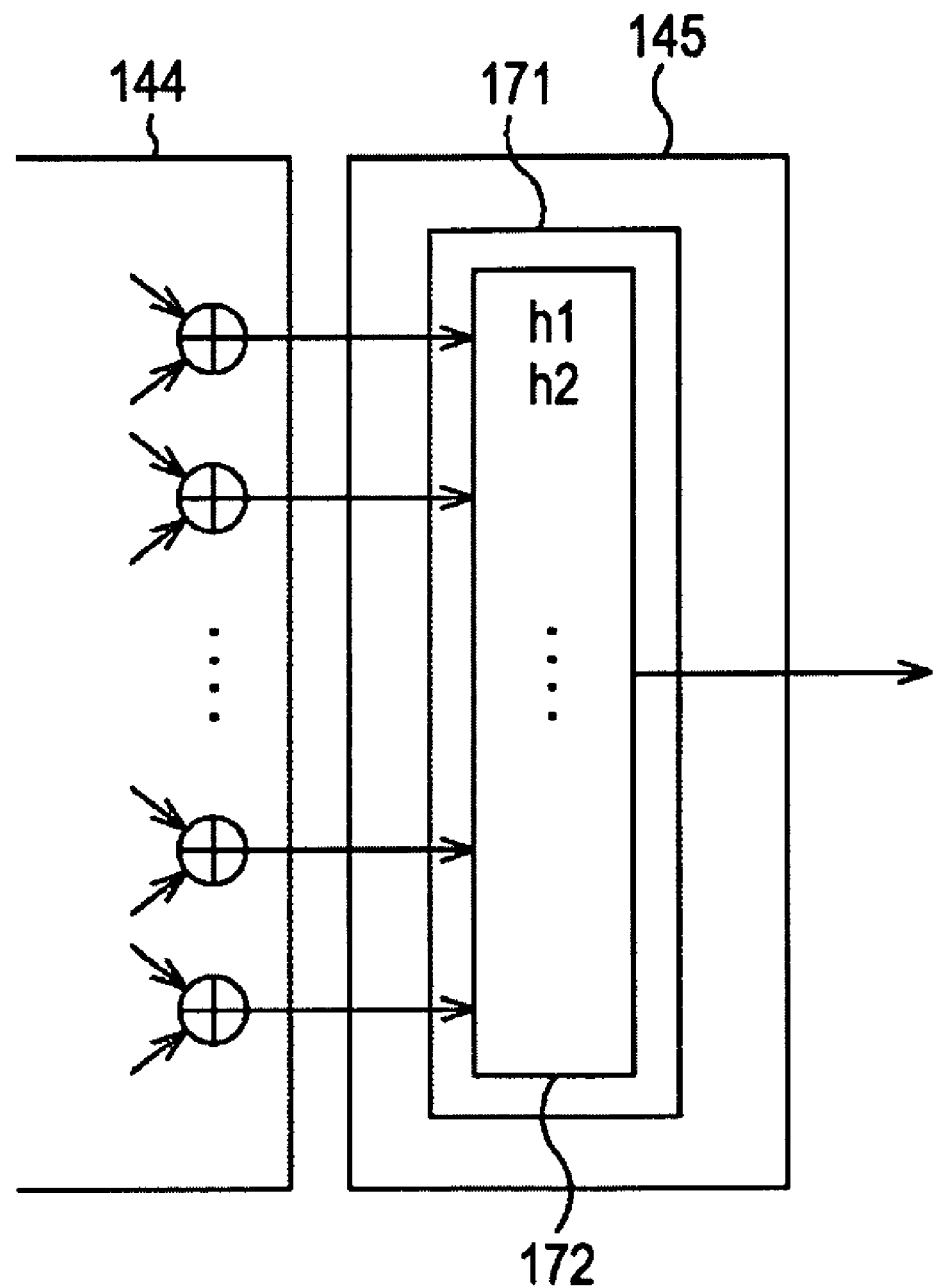
FIG. 23 is a diagram illustrating a configuration example of a digital filter in FIG. 15.

The capacity of the tap coefficient storage unit 172 of the digital filter 145 in the configuration in FIG. 23 is further necessary as compared to the case in FIG. 22, but the adder 182 can be omitted with the configuration in FIG. 23.

Figure 24:
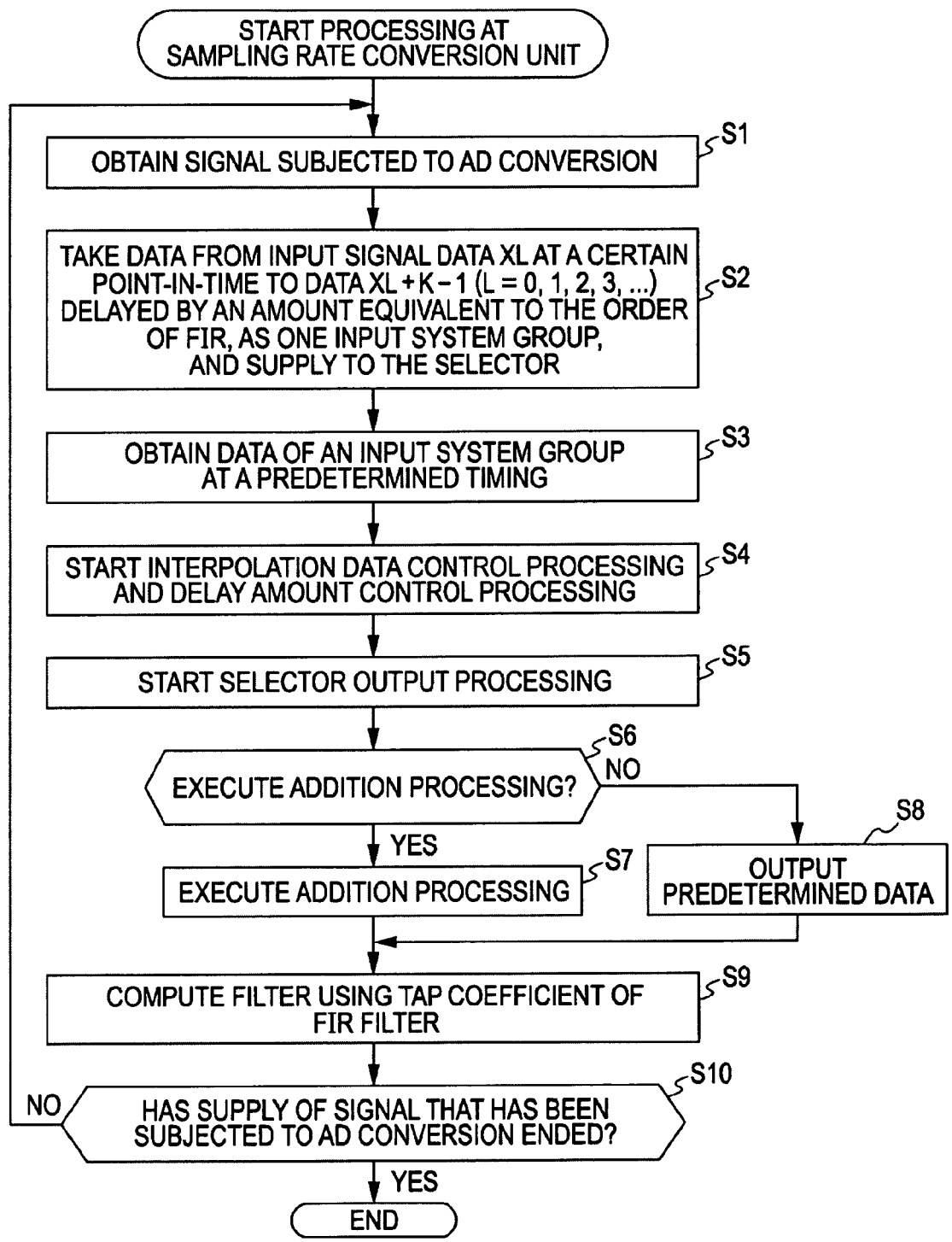
FIG. 24 is a flowchart for describing processing which the sampling rate conversion unit executes.

Next, the processing executed by the sampling rate conversion unit 133 described with reference to FIG. 15 will be described with reference to the flowchart in FIG. 24.

In step S1, the buffer 142 in the sampling rate conversion unit 133 obtains a signal subjected to AD conversion by the ΣΔ A/D converter 53.

In step S2, the buffer 142 supplies the data from the input signal data XL at a certain point-in-time to the data XL+K−1 (L=0, 1, 2, 3, . . . ) which is delayed only the amount of order of FIR as one group of an input series group, to each of the selectors 151 of the selector block 143.

In step S3, the selector 151 obtains the data of the input series group at a predetermined timing such as 37.5 MHz, for example.

Figure 25:
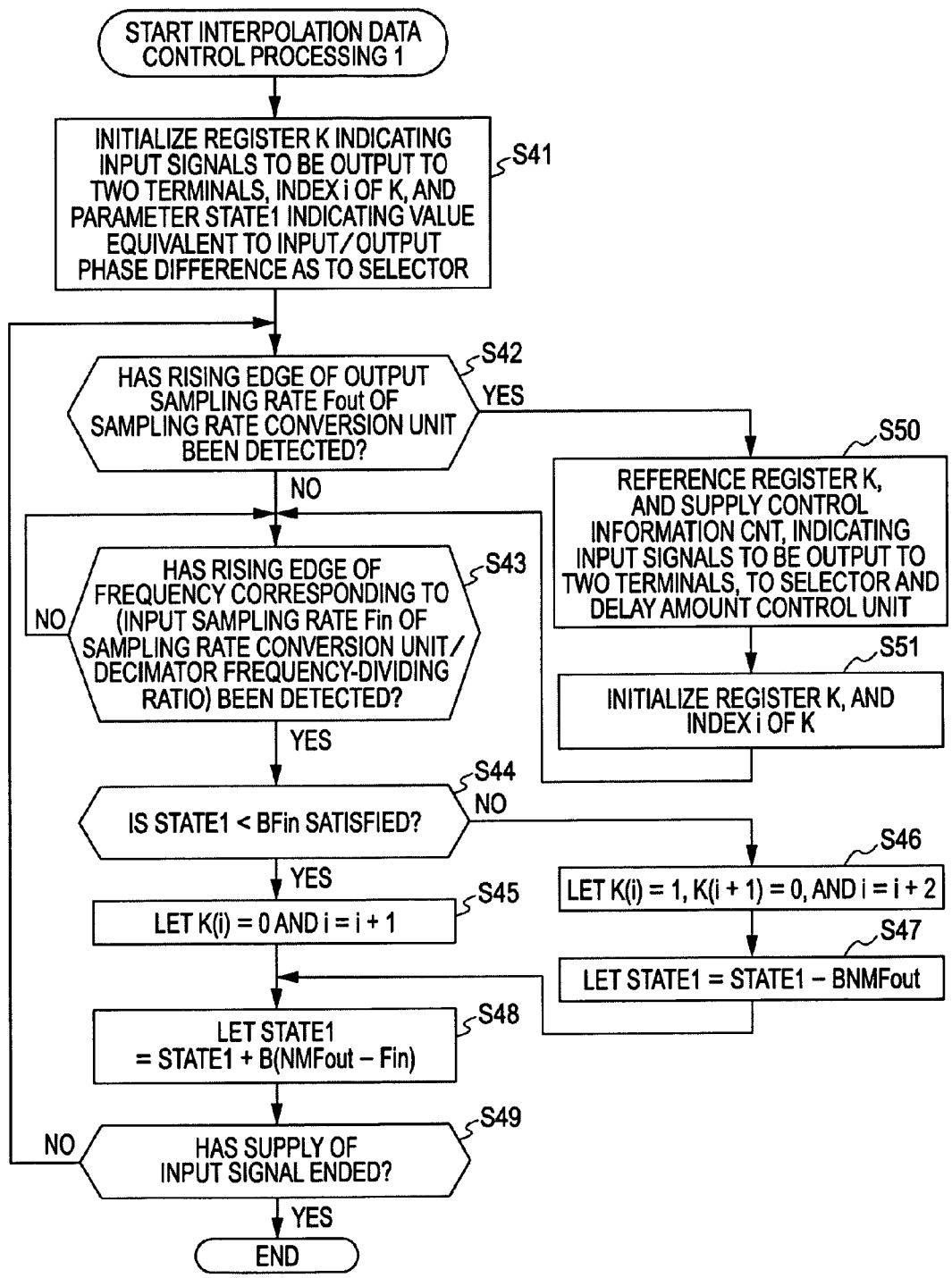
FIG. 25 is a flowchart for describing interpolation data control processing 1.
Figure 26:
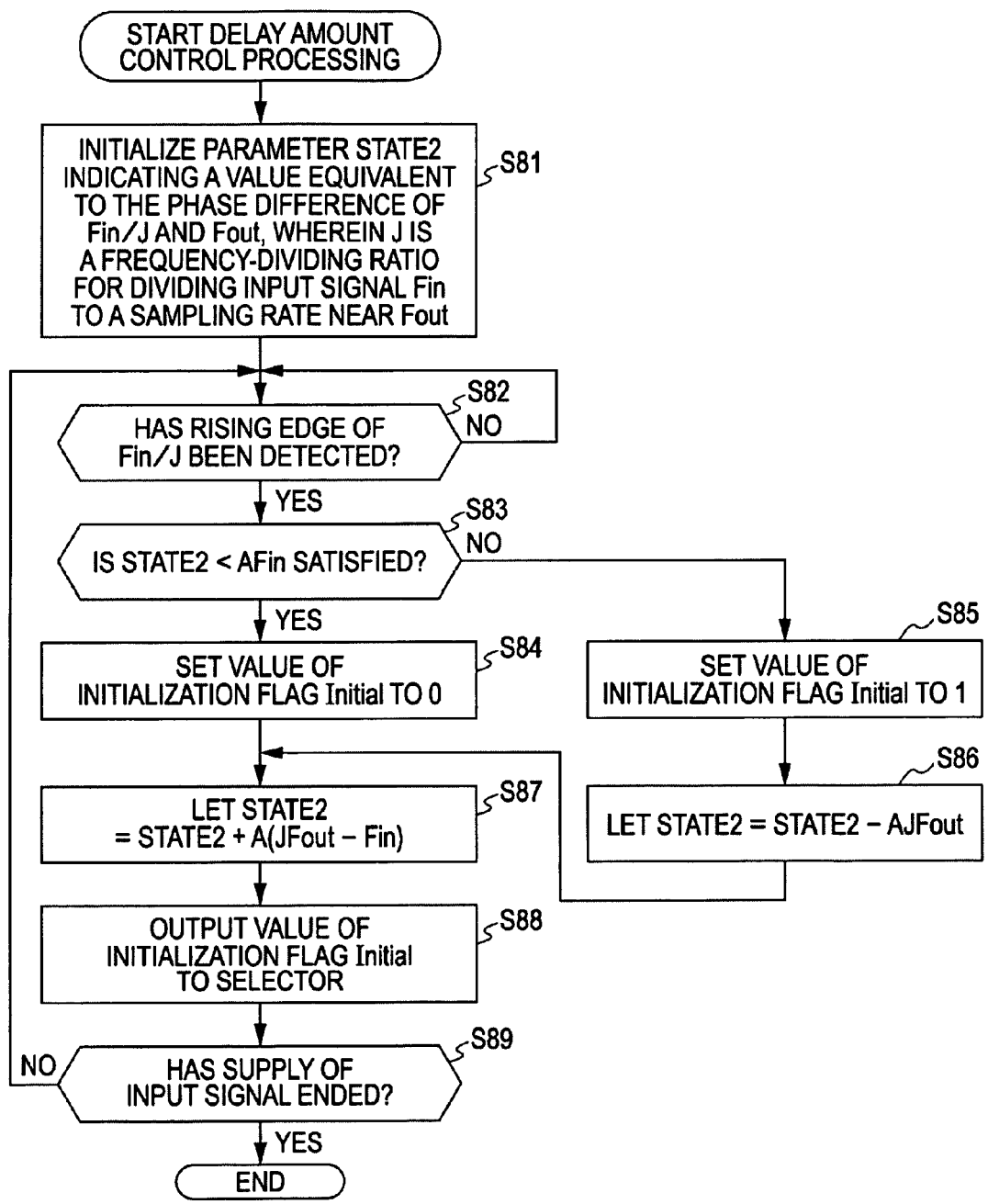
FIG. 26 is a flowchart for describing delay amount control processing.
Figure 29:
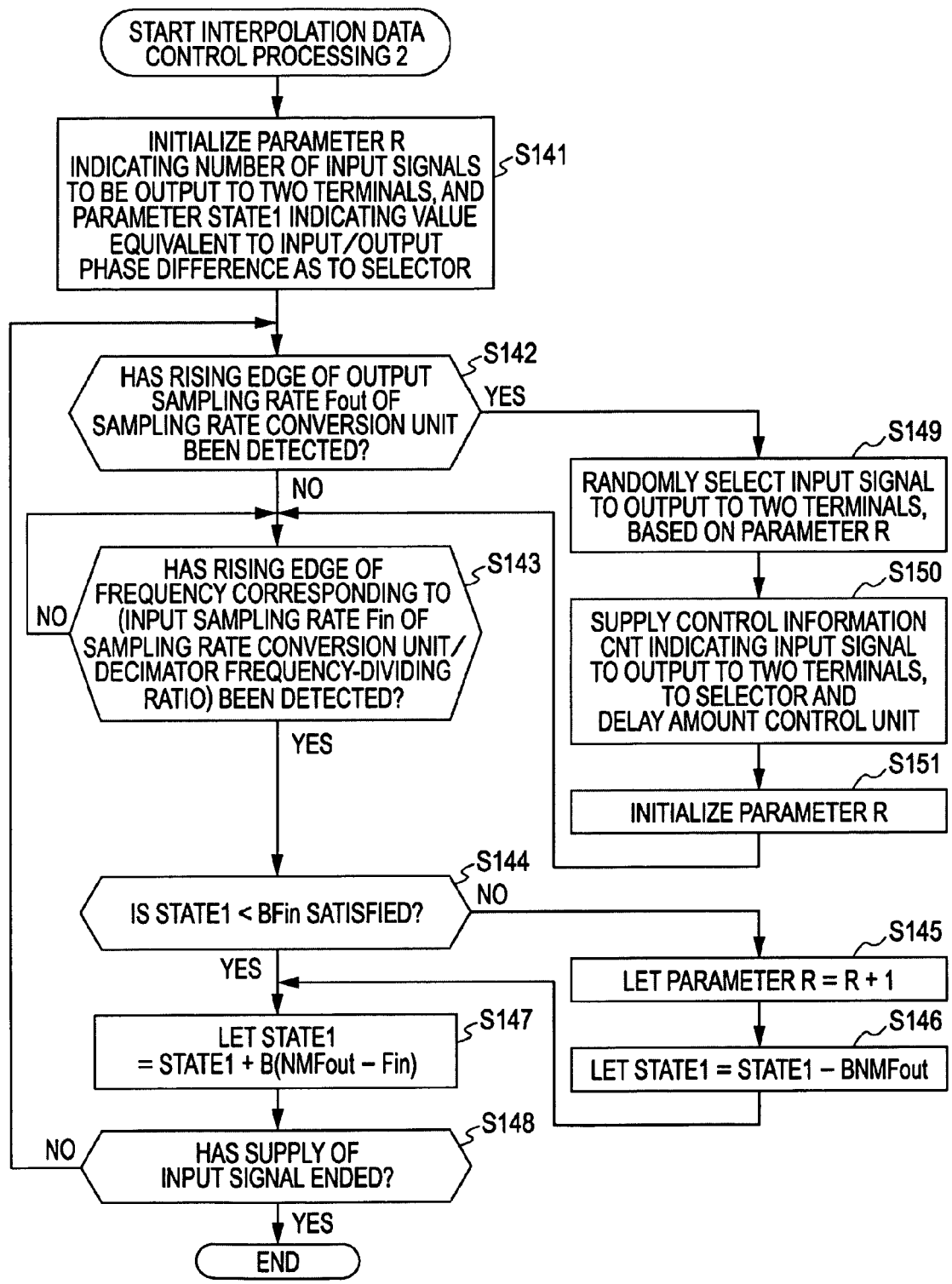
FIG. 29 is a flowchart for describing interpolation data control processing 2.

In step S4, the interpolating data control processing, which will be described later with reference to FIG. 25 or FIG. 29, is started, and the delay amount control processing which will be described later with reference to FIG. 26 is started.

Note here that, for the purpose of description, obtaining input series group data, interpolating data control processing, and delay amount control processing have been described as step S3 and step S4, but these processes are to be executed concurrently.

Figure 28:
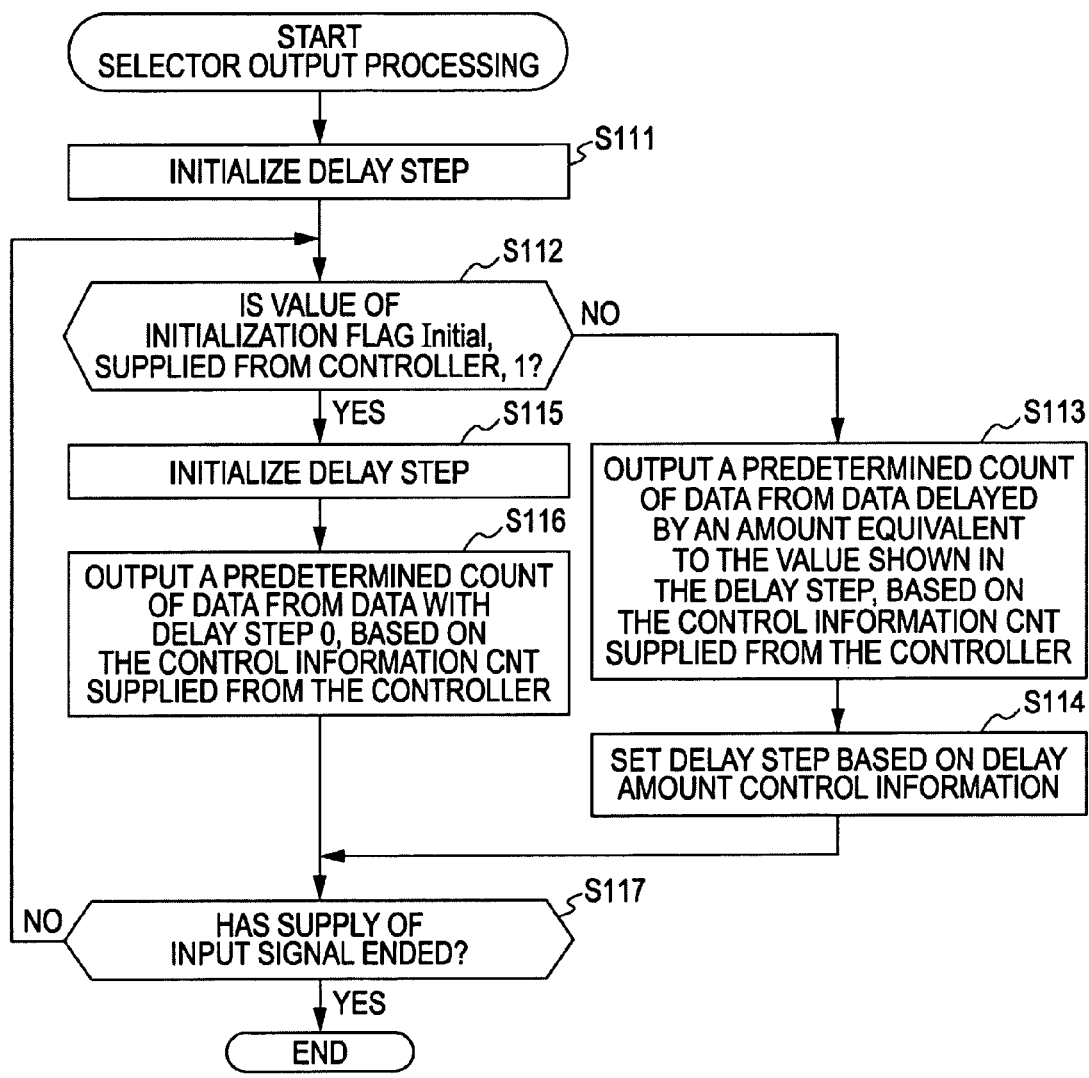
FIG. 28 is a flowchart for describing output processing of the selector.

In step S5, the output processing of the selector 151, which will be described later with reference to FIG. 28, is started.

Note that the interpolating data control, processing delay amount control processing, and selector output processing which are stared in step S4 and step S5, each are continued until the supplying of input signals is ended.

In step S6, based on the modulation scheme in OFDM mode being which of BPSK, QPSK, 16 QAM, or 64 QAM, for each of the K addition or output selecting units 161 of the addition processing unit 144, the controller 141 determines whether or not addition processing of the N-bit signals (for example, 9-bits) supplied from the selector 151 is executed. Specifically, in the case that, of BPSK, QPSK, 16 QAM, or 64 QAM, the modulation scheme in OFDM mode is one of 16 QAM or 64 QAM, the controller 141 outputs the addition results of the adder 231, and in the case of BPSK or QPSK, outputs 1-bit of the supplied N-bit signal.

In the case that addition processing is determined to be executed in step S6, the controller 141 supplies the control signal for executing addition processing to the addition processing unit 144 in step S7, so the addition processing unit 144 executes addition processing of an N-bit signal (for example, 9-bits) supplied from the selector 151. Specifically, the controller 141 controls the switch 232 of the addition or output selecting unit 161 of the addition processing unit 144, whereby the addition results of the N-bit signals, supplied from the selector 151, performed by the adder 231 are output.

In the event that determination is made in step S6 to not execute the addition processing, in step S8 the controller 144 causes the addition processing unit 144 to output predetermined data without executing addition processing, i.e. supplies a control signal for executing thinning out processing of 1/N, so the addition processing unit 144 outputs predetermined data from the N-bit signal (for example, 9-bits) supplied from the selector 151. Specifically, the controller 141 controls the switch 232 of the addition or output selecting unit 161 of the addition processing unit 144, and outputs predetermined data from the N-bit (for example, 9-bits) signals supplied from the selector 151.

In step S9, the digital filter 145 subjects the tap coefficients held in the cap coefficient storage unit 172, and the multiplication results of the input series and tap coefficient, to grouping, whereby the multiplication results of the input series and tap coefficients subjected to grouping, or the multiplication results as to the combination of each of the input series, are employed to execute filtering computations.

In step S10, the controller 141 determines whether or not the supply of the signal subjected to AD conversion has ended. In the event determination is made that the supply of the signal subjected to AD conversion has not ended in step S10, the flow returns to step S1, and the processing thereafter is repeated. In the event determination is made in step S10 that the supply of the signal subjected to AD conversion is ended, the processing is ended.

With such processing, over-sampling is performed by the $\Sigma\Delta$ A/D converter 53 and the sampling rate of the signal subjected to AD conversion is converted.

Next, the interpolating data control processing 1 which is a first example of the processing executed by the interpolation data control unit 211 of the controller 141, which is started in step S4 in FIG. 24, will be described with reference to the flowchart in FIG. 25.

In step S41, the interpolation data control unit 211 of the controller 141 initializes the register K, which determines whether to output each input signal to two terminals, or whether to output to one terminal, the index i of K, and the parameter STATE 1 showing a value equivalent to the phase difference of the input/output as to the selector.

In the event that the i'th input signal is output from one terminal, the value of register K corresponding to the i'th input signal is 0 ($K(i)=0$), and the i'th input signal is output from two terminals, i.e., in the event that the output signal is interpolated employing an i'th input signal, the value of register K corresponding to the i'th input signal is 1 ($K(i)=1$).

In step S42, the interpolation data control unit 211 determines whether or not a frequency clock the same as the output sampling rate Fout of the sampling rate conversion unit 133, e.g. the leading edge of a 40 MHz clock, is detected. In the event that a frequency clock the same as the output sampling rate Fout of the sampling rate conversion unit 133, e.g. the leading edge of a 40 MHz clock, is detected in step S42, the flow is advanced to the later-described step S50.

In the event that determination is made in step S42 that a clock with the same frequency as the output sampling rate Fout of the sampling rate conversion unit 133, e.g. the leading edge of a 40 MHz clock, is not detected, the interpolation data control unit 211 determines in step S43 whether or not (input sampling rate Fin of sampling rate conversion unit 133/frequency division ratio of decimator), i.e., the leading edge of a clock with 300 MHz frequency which is ¼ of 1.2 GHz, is detected. In the event determination is made in step S43 that (input sampling rate Fin of sampling rate conversion unit 133/frequency division ratio of decimator), i.e. the leading edge of a clock with 300 MHz frequency which is ¼ of 1.2 GHz is not detected, the processing in step S43 is repeated until determination is made that the leading edge is detected.

In the event that determination is made in step S43 that (input sampling rate Fin of sampling rate conversion unit 133/frequency division ratio of decimator), i.e. the leading edge of a clock with 300 MHz frequency which is ¼ of 1.2 GHz is detected, the interpolation data control unit 211 determines in step S44 whether or not STATE 1<BFin holds with a parameter STATE 1 showing a value equating to the phase difference of the input/output as to the selector.

Here Fin is an input signal frequency, and for example is 1.2 GHz here. Also, B is a predetermined constant, and for example $1/(0.24 \times 10^9)$ here.

In the case that determination is made in step S44 that STATE 1<BFin holds, with the interpolation data control unit 211, assuming that the i'th input signal is output from one terminal and $k(i)=0$ and $i=i+1$ are set in step S45, and the flow advances to step S48.

In the case that determination is made in step S44 that STATE 1<BFin does not hold, with the interpolation data control unit 211, assuming that the i'th input signal is output from two terminals, wherein $k(i)=1$ as well as $K(i+1)=0$ and $i=i+2$ are set.

Specifically, such a case corresponds to for example, a case wherein with the input/output of the selector 151 described with reference to FIG. 19, the signal which is input from the input terminal a12, out of the input signals at input timing 0, is output from two terminals, and the signal which is input from the input terminal a13 is output from one terminal.

In step S47, the interpolation data control unit 211 controls the parameter STATE 1 to be initialized, i.e. STATE 1=STATE 1−BNMFout. N is the frequency division ratio of the decimator connected to the SINC filter, for example, and specifically is the frequency division ratio of the frequency division processing corresponding to the addition processing of the addition processing unit 144, and is 9 here, for example. Also, M is the ratio (frequency division ratio) of decimation before interpolation processing of the signal subjected to AD conversion, and specifically is a ratio (frequency division ratio) of decimation corresponding to the processing in the buffer 142, and is 4 here, for example.

After the processing in step 45 or step 47 is ended, the interpolation data control unit 211 increments the parameter STATE 1 by a predetermined value, i.e. STATE 1=STATE 1+B(NMFout−Fin) in step S48.

The interpolation data control unit 211 determines in step S49 whether or not the supplying of input signals has ended. In the case it is determined in step S49 that the supply of input signals has not ended, the flow returns to step S42, and the processing thereafter is repeated.

In the event that determination is made in step S42 that the leading edge of a clock with the same frequency as the output sampling rate Fout of the sampling rate conversion unit 133, e.g. a 40 MHz clock, is detected, the interpolation data control unit 211 references the register K in step S50, and supplies the control information CNT showing an input signal to output to two terminal to the selector 151 and delay amount control unit 212.

Specifically, for example, every time the K index i is incremented by 1, with the input/output of the selector 151 described with reference to FIG. 19, the fact that, of the input signals at the input timing 0, the signal input in the input terminals a8 through all is output from one terminal, the signal input in the input terminal a12 is output from one terminal, the signals input in the input terminal a12 is output from two terminals, and the signal input in the input terminal a13 through a15 is output from one terminal, is held as a value of 0 or 1 in the respective register K. When the interpolation data control unit 211 detects, for example, the leading edge of the 40 MHz clock, i.e. ahead of the output timing of the signal from the selector 151, the register K is referenced to generate control information CNT showing an input signal output from two terminals, and this is supplied to the selector 151.

In step S51, the interpolation data control unit 211 initializes the register K and the index i of K, and the flow is advanced to step S43.

In the case that determination is made in step S49 that the supplying of input signals has ended, the processing is ended.

With such processing, the interpolation control unit 211 generates a control signal so that the selector 151 can appropriately select a portion of the input signal, interpolate at a predetermined ratio, and supply to the selector 151. Specifically, the interpolation data control unit 211 can generate a control signal to indicate which signal is the input signal output from the two terminals, as to the output signals worth N-bits (here, 9-bit) output at once from the selector 151, with association to the output timing of the signal from the selector 151, so that the selector 151 can employ the fifth sample at 300 MHz to interpolate the 6th output signal at 360 MHz, as described with reference to FIG. 19.

Also, the count and location of the input data output to the two output terminals are simultaneously specified here, but of the signals output at once, the count of input signals output to the two output terminals, i.e. the count of signals interpolated of the signals output at once are found, and the locations for insertion are randomly set, whereby aliasing can be further attenuated. The processing in the case of randomly setting the insertion location will be described later with reference to FIG. 29.

Also, if the control information for the count and location of the input data which is output to two terminals can be obtained, by adding an offset set beforehand to the location information thereof, control information wherein only the location information differs can be obtained. Also, even if a table corresponding to a certain location information is prepared in advance, similarly the location of input data output to two terminals can be changed.

Next, the delay amount control processing executed by the delay amount control unit 212 of the controller 141 which is started in step S4 in FIG. 24 will be described with reference to the flowchart in FIG. 26.

In step S81, the delay amount control unit 212 of the controller 141 initializes the parameter STAT 2 showing the value equating to the phase difference of the Fin/J and Fount, with the frequency division ratio for dividing the input signal Fin in the sampling rate near Fout, as J. For example, Fin=1.2 GHz, Fout=40 MHz, and J=32. Accordingly, Fin/J=37.5 MHz.

In step S82, the delay amount control unit 212 determines whether or not the leading edge of a clock with a frequency corresponding to Fin/J is detected. In the event that determination is made in step S82 that the leading edge of a clock with a frequency corresponding to Fin/J is not detected, the processing in step S82 is repeated until a leading edge is determined to have been detected.

In step S82, in the event that the leading edge of a clock with a frequency corresponding to Fin/J is detected, the delay amount control unit 212 determines in step S83 whether or not the parameter STATE 2 showing the value equating to the phase difference between Fin/J and Fout holds as STATE 2<AFin. Here, let us say that A is a constant, wherein A=1/(0.08×10$^9$).

In the event that determination is made in step S83 that STATE 2<AFin holds, the delay amount control unit 212 controls the value of the initializing flag Initial as 0 in step S84, and the flow is advanced to step S87 described later.

In the event that determination is made in step S83 that STATE 2<AFin does not hold, the delay amount control unit 212 controls the value of the initializing flag Initial as 1 in step S85.

In step S86, the delay amount control unit 212 initializes the parameter STATE 2 showing a value equating to the phase difference between Fin/J and Fout, whereby STATE 2=STATE 2−AJFout.

After the processing in step S84 or step S86 is ended, the delay amount control unit 212 increments the parameter STATE 2 showing the value equating to the phase difference between Fin/J and Fout only an predetermined value in step S87, whereby STATE 2=STATE 2+A (JFout−Fin).

The delay amount control unit 212 outputs the value of the initializing flag Initial to the selector 151 in step S88.

The delay amount control unit 212 determines in step S89 whether or not the supplying of the input signal has ended. In the event that determination is made in step S89 that supplying of the input signals has not ended, the flow returns to step S82, wherein the processing thereafter is repeated. In the event that the supplying of the input signal has been determined to have ended, the processing is ended.

With such processing, for example, as described employing the above-described Expression (12), the initialization process for the delay amount whereby the timing of the signals input/output to the selector 151 differs, is controlled.

Figure 27:
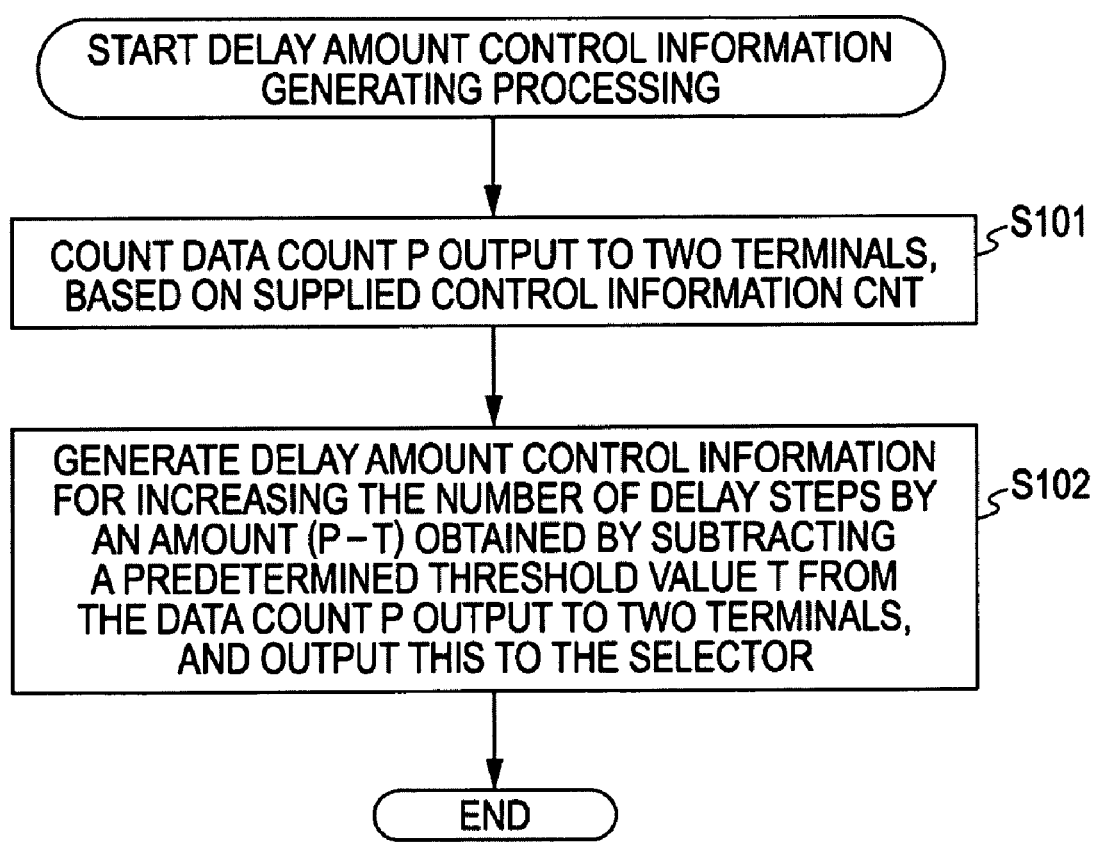
FIG. 27 is a flowchart for describing delay amount control information generating processing.

Next, the delay amount control information generating processing which is executed by the delay amount control unit 212 is described with reference to the flowchart in FIG. 27.

The delay amount control unit 212 counts the input data count P which are output to two terminals, based on the control information CNT supplied from the interpolation data control unit 211, in step S101.

In step S102, the delay amount control unit 212 generates delay amount control information for increasing the delay step count by the amount whereby a predetermined threshold T is subtracted from the data count P output to two terminals (P−T), supplies this to the selector 151, and the processing is ended.

With such processing, the delay amount control information for controlling the delay amount in the output processing of the selector 151, to be described later, is generated, and supplied to the selector 151.

Next, the output processing of the selector 151 which is started in step S5 of the FIG. 24 will be described with reference to the flowchart in FIG. 28.

In step S111, the selector 151 initializes the delay steps.

In step S112, the selector 151 determines whether or not the value of the initialized flag Initial which is supplied from the controller 141 is 1.

In the event that determination is made in step S112 that the value of the initialized flag Initial which is supplied from the controller 141 is not 1, the selector 151 outputs a predetermined amount of data from the data delayed the amount of the value shown in the delay step, based on the control information CNT supplied from the controller 141, in step S113.

In step S114, the selector 151 sets a delay step based on the delay amount control information supplied from the delay amount control unit 212, and the flow is advanced to step S117.

For example, with the input/output described with reference to FIG. 19, the predetermined threshold T is T=1, and with the selector 151 for the input/output described with reference to FIG. 19, for example, with the output timings 1, 3, 5 . . . , the input data count output to two terminals is P=1, whereby P−T=0 so the delay step count is not increased, and with the output timings 2, 4, 6 . . . , the input data count output to two terminals is P=2, whereby P−T=1, so as shown by α in the diagram, the delay step count is increased by 1.

In the case that the value of the initializing flag Initial supplied from the controller 141 is determined to be 1 in step S112, the selector 151 initializes the delay steps in step S115.

In step S116, the selector 151 outputs a predetermined amount of data based on the control information CNT which is supplied from the controller 141 from the data in the delay step 0.

Specifically, as in the case with the input timing 14 and the output timing 15 and 16 described with reference to FIG. 19, the selector 151 takes the delay step count as 0 with the next output of the output timing 15.

After the step S114 or step S116 has ended, the selector 151 determines in step S117 whether or not the supplying of the input signals have ended.

In the event that determination is made in step S117 that supplying of the input signals has not ended, the flow returns to step S112, and the processing thereafter is repeated. In the event that determination is made in step S117 that supplying of the input signals has ended, the flow is ended.

With such processing, the selector 151 can execute the input/output control corresponding to the interpolation processing based on the control information CNT supplied from the controller 141, while controlling the initialization of the delay steps.

With the processing described with reference to the flowchart in FIG. 25, the count and location of the input data to be output to two output terminals are simultaneously specified, but of the signals output at once, the count of input signals output to the two output terminals, i.e. the count of signals interpolated of the signals output at once, is found, and the locations for insertion are randomly set, whereby the aliasing can be further attenuated.

Next, interpolating data control processing 2 which is a second example of processing executed by the interpolation data control unit 211 of the controller 141, which is started in step S4 of FIG. 24, will be described with reference to the flowchart in FIG. 29.

The interpolation data control unit 211 of the controller 141 initializes the parameter R showing the count of input signals output to two terminals, and the parameter STATE 1 showing the value equating to the phase difference of the input/output as to the selector, in step S141.

In step S142 through step S144, processing is executed which is basically the same as that of the step S42 through step S44 in FIG. 25.

That is to say, in the case that determination is made whether or not a clock with the same frequency as the output sampling rate Fout of the sampling rate conversion unit 133, e.g. the leading edge of a 40 MHz clock, wherein the determination is made that this is not detected, then determination is made as to whether or not (input sampling rate Fin of sampling rate conversion unit 133/frequency division ratio of decimator), i.e. the leading edge of a clock with 300 MHz frequency which is ¼ of 1.2 GHz, has been detected.

In the event that determination is made that (input sampling rate Fin of sampling rate conversion unit 133/frequency division ratio of decimator), i.e. the leading edge of a clock with 300 MHz frequency which is ¼ of 1.2 GHz, has been detected, determination is made as to whether or not STATE 1<BFin holds, with the parameter STATE 1 which shows the value equating to the phase difference of the input/output as to the selector.

In the event that determination is made in step S144 that STATE 1<BFin holds, the flow is advanced to step S147 to be described later. In the event that determination is made in step S144 that STATE 1<BFin does not hold, in step S145 the interpolation data control unit 211 controls the parameter R showing the count of input signals to output to the terminals as R=R+1.

In step S146 through step S148, processing is executed which is basically the same as the step S47 through step S49 in FIG. 25.

That is to say, the parameter STATE 1 is initialized, wherein STATE 1=STATE 1−BNMFout. Also, in the case that determination is made in step S144 that STATE 1<BFin holds, or after the processing in step S146, the parameter STATE 1 is incremented by a predetermined value, wherein STATE 1=STATE 1+B(NMFout=Fin), and determination is made as to whether or not the supplying of the input signals has ended. In the event that determination is made that supplying of input signals has not ended, the flow is returned to step S142, and the processing thereafter is repeated.

In the event that a frequency clock the same as the output sampling rate Fout of the sampling rate conversion unit 133, e.g. the leading edge of a 40 MHz clock, is detected in step S142, the interpolation data control unit 211 randomly selects an input signal for outputting to the two terminals, based on the value of the parameter R in step S149.

In step S150, the interpolation data control unit 211 supplies the control information CNT showing the input signal output to two terminals to the selector 151 and delay amount control unit 212.

In step S151, the interpolation data control unit 211 initializes the parameter R, and the flow is advanced to step S143.

In the event that determination is made that supplying of the input signals is ended in step S148, the processing is ended.

With such processing, in the case that the interpolation data control unit 211 generates a control signal to enable the selector 151 to appropriately select a portion of the input signals, thereby interpolating at a predetermined ratio, of the signals output at once, the count of input signals output in two output terminals, i.e. the count of signals interpolated out of the signals output at once, are found, and the locations for insertion are randomly set, whereby aliasing can be further attenuated.

Also, the interpolation data control unit 211 supplies a count of signals to be interpolated as control information to the selector 151, out of the N-bits (here, 9-bit) output at once from the selector 151, with association to the output timing of the signal from the selector 151, so that the selector 151 can employ the fifth sample at 300 MHz to interpolate the 6th output signal at 360 MHz, as described with reference to FIG. 19, whereby the location of the input signals output to the two output terminals can be randomly set.

Even in the event that a sampling rate is converted employing the above-described processing, a spurious component which is a frequency component differing from necessary waves may be generated. In order to suitably obtain sufficient properties by suppressing the spurious component as much as possible, or performing filtering employing a filter which is not steep, such as a SINC filter, with the interpolation processing, multiple input signals to be repeated are provided with shifted timing, and synthesized.

That is to say, by employing a sampling rate conversion unit 241 which refers to FIG. 30, instead of a sampling rate conversion unit 133 of the digital block 111 in IEEE 802.11g OFDM mode wherein a decimation filter method is applied, which is described with reference to FIG. 13, this enables multiple input signals to be repeated, to be provided with shifted timing, and synthesize, in the interpolation processing.

Figure 30:
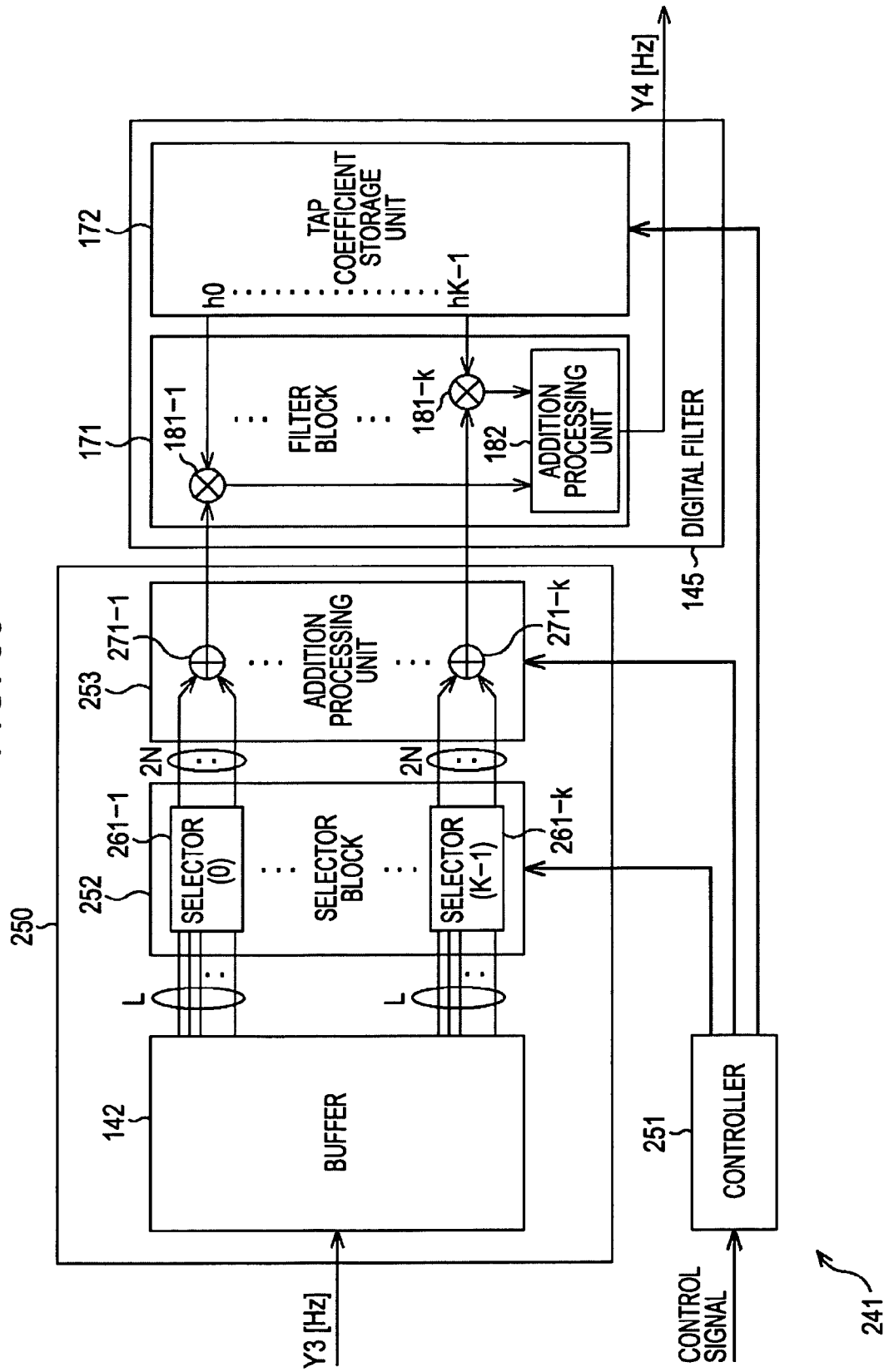
FIG. 30 is a block diagram illustrating a different configuration for the sampling rate conversion unit.

Note that with FIG. 30, the portions corresponding to the case in FIG. 15 have been provided with the same reference numerals, and the description thereof will be omitted as appropriate.

That is to say, the sampling rate conversion unit 241 in FIG. 30 has a controller 251 instead of a controller 141, and a rate converting processing unit 250 instead of a rate converting processing unit 140, but other than these, the configuration is basically the same as that of the sampling rate conversion unit 133 described with reference to FIG. 15. Also, the rate converting processing unit 250 has a selector block 252 instead of a selector block 143, and an addition processing unit 253 instead of an addition processing unit 144, but other than these, the configuration is basically the same as that of the rate converting processing unit 140 described with reference to FIG. 15.

The controller 251 controls the operations of a buffer 142, selector block 252, addition processing unit 253, and digital filter 145, based on the control signals supplied from the control unit 121. The details of the function which the controller 251 has will be described later with reference to FIG. 31.

The rate converting processing unit 250 executes processing to convert a sampling rate as to a supplied digital signal, and generates K series of digital signals computed with the respective tap coefficients of the K'th order FIR filter at the digital filter 145.

The selector block 252 is made up of K selectors which are selector 261-1 through selector 261-K. Each of the selectors 261-1 through 261-K executes processing for selecting and outputting an input signal in order to interpolate necessary signals, in order to convert the sampling rate from a predetermined input sampling rate to a predetermined output sampling rate.

Each of the selector 261-1 through selector 261-K is arranged so as to output multiple series wherein the timing of the repeated input signals at the interpolation processing has been shifted.

In the case with the above-described Expression (7), the fifth input signal is output to the two output terminals, whereby interpolation processing is performed. Conversely, in order to provide multiple input signals to be repeated with the timing thereof shifted, each of the selector 261-1 through selector 261-K can be arranged to output each of a first series for interpolating using the fifth data within five samples of a 300 MHz output signal, and a second series for interpolating using the second data within five samples of a 300 MHz output signal. That is to say, the one sample z0' of the output signals made up from the first series and second series can be expressed with the following Expression (13).

$$z'_0 = y_0 + y_1 + y_2 + y_3 + y_4 + y_5 + \quad (13)$$
$$y_6 + y_7 + y_0 + y_1 + y_2 + y_3 + y_4 + y_5 + y_6 + y_7$$

As with the case with Expression (7) through Expression (9), decimation is performed by interpolating and addition for each input series group, and finally, conversion is made to correspond to processing for performing filter computation employing the obtained series and tap coefficient of the FIR filter, the result is the following Expression (14).

$$Z_0' = h_0(X_{k-1} + X_{k+3} + X_{k+7} + X_{k+11} + X_{k+15} + X_{k+19} + X_{k+19} + X_{k+23} + X_{k+27} + X_{k-1} + X_{k+3} + X_{k+3} + X_{k+7} + X_{k+11} + X_{k+15} + X_{k+19} + X_{k+27} + X_{k+27}) + h_1(X_{k-2} + X_{k+2} + X_{k+6} + X_{k+10} + X_{k+14} + X_{k+18} + X_{k+18} + X_{k+22} + X_{k+26} + X_{k-2} + X_{k+2} + X_{k+2} + X_{k+6} + X_{k+10} + X_{k+14} + X_{k+18} + X_{k+26} + X_{k+26}) \quad (14)$$

That is to say, the output signal as to the parallel signal for L-bits input in each of the selector 261-1 through selector 261-K included in the selector block 252 becomes 2N-bits corresponding to the coefficient of a downstream addition average processing (or thinning-out processing). Of the selector block 252 including the selector 261-1 through selector 261-K, as one example, the configuration example of the selector 261-K is used with description of FIG. 32 later. That is to say, the selector block 252, as with the selector block 143, executes interpolation processing of the interpolation and addition for decimation.

With the description below, in the event that there is no need to distinguish the selector 261-1 through selector 261-K individually, this will be simply called selector 261.

The addition processing unit 253 is made up of the K addition or output selection units 271, whereby the 2N-bit output of the selector 261 is added and output, based on control of the controller 251, or outputs only 1 bit of the 2N-bit output. That is to say, the addition processing unit 253 executes addition processing of interpolating and addition for decimation, or executes thinning out processing which is executed instead of addition processing.

Note that the selector 261 is described as outputting a 2N-bit output signal shown in Expression (13), but an arrangement may be made wherein the count of output signal series wherein the repeated input signal differs may be two or more, and in order to obtain sufficient properties by suppressing the spurious component as much as possible, or performing filtering employing a filter which is not steep such as a SINC filter, it goes without saying that having a greater number of output signal series wherein the repeated input signal differs, is favorable. In this case, the selector 261 outputs an S series of output signals interpolated by S different input signals being repeated, i.e., an output signal with S×N bits is output. The addition processing unit 253 adds the output of the S×N bits of the selector 261, based on the control of the controller 251, or outputs only 1-bit of the S×N bit output.

Figure 31:
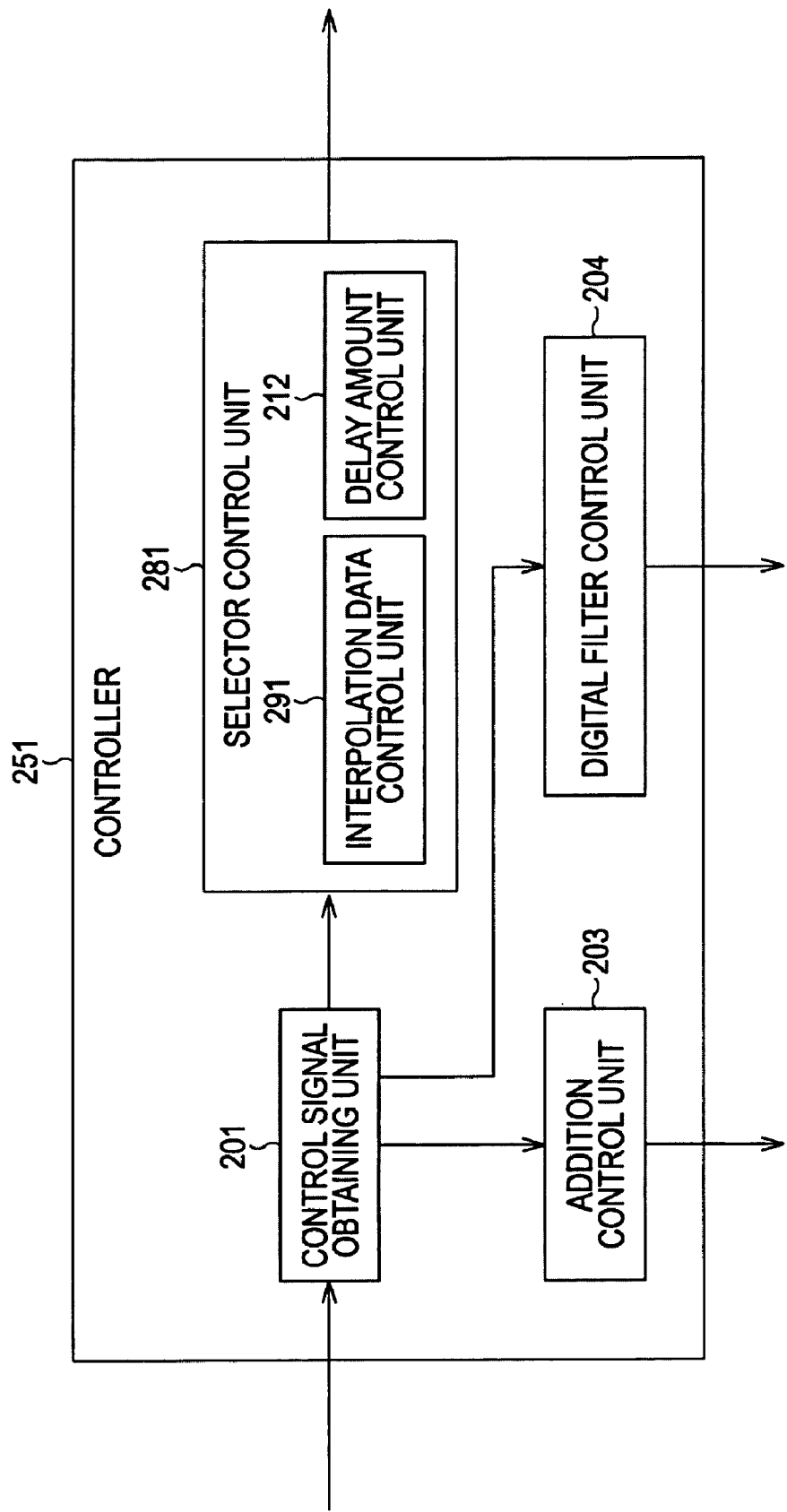
FIG. 31 is a functional block diagram illustrating functionality of a controller in FIG. 30.

Next, FIG. 31 is a functional block diagram illustrating functions of the controller 251.

Note that in FIG. 31, portions which correspond to those in FIG. 16 are denoted with the same reference numerals, and description thereof will be omitted as appropriate.

That is to say, the controller 251 basically has the same function as the functions of the controller 141 described with reference to FIG. 16, other than a selector control unit 281 has been provided instead of a selector control unit 202.

The selector control unit 281 controls the processing of the selector block 252, and is configured of an interpolation data control unit 291, and in the same way as the case of the selector control unit 202, the delay amount control unit 212.

The interpolation data control unit 291 generates control signals for controlling the interpolation processing executed at the selector 261 of the selector block 252 based on the control signals supplied from the control signal obtaining unit 201, in other words, processing of interpolating output signals using input data from a previous timing at a rate of one sample per every predetermined number of samples, and supplies to the selector 261 of the selector block 252.

Figure 32:
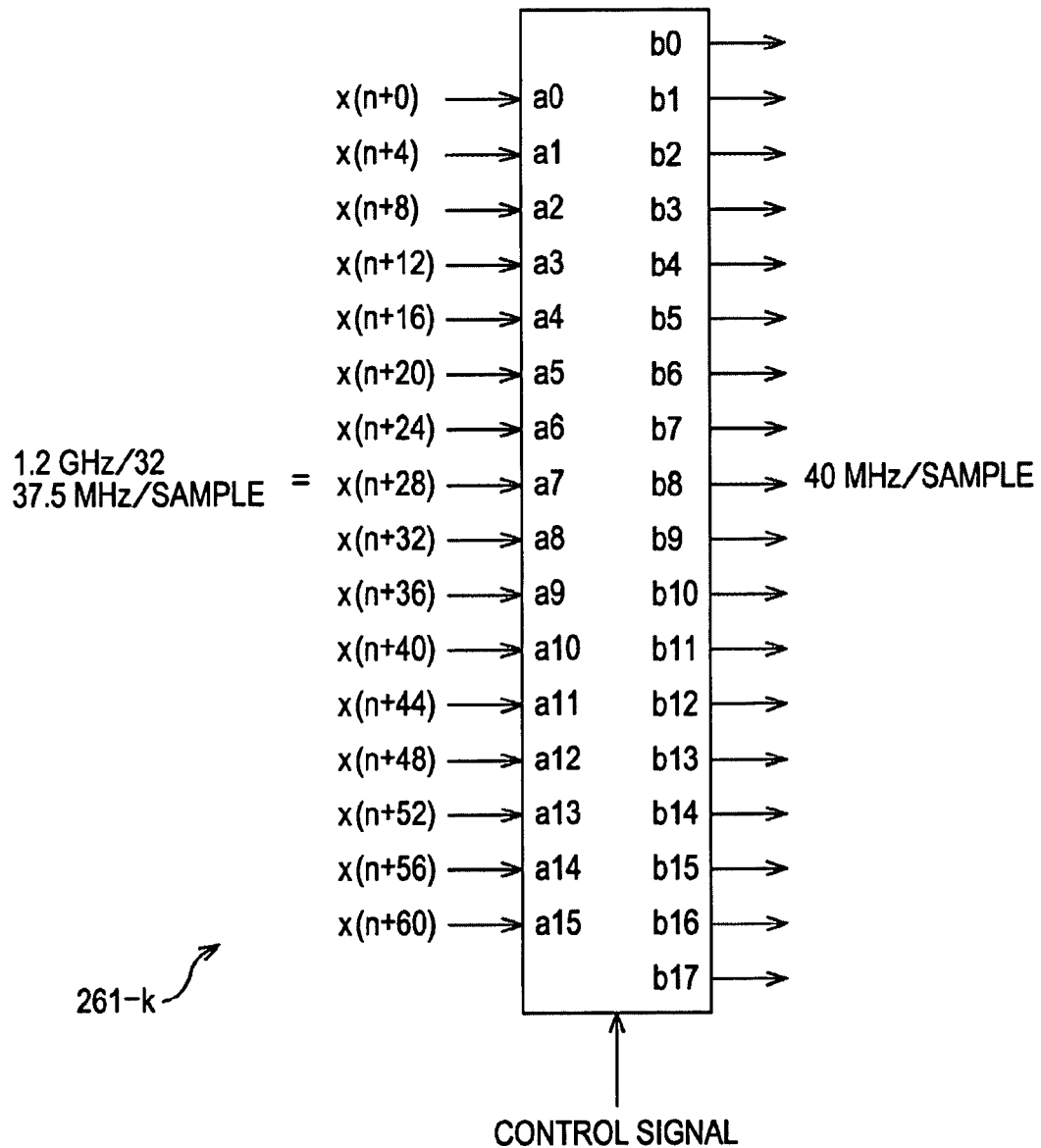
FIG. 32 is a diagram illustrating a configuration example of the selector in FIG. 30.

Next, FIG. 32 shows a configuration example of a selector 261-K as an example of selectors 261-1 through 261-K, included in the selector block 252 shown in FIG. 30. The selector 261-K will be described below by way of a case regarding which sampling rate conversion processing is performed from 300 MHz to 360 MHz.

Note that with an implementation, the selector 261 is configured so as to obtain an input signal with 1.2 GHz/32=37.5 MHz, while outputting a 40 MHz signal, whereby the sampling rate conversion from 300 MHz to 360 MHz can be equivalently processed.

An L-bit signal from the buffer 142 is input to the selector 261-K. Here, a 16-bit signal is supplied from the buffer 142 as to one selector 161 for every 37.5 MHz (1.2 GHz/32) simultaneously.

Let us say that the signal input terminals for the selectors 261-K are a0 through a15, and a 16-bit signal is supplied for every 37.5 MHz simultaneously. That is to say, in the case that a certain signal n is supplied to the input terminal a0 at a certain timing with a 1-bit signal series supplied to the buffer 142, ¼ decimation is executed at the buffer 142, whereby at the same time the signal supplied to the input terminal a1 is a signal delayed four counts from the signal n, and the signal supplied to the input terminal a2 is a signal delayed eight counts from the signal n, and in the same way, the signals delayed by four counts each are each supplied to the input terminals a1 through a15.

Also, the selector 261-K outputs a 2N-bit signal to the addition or output selection unit 271 of the addition processing unit 253. Let us say that the signal output terminals are b0 through b17, and an 18-bit signal is output simultaneously every 40 MHz. Which of the signals of the input signals will be output is controlled based on a control signal supplied from the controller 251.

In the case of converting 300 MHz to 360 MHz, as described with Expression (4), if the 300 MHz clock is counted five sample counts, the 360 MHz sample at the timing thereof needs to be interpolated. With this selector 261, two systems can be output of repeatedly input signals with the timing thereof shifted. That is to say, with the selector 261, the second sample of five samples is repeatedly output from the output terminals b0 through b8, i.e., output is made from two output terminals, while the fifth sample of five samples is repeatedly output from the output terminals b9 through b17, i.e., output is made from two output terminals.

When we consider that such interpolation is executed with 40 MHz timing, interpolation at the first timing needs to be executed at the timing for the second sample and seventh sample at 300 MHz at the output terminals b0 through b8, and interpolation needs to be executed at the timing for the fifth sample at 300 MHz at the output terminals b9 through b17.

FIG. 33 shows input/output to the selector 261-K. The upper portion of FIG. 33 shows an input signal to the selector 261-K. The 0, 1, 2, 3 . . . on the horizontal axis shows the timing at which the L-bit signal is input from the buffer 142, and advances one timing for every 37.5 MHz. Conversely, the values 0, 4, 8, 12, 16 . . . show the delay amount at the time each signal is input into the buffer 142, in the case that a signal supplied to the input terminal a8 at input timing 0 is employed as a reference. As described above, ¼ decimation is performed at the buffer 142, so the signals delayed by four counts each are supplied to input terminals a1 through a15.

That is to say, signals supplied simultaneously to the input terminals a1 through a15 every 37.5 MHz are signals having a frequency of 300 MHz, which is ¼ of 1.2 GHz, at the time of input to the buffer 142.

The selector 151-K appropriately selects a portion of the input signal, interpolates this at a predetermined ratio with two systems, and executes processing to output at 40 MHz.

The lower portion of FIG. 33 shows the output signal from the selector 261-K. The 3, 1, 2, 3, . . . on the horizontal axis shows the output timing of a 9×2-bit signal from the selector 261-K, which advances 1 timing for every 40 MHz.

First, at an output timing 1 which is delayed 1 timing from the input timing 0, wherein the signal supplied to the input terminal a8 at input timing 0 is employed as a reference, a 9×2-bit signal is output. In the case of converting 300 MHz to 360 MHz, as described with reference to Expression (13), it is necessary to interpolate the 360 MHz output signal sample at the second count of the five samples of the 300 MHz clock of the input signals for the first series and at the fifth count for the second series. When we consider this as a 9×2-bit signal group output every 40 MHz, at the timing 1 serving as the first output, this corresponds to interpolating a 360 MHz output signal employing the second sample and seventh sample at 300 MHz at the first system, and interpolating a 360 MHz output signal employing the fifth sample at 300 MHz at the second system.

That is to say, at the timing 1 serving as the first output, in order to convert 300 MHz to 360 MHz, the input data "4" to the input terminal a9, the input data "16" to the input terminal a12, and the input data "24" to the input terminal a14, of the selector 261-K, needs to be output to two output terminals with one or the other of the systems. Accordingly, the input data "4" to the input terminal a9 is output from the output terminals b2 and b3, the input data "24" to the input terminal a14 is output from the output terminals b7 and b8, and the input data "16" to the input terminal a12 is output from the output terminals b13 and b14.

At the timing 2 which is the next output timing, the state at the first system has already been advanced by two samples (output) at timing 1, so first, interpolating at the timing of the fifth (5−2+2) sample with a 300 MHz output signal is necessary, and also, the state at the second system has already been advanced by three samples (output) at timing 1, so first, interpolating at the timing of the second sample with a 300 MHz output signal is necessary, while further, interpolating at the timing of the seventh sample is also necessary.

That is to say, at the output timing 2, in order to convert 300 MHz to 360 MHz, the input data "36", "44", and "56" input into the input terminal a9, input terminal a11, and input terminal a14 of the selector 261-K need to be output to two output terminals with one system or the other. Accordingly, the input data "44" to the input terminal a11 is output from the output terminals b4 and b5, the input data "36" to the input terminal a9 is output from the output terminals b10 and b11, and the input data "56" to the input terminal a14 is output from the output terminals b16 and b17.

The input data "36", "44", and "56", respectively input to the input terminal a9, the input terminal a11, and the input terminal a14, of the selector 261-K, are output from two terminals at one system, and output from one terminal at the other system. That is to say, the input data "36", "44", and "56", respectively input to the input terminal a9, the input terminal a11, and the input terminal a14, of the selector 261-K, are output from three output terminals.

Also, of the signals input/output at one time, the selection of the count and location of the input data output to three terminals is controlled based on the control signals supplied from the controller 251. The detailed processing for the controller 251 to generate the control signal for causing the selector 261 to select the count and location of the input data output to the three terminals will be described later with reference to FIG. 36.

As for initialization of delay, this is the same as the case with the above-described selector 151-k, and further, increase of the number of delay steps is the same as the case with the above-described selector 151-k when considering one of the systems, so description thereof will be omitted.

Figure 34:
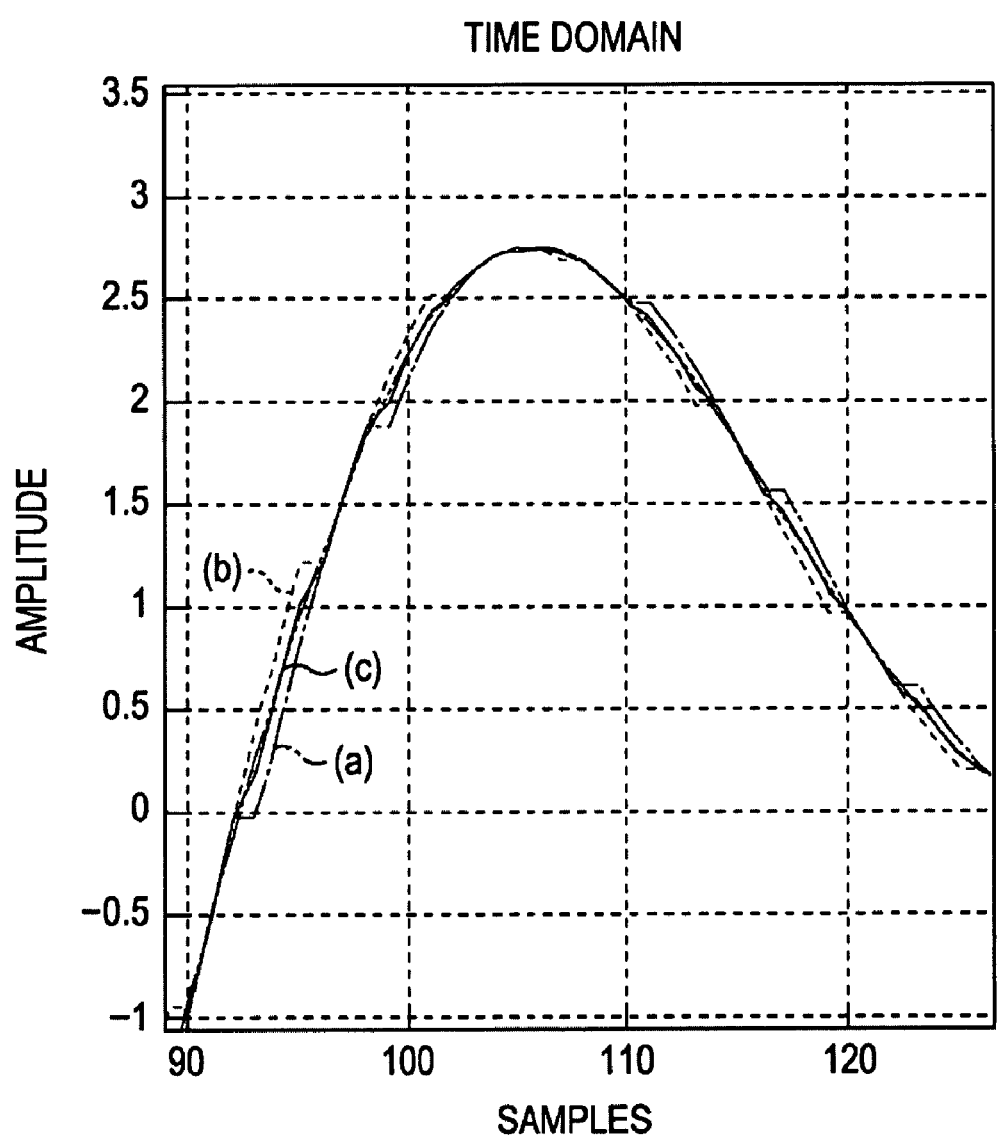
FIG. 34 is a diagram illustrating a frequency spectrum.

FIG. 34 illustrates time waveforms of signals following OFDM signals being subjected to sample rate conversion processing, with regard to cases using the sampling rate conversion unit 133 described with reference to FIG. 15, and with regard to a case using the sampling rate conversion unit 241 in FIG. 30.

The frequency spectrum indicated by (a) in the drawing is a frequency spectrum of a case wherein interpolation processing has been performed using the first sample of five samples, employing the sampling rate conversion unit 133, the frequency spectrum indicated by (b) in the drawing is a frequency spectrum of a case wherein interpolation processing has been performed using the fifth sample of five samples, employing the sampling rate conversion unit 133, and the frequency spectrum indicated by (c) in the drawing is a frequency spectrum of a case wherein interpolation processing has been performed using the first sample and fifth sample of five samples, employing the sampling rate conversion unit 241. In the drawing, the frequency spectrum indicated by (c) has an ideal frequency spectrum and generally the same properties.

Figure 35:
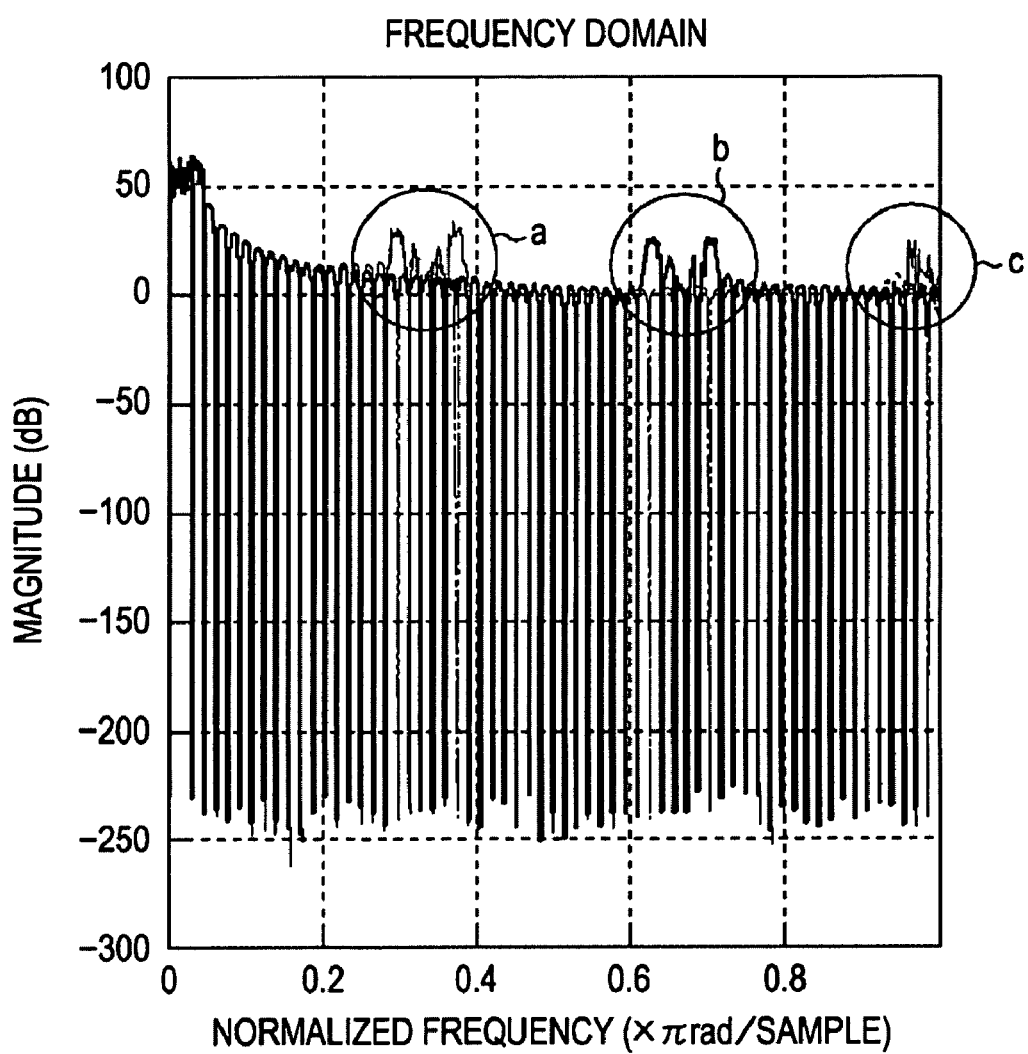
FIG. 35 is a diagram illustrating a frequency spectrum.

Next, FIG. 35 illustrates the frequency spectrum in the frequency domain of signals following OFDM signals being subjected to sample rate conversion processing, with regard to cases using the sampling rate conversion unit 133 described with reference to FIG. 15, and with regard to a case using the sampling rate conversion unit 241 in FIG. 30.

The symbols a and c in the drawing indicate the spurious components occurring in the case of using the sampling rate conversion unit 133 described with reference to FIG. 15, and the symbol b indicates the spurious components occurring in the case of using the sampling rate conversion unit 241 in FIG. 30. It can be seen that in the case of using the sampling rate conversion unit 133 described with reference to FIG. 15, spurious components occur near the normalized frequency 0.3, while in the case of using the sampling rate conversion unit 241 in FIG. 30, spurious components occur near the normalized frequency 0.65. This means that spurious components occur at a higher frequency with the case of using the sampling rate conversion unit 241 in FIG. 30, as compared with the case of using the sampling rate conversion unit 133 described with reference to FIG. 15, so spurious components can be removed with a filter which is not steep, such as a SINC filter, for example.

Also, with regard to least square error, $3.0627\,e^{-4}$ is obtained with the case of using the sampling rate conversion unit 133 described with reference to FIG. 15, while $3.2357\,e^{-5}$ is obtained with the case of using the sampling rate conversion unit 241 in FIG. 30, which is a reduction of approximately 10 dB.

Thus, using the sampling rate conversion unit 241 in FIG. 30 reduces the absolute value of spurious component, enabling the least square error to be reduced. Also, the frequency at which the spurious component occurs can be shifted to a higher frequency, so the spurious component can be effectively removed at a downstream filter.

Next, the interpolating data control processing 3, which is started in step S4 in FIG. 24, in a case of using the sampling rate conversion unit 241 in FIG. 30, will be described with reference to the flowchart in FIG. 36.

In step S181, the interpolation data control unit 291 of the controller 251 initializes a first register K and a second registered K' which determine whether to output each input signal to two terminals or whether to output to one terminal, the index i of K and K', an index i' of the offset value of input signals to be output to two terminals, and the parameter STATE 1 showing a value equivalent to the phase difference of the input/output as to the selector.

With the first system, in the event that the i'th input signal is output from one terminal, the value of register K corresponding to the i'th input signal is 0 (K(i)=0), and in the event that the i'th input signal is output from two terminals, i.e., the output signal is interpolated employing an i'th input signal, the value of the first register K corresponding to the i'th input signal is 1 (K(i)=1). In the same way, with the second system, in the event that the i'th input signal is output from one terminal, the value of the second register K' corresponding to the i'th input signal is 0 (K'(i)=0), and in the event that the i'th input signal is output from two terminals, i.e., the output signal is interpolated employing an i'th input signal, the value of the register K' corresponding to the i'th input signal is 1 (K'(i)=1).

In step S182, the interpolation data control unit 291 determines whether or not a frequency clock the same as the output sampling rate Fout of the sampling rate conversion unit 241, e.g. the leading edge of a 40 MHz clock, is detected. In the event that a frequency clock the same as the output sampling rate Fout of the sampling rate conversion unit 241, e.g. the leading edge of a 40 MHz clock, is detected in step S182, the flow is advanced to the later-described step S194.

In the event that determination is made in step S182 that a clock with the same frequency as the output sampling rate Fout of the sampling rate conversion unit 241, e.g. the leading edge of a 40 MHz clock, is not detected, the interpolation data control unit 291 determines in step S183 whether or not (input sampling rate Fin of sampling rate conversion unit 241/frequency division ratio of decimator), i.e., the leading edge of a clock with 300 MHz frequency which is ¼ of 1.2 GHz, is detected. In the event determination is made in step S183 that (input sampling rate Fin of sampling rate conversion unit 241/frequency division ratio of decimator), i.e. the leading edge of a clock with 300 MHz frequency which is ¼ of 1.2 GHz is not detected, the processing in step S183 is repeated until determination is made that the leading edge has been detected.

In the event determination is made in step S183 that (input sampling rate Fin of sampling rate conversion unit 241/frequency division ratio of decimator), i.e. the leading edge of a clock with 300 MHz frequency which is ¼ of 1.2 GHz is detected, the interpolation data control unit 291 determines in step S184 whether or not STATE 1<BFin holds with a parameter STATE 1 showing a value equating to the phase difference of the input/output as to the selector.

Here Fin is an input signal frequency, and for example is 1.2 GHz here. Also, B is a predetermined constant, and for example is $1/(0.24 \times 10^9)$ here.

In the case that determination is made in step S184 that STATE 1<BFin holds, in step S185 the interpolation data control unit 291 takes the i'th input signal as being output from one terminal with the first system, and sets K(i)=0, and increments the index i to i=i+1.

In step S186, the interpolation data control unit 291 determines whether or not i'=x−1, based on the offset value x between the input data used for interpolation at the first system and input data used for interpolation at the second system.

In the event that determination is made in step S186 that i'=x−1 holds, in step S187 the interpolation data control unit 291 takes the i'th input signal as being output from two terminals with the second system, and sets K'(i)=1, and K'(i+1)=0, and i'=i'+2, and the flow proceeds to the later-described step S192.

In the event that determination is made in step S186 that i'=x−1 does not hold, in step S188 the interpolation data control unit 291 takes the i'th input signal as being output from one terminal with the second system, and sets K'(i)=0, and increments i' to i'=i'+1, and the flow proceeds to the later-described step S192.

In the case that determination is made in step S184 that STATE 1<BFin does not hold, in step S189 the interpolation data control unit 291 takes the i'th input signal as being output from two terminals with the first system, and sets K(i)=1, K(i+1)=0, and i=i+2.

In step S190, the interpolation data control unit 291 initializes the value of the offset value index i' so that i'=1.

In step S191, the interpolation data control unit 291 controls the parameter STATE 1 to be initialized, i.e. STATE 1=STATE 1−BNMFout. N is the frequency division ratio of the decimator connected to the SINC filter, for example, and specifically is the frequency division ratio of the frequency division processing corresponding to the addition processing of the addition processing unit 144, and is 9 here, for example. Also, M is the ratio (frequency division ratio) of decimation before interpolation processing is the signal subjected to AD conversion, and specifically is a ratio (frequency division ratio) of decimation corresponding to the processing in the buffer 142, and is 4 here, for example.

After the processing in step S187, step S188, or step S191 has ended, the interpolation data control unit 291 increments the parameter STATE 1 by a predetermined value, i.e. STATE 1=STATE 1+B(NMFout−Fin) in step S192.

The interpolation data control unit 291 determines in step S193 whether or not the supplying of input signals has ended. In the case it is determined in step S193 that the supply of input signals has not ended, the flow returns to step S182, and the processing thereafter is repeated.

In the event that determination is made in step S182 that the leading edge of a clock with the same frequency as the output sampling rate Fout of the sampling rate conversion unit 241, e.g. a 40 MHz clock, is detected, in step S194 the interpolation data control unit 291 references the register K, and supplies the control information CNT showing an input signal to output to two terminals to the selector 261 and delay amount control unit 212.

Specifically, for example, every time the index i of the first register K and second register K', and the offset value index i' are incremented by 1, with regard to the input/output of the selector 261 described with reference to FIG. 33, the fact that a signal input to one of the input terminals is to be output from one terminal, or that a signal input to one of the input terminals is to be output from two terminals, is held as a value 0 or 1 respectively, at the first register K or second register K'. When the interpolation data control unit 291 detects the leading edge of the 40 MHz clock, i.e., ahead of the output timing of the signal from the selector 261, the first register K and second register K' are referenced to generate control information CNT showing input signals to be output from three terminals, and this is supplied to the selector 261.

That is to say, an input signal corresponding to an index i wherein K(i)=1 or K'(i)=1 is an input signal to be output to three terminals.

In step S195, the interpolation data control unit 291 initializes the first register K, index i of the first register K and second register K', and the second register K', and the flow is advanced to step S183.

In the case that determination is made in step S193 that the supplying of input signals has ended, the processing is ended.

With such processing, the interpolation control unit 291 generates a control signal, so that the selector 261 can appropriately select a portion of the input signal, and interpolate at a predetermined ratio, and supplies this to the selector 261. Specifically, the interpolation data control unit 291 can generate a control signal to indicate the input signal used for 2N-bit (here, 18 bits) interpolation processing output from the selector 261 at once, for each output timing of signals from the selector 261, so that the selector 261 can employ different samples to interpolate output signals at 360 MHz with one system, as described with reference to FIG. 33.

Also, using a sampling rate conversion unit 301 which will be described with reference to FIG. 37, instead of the sampling rate conversion unit 241 described with reference to FIG. 30, enables multiple input signals to be repeated, with the timing thereof shifted, to be provided, and synthesized in the interpolation processing, in the same way as with the sampling rate conversion unit 241.

Figure 37:
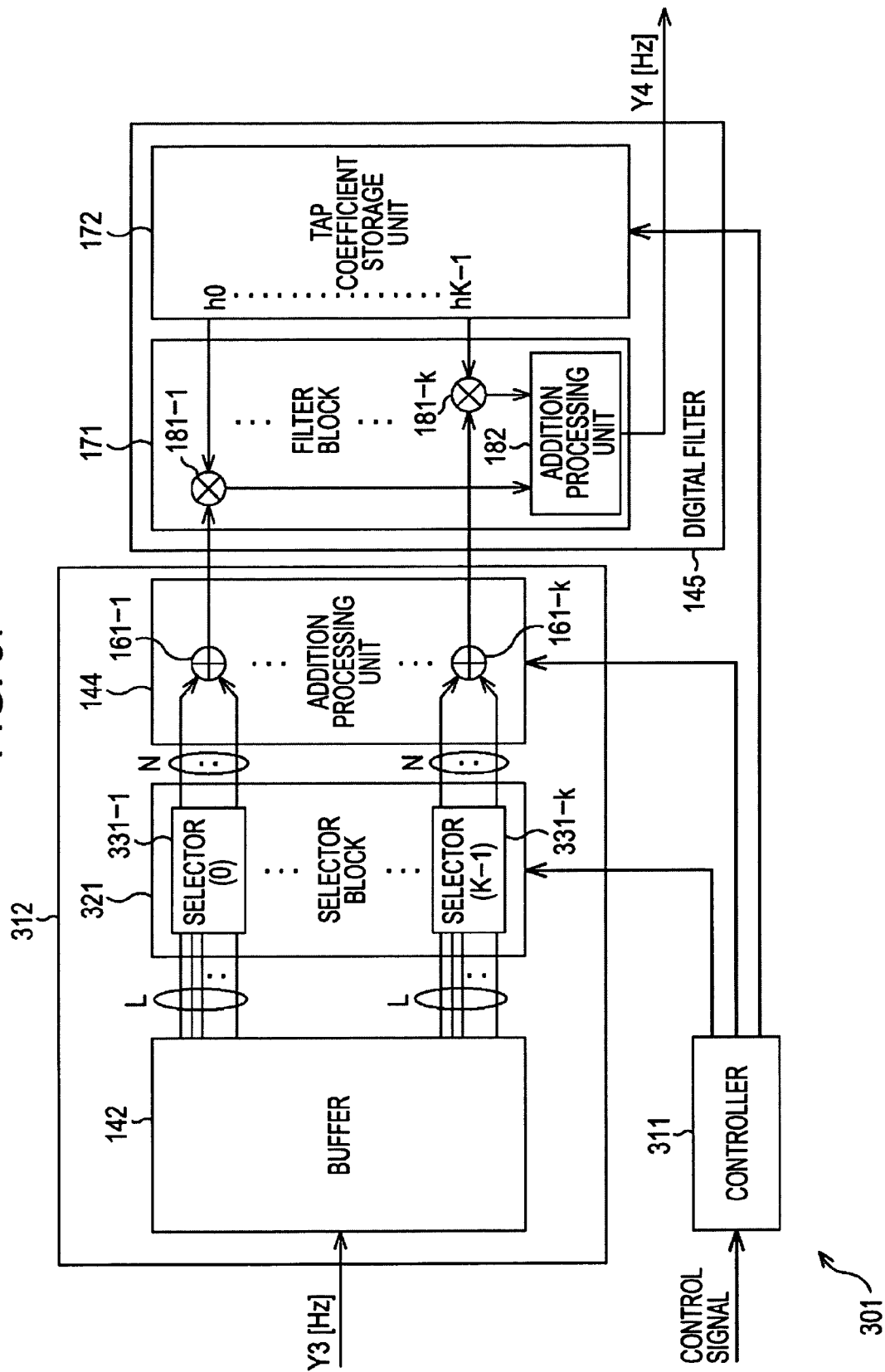
FIG. 37 is a block diagram illustrating a different configuration for the sampling rate conversion unit.

Note that in FIG. 37, the portions corresponding to the case in FIG. 15 or FIG. 30 have been denoted with the same reference numerals, and the description thereof will be omitted as appropriate.

That is to say, the sampling rate conversion unit 301 in FIG. 37 has a controller 311 instead of a controller 251, and a rate converting processing unit 312 instead of a rate converting processing unit 250, but other than these, the configuration is basically the same as that of the sampling rate conversion unit 133 described with reference to FIG. 30. Also, the rate converting processing unit 312 has a buffer 142 in the same way as with that in FIGS. 15 and 30, and a selector block 321 newly added, and the addition processing unit 144 the same as with that in FIG. 15 is provided.

The controller 311 controls the operations of the buffer 142, selector block 321, addition processing unit 144, and digital filter 145 of the rate conversion processing unit 312, based on the control signals supplied from the control unit 121. The details of the functions which the controller 311 has are basically the same as with the case of the controller 251 described with reference to FIG. 31, except for a part of the processing of the interpolation data control processing 3 described with reference to FIG. 36 having been changed. Processing which the controller 311 executes instead of the interpolation data control processing 3 will be described later with reference to the flowchart in FIG. 41.

The rate converting processing unit 312 executes processing to convert a sampling rate of a supplied digital signal, and generates the K series of digital signals computed with the each of the tap coefficients of a K'th order FIR filter at the digital filter 145.

The selector block 321 is made up of K selectors which are selector 331-1 through selector 331-K. Each of the selectors 331-1 through 331-K executes processing for selecting and outputting an input signal in order to interpolate necessary signals, in order to convert the sampling rate from a predetermined input sampling rate to a predetermined output sampling rate. That is to say, the selector block 321 also executes interpolation processing of the interpolation and addition for decimation, in the same way as with the selector block 143 and the selector block 252.

Each of the selector 331-1 through selector 331-K is arranged so as to generate multiple series wherein the timing of the repeated input signals at the interpolation processing has been shifted, in the same way as with the selector 261-1 through selector 261-K described above. Each of the selector 331-1 through selector 331-K is arranged to synthesize and output the generated multiple series of signals following interpolation.

In the following description, the selector 331-1 through selector 331-K will be simply referred to as "selector 331" in the event that there is no need to distinguish between each individually.

Figure 38:
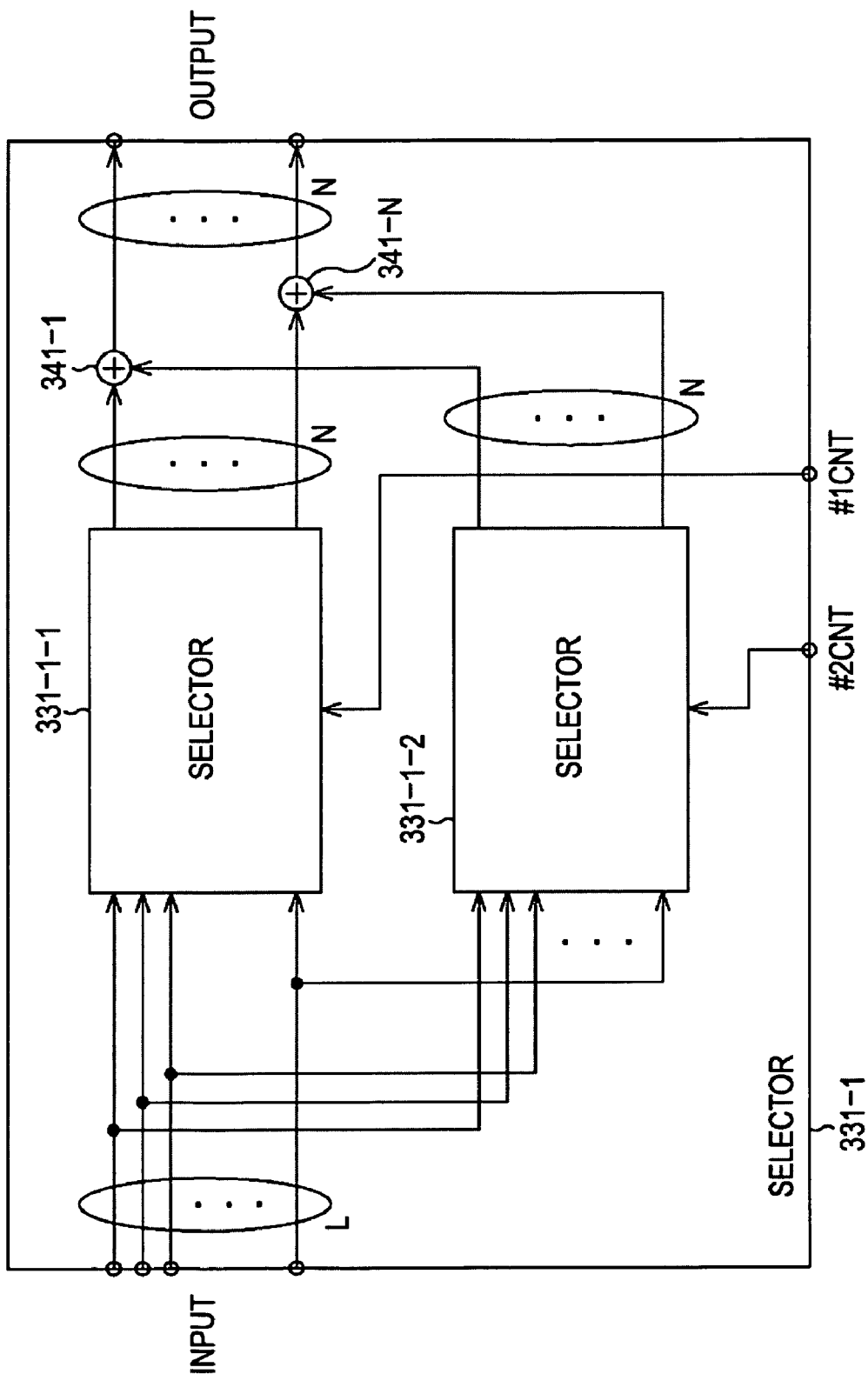
FIG. 38 is a block diagram illustrating in detail the configuration of the selector in FIG. 37.

The configurations and operations of the selector 331-1 will be described with reference to FIG. 38. Note that the selector 331-2 through selector 331-K each have the same configuration and execute the same operations as the selector 331-1, which will be described with reference to FIG. 38, so detailed description thereof will be omitted.

The selector 151 corresponding to the above-described Expression (7) outputs the fifth input signal to two output terminals so as to perform interpolation processing. Conversely, in order to provide multiple input signals to be repeated with the timing thereof shifted, as shown in Expression (13) described above, the above-described selector 261 has been arranged to output each of a first series for interpolating using the fifth data of five samples of a 300 MHz output signal, and a second series for interpolating using the second data of five samples of a 300 MHz output signal.

In contrast to this, the selector 331 has a first selector 331-1-1 and a second selector 331-1-2 for taking L-bit parallel signals that are input, and subjecting predetermined signals to interpolation to output N-bit signals, based on control signals supplied from the controller 311, in the same way as with the selector 151 of the selector block 143 described with reference to FIG. 15. The signals interpolated by control signals supplied from the controller 311 to the selector 331-1-1 and the control signals supplied from the controller 311 to the selector 331-1-2 are each different.

The N-bit signals output from the first selector 331-1-1 and the N-bit signals output from the second selector 331-1-2 are each added by addition unit 341-1 through addition unit 341-N. That is to say, N-bit signals are output from the selector 331.

Figure 39:
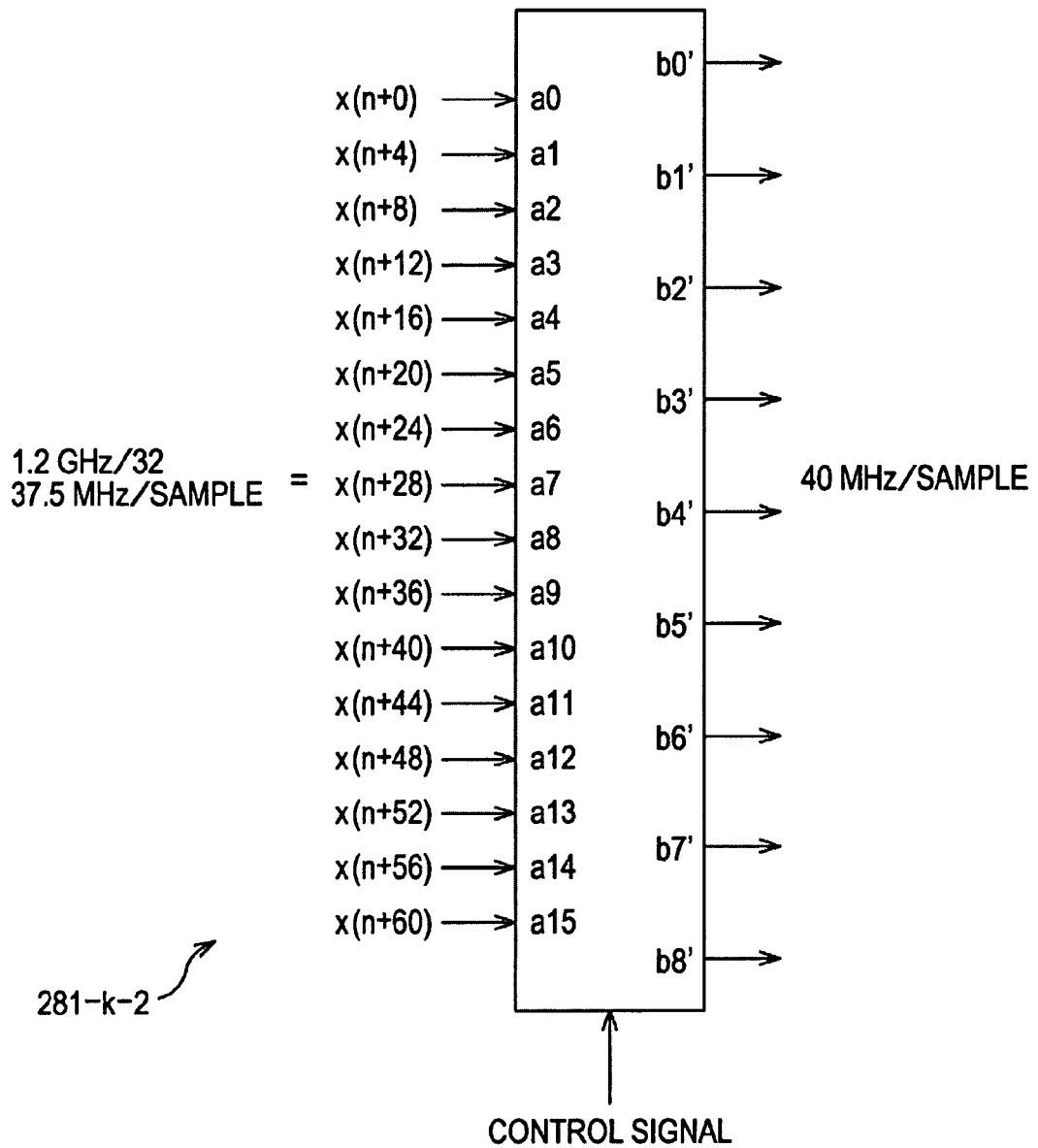
FIG. 39 is a diagram illustrating a configuration example of a second selector in FIG. 38.

The configuration example of the first selector 331-$k$-1 included in the selector 331-1 through selector 331-K is basically the same as that described with reference to FIG. 18. Also, the configuration example of the second selector 331-$k$-2 included in the selector 331-1 through selector 331-K, such as the selector 331-1-2, is basically the same as that described with reference to FIG. 18; however, in order to enable the output signals of each to be differentiated here, the configuration example of the second selector 331-$k$-2 is shown in FIG. 39. Here, the first selector 331-$k$-1 receives L-bit input signals (in this case, the 16 bits of a0 through a15) supplied from the buffer 142, and outputs N-bit signals (in this case, the 9 bits of b0 through b8), and the second selector 331-$k$-2 receives L-bit input signals (in this case, the 16 bits of a0 through a15) supplied from the buffer 142, and outputs N-bit signals (in this case, the 9 bits of b0' through b8').

Specific processing for executing the sampling rate conversion processing from 300 MHz to 360 MHz with the selector 331 will be described below.

Note in implementation, the selector 331 is configured to obtain input signals at 1.2 GHz/32=37.5 MHz, while outputting a 40 MHz signal, whereby the sampling rate conversion from 300 MHz to 360 MHz can be equivalently processed.

An L-bit signal is input from the buffer 142 is input into the selector 331-K. Here, a let us say that 16-bit signal is supplied from the buffer 142 as to one selector 331 for every 37.5 MHz (1.2 GHz/32) simultaneously.

Now, in the case that a certain signal n in a 1-bit signal series supplied to the buffer 142 is supplied to the input terminal a0 of the first selector 331-1-1 and second selector 331-1-2 at a certain timing, ¼ decimation is executed at the buffer 142, so at the same time, the signal supplied to the input terminal a1 is a signal delayed four counts from the signal n, and the signal supplied to the input terminal a2 is a signal delayed eight counts from the signal n, and similarly, the signals delayed by four counts each are each supplied to the input terminals a1 through a15 of the first selector 331-$k$-1 and second selector 331-$k$-2.

Also, the first selector 331-$k$-1 and second selector 331-$k$-2 each output N-bit signals. Let us say that the signal output terminals of the first selector 331-$k$-1 are b0 through b8, the signal output terminals of the second selector 331-$k$-2 are b0' through b8', and 9-bit signals are output simultaneously for every 40 MHz. Which of the signals of the input signals will be output is controlled based on a control signal supplied from the controller 311.

In the case of converting 300 MHz to 360 MHz, as described with Expression (4), if the 300 MHz clock is subjected to five sample counts, the 360 MHz sample at the timing thereof needs to be interpolated. Control signals are supplied from the controller 311 such that the timing of the repeatedly input signals will be shifted at the first selector 331-$k$-1 and second selector 331-$k$-2. Thus, for example, at the first selector 331-$k$-1, the second sample of five samples is repeatedly output from the output terminals b0 through b8, i.e., output from two output terminals, and also at the second selector 331-$k$-2, the fifth sample of five samples is repeatedly output from the output terminals b0' through b8', i.e., output from two output terminals.

When we consider that such interpolation is executed with 40 MHz timing, interpolation at the first timing needs to be executed at the timing for the second sample and seventh sample at 300 MHz at the first selector 331-*k*-1, and interpolation needs to be executed at the timing for the fifth sample at 300 MHz at the second selector 331-*k*-2.

Figure 40:
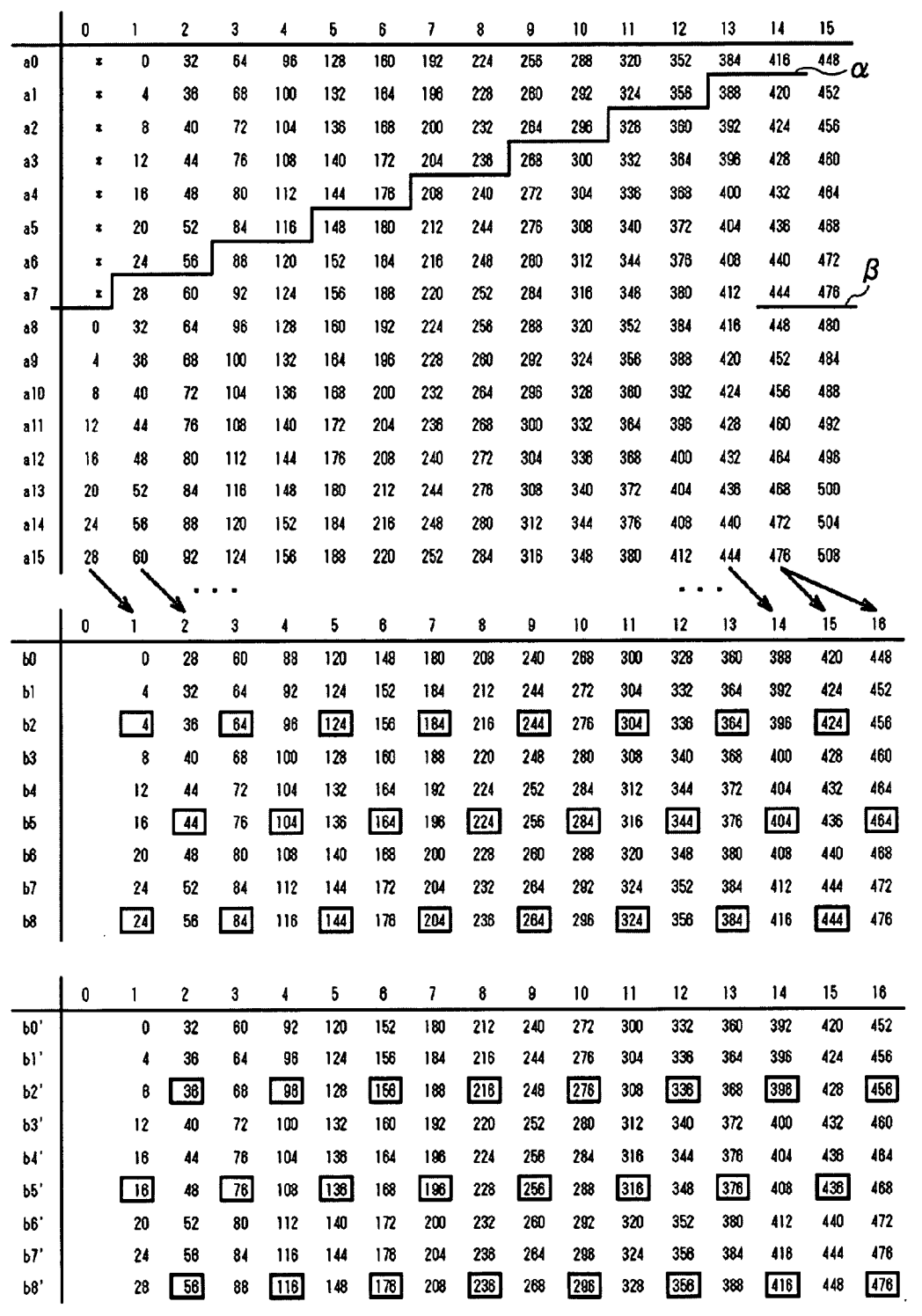

FIG. 40 shows input/output to the first selector 331-*k*-1 and second selector 331-*k*-2. The upper portion of FIG. 40 shows an input signal to the first selector 331-*k*-1 and second selector 331-*k*-2. The 0, 1, 2, 3 . . . on the horizontal axis shows the timing at which the L-bit signal is input from the buffer 142, and advances one timing for every 37.5 MHz. Conversely, the values 4, 8, 12, 16 . . . show the delay amount at the time each signal is input into the buffer 142, in the case that a signal supplied to the input terminal a8 at input timing 0 is employed as a reference. As described above, ¼ decimation is executed at the buffer 142, so signals delayed by four counts each are respectively supplied to input terminals a1 through a15.

That is to say, signals supplied simultaneously to the input terminals a0 through a15 every 37.5 MHz are, at the time of input to the buffer 142, signals having a frequency of 300 MHz which is ¼ of 1.2 GHz.

The first selector 331-*k*-1 and second selector 331-*k*-2 appropriately select a portion of the input signal, each interpolate difference signals so as to be the same ratio on average, and execute processing to output at 40 MHz.

The lower portion of FIG. 40 shows the output signal from the first selector 331-*k*-1 and second selector 331-*k*-2. Of these, the portion of output terminal b0 through b8 is the output from the first selector 331-*k*-1, the portion of output terminal b0' through b8' is the output from the second selector 331-*k*-2, and the 0, 1, 2, 3 . . . on the horizontal axis show the output timing of a 9-bit signal from the first selector 331-*k*-1 and second selector 331-*k*-2, which advances 1 timing for every 40 MHz.

With an output timing 1 which is delayed 1 timing from the input timing 0, wherein the signal supplied to the input terminal a8 at input timing 0 is employed as a reference, a 9-bit signal is output from each of the first selector 331-*k*-1 and second selector 331-*k*-2. In the case of converting 300 MHz to 360 MHz, as described with reference to Expression (13), it is necessary to interpolate the 360 MHz output signal at the second count of the five samples of the 300 MHz clock of the input signals for the first selector 331-*k*-1 which is the first series and at the fifth count for the second selector 331-*k*-2 which is the second series. When we consider this as a 9 signal group×2 systems output every 40 MHz, at the timing 1 serving as the first output, this corresponds to interpolating a 360 MHz output signal employing the second sample and seventh sample at 300 MHz at the first selector 331-*k*-1 which is the first series, and interpolating a 360 MHz output signal employing the fifth sample at 300 MHz at the second series.

That is to say, at the timing 1 serving as the first output, in order to convert 300 MHz to 360 MHz, the input data "4" to the input terminal a9, and the input data "24" to the input terminal a14, of the first selector 331-*k*-1 which is the first system, and the input data "16" to the input terminal a12, of the second selector 331-*k*-2 which is the second system, each need to be output to two output terminals. Accordingly, the input data "4" to the input terminal a9 is output from the output terminals b2 and b3 and the input data "24" to the input terminal a14 is output from the output terminals b7 and b8 of the first selector 331-*k*-1, and the input data "16" to the input terminal a12 is output from the output terminals b4' and b5' of the second selector 331-*k*-2.

At the timing 2 which is the next output timing, at the first selector 331-*k*-1 which is the first system, the state has already been advanced by two samples (output) at timing 1, so interpolating at the timing of the fifth (5−2+2) sample with a 300 MHz output signal is necessary, and also, the state at the second selector 331-*k*-2 which is the second system has already been advanced by three samples (output) at timing 1, so interpolating at the timing of the second sample with a 300 MHz output signal is necessary, and further, interpolating at the timing of the seventh sample is also necessary.

That is to say, at the output timing 2, in order to convert 300 MHz to 360 MHz, the input data "44" input into the input terminal a11 of the first selector 331-*k*-1 which is the first system, and the input data "36" and "56" input into the input terminal a9 and input terminal a14 of the second selector 331-*k*-2 which is the second system, need to be output to two output terminals. Accordingly, the input data "44" to the input terminal a11 is output from the output terminals b4 and b5 of the first selector 331-*k*-1, and the input data "36" to the input terminal a9 is output from the output terminals b1' and b2' and the input data "56" to the input terminal a14 is output from the output terminals b7' and b8' of the second selector 331-*k*-2.

Also, of the signals input/output at one time, the selection of the count and location of the input data output to two terminals with the first selector 331-*k*-1 and second selector 331-*k*-2 is controlled based on the control signals supplied from the controller 311. The detailed processing for the controller 311 to generate the control signal for causing the selector 331 to select the count and location of the input data output to the two terminals will be described later with reference to FIG. 41.

As for initialization of delay, this is the same as the case with the above-described selector 151-*k*, so description thereof will be omitted.

Consequently, the selector 331 can execute basically the same interpolation processing as with each of the selector 261-1 through selector 261-*k* in FIG. 30 as indicated in Expression (13) described above.

The addition processing unit 144 is configured of K addition or output selection units 161, wherein, based on the control of the controller 311, N-bit output of the selector 331 is added and output, or alternatively, only 1-bit of the N-bit output is output. That is to say, the addition processing unit 144 executes addition processing of the interpolation and addition for decimation, or thinning out processing which is executed instead of the addition processing.

Here, the selector 331 has been described as synthesizing and outputting signals interpolated at a predetermined ratio by predetermined signals being repeated by two selectors, but the number of systems of output signals wherein the repeated input signals are different, i.e., the number of selectors which the selector 331 includes, may be two or more, and it goes without saying that the greater then number of systems of output signals wherein the repeated input signals are different is, the better, in order to suppress spurious components as much as possible and obtain sufficient properties of filtering using a filter which is not steep such as a SINC filter or the like. In this case, the selector 331 has S selectors with basically the same configuration as that of the selector 151, and is arranged such that S systems of output signals interpolated by S difference input signals be repeated, i.e., S×N bit output signals are synthesized into N bits, and then output. The addition processing unit 144 either adds and outputs N bits of output of the selector 331, or outputs only 1 bit of the N bits of output based on the control of the controller 311.

Figure 41:
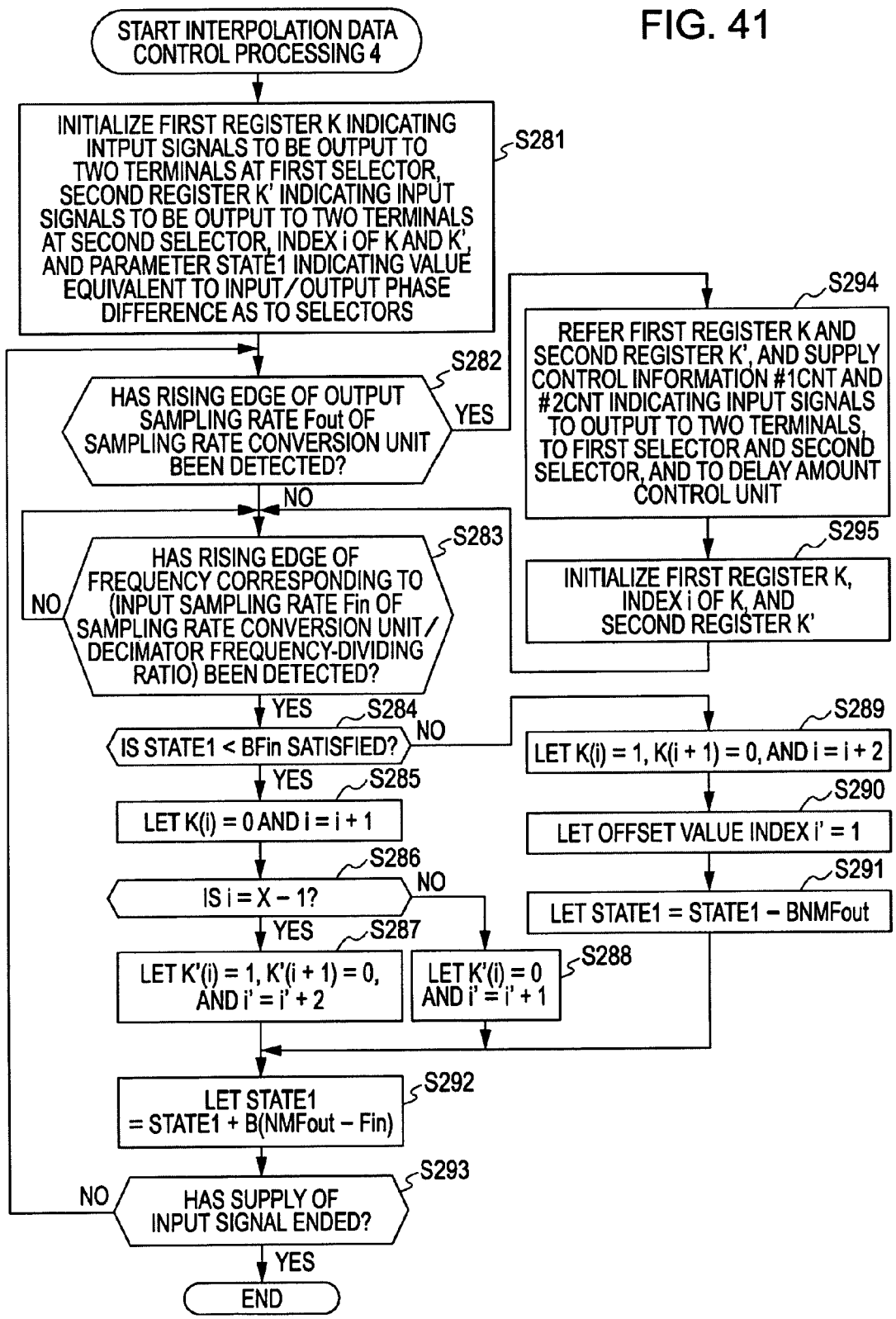
FIG. 41 is a flowchart for describing interpolation data control processing 4.

Next, the interpolating data control processing 4, which is started in step S4 in FIG. 24, in a case of using the sampling rate conversion unit 301 in FIG. 37, will be described with reference to the flowchart in FIG. 41.

In step S281, the interpolation data control unit 291 of the controller 311 initializes a first register K which determines whether to output each input signal to two terminals or whether to output to one terminal at the first selector 331-k-1, a second register K' which determines whether to output each input signal to two terminals or whether to output to one terminal at the second selector 331-k-2, the index i of K and K', an index i' of the offset value of input signals to be output to two terminals, and the parameter STATE 1 showing a value equivalent to the phase difference of the input/output as to the selector.

With the first selector 331-k-1 which is the first system, in the event that the i'th input signal is output from one terminal, the value of register K corresponding to the i'th input signal is 0 (K(i)=0), and in the event that the i'th input signal is output from two terminals, i.e., the output signal is interpolated employing an i'th input signal, the value of the first register K corresponding to the i'th input signal is 1 (K(i)=1). In the same way, with the second selector 331-k-2 which is the second system, in the event that the i'th input signal is output from one terminal, the value of the second register K' corresponding to the i'th input signal is 0 (K'(i)=0), and in the event that the i'th input signal is output from two terminals, i.e., the output signal is interpolated employing an i'th input signal, the value of the register K' corresponding to the i'th input signal is 1 (K'(i)=1).

In step S282, the interpolation data control unit 291 determines whether or not a frequency clock the same as the output sampling rate Fout of the sampling rate conversion unit 301, e.g. the leading edge of a 40 MHz clock, is detected. In the event that a frequency clock the same as the output sampling rate Fout of the sampling rate conversion unit 301, e.g. the leading edge of a 40 MHz clock, is detected in step S282, the flow is advanced to the later-described step S294.

Figure 36:
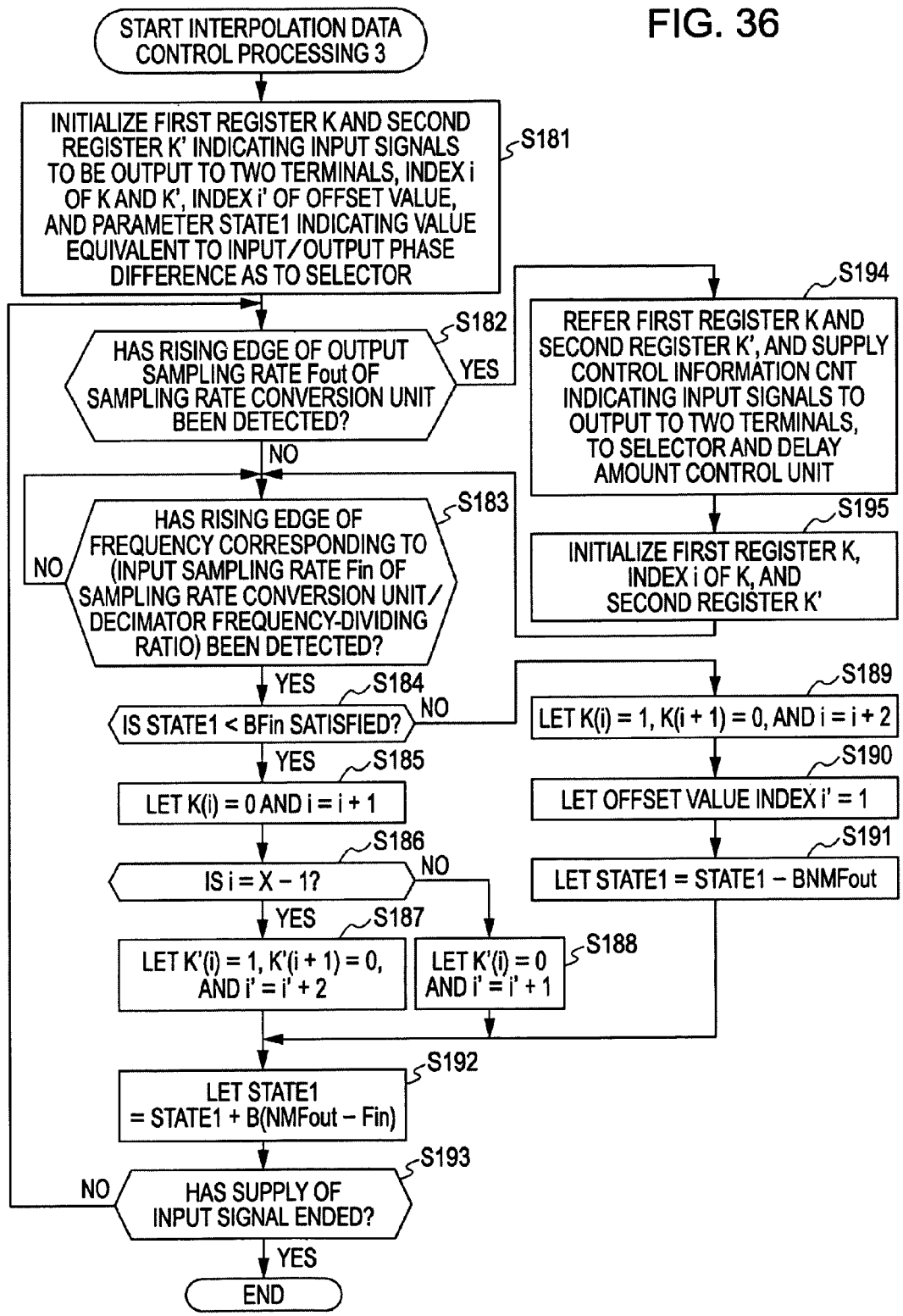
FIG. 36 is a flowchart for describing interpolation data control processing 3.

In the event that determination is made in step S282 that a clock with the same frequency as the output sampling rate Fout of the sampling rate conversion unit 301, e.g. the leading edge of a 40 MHz clock, is not detected, in step S283 through step S293, processing which is basically the same as that of steps S183 through S193 in FIG. 36 is performed.

That is to say, there is a standby state for (input sampling rate Fin of sampling rate conversion unit 301/frequency division ratio of decimator), i.e., the leading edge of a clock with 300 MHz frequency which is ¼ of 1.2 GHz, for example, and in the event determination is made that this has been detected, determination is made regarding whether or not STATE 1<BFin holds with a parameter STATE 1 showing a value equating to the phase difference of the input/output as to the selector.

Here, Fin is an input signal frequency, and for example is 1.2 GHz here. Also, B is a predetermined constant, and for example is $1/(0.24 \times 10^9)$ here.

In the case that determination is made that STATE 1<BFin holds, the i'th input signal is taken as being output from one terminal with the first selector 331-k-1 which is the first system, K(i)=0 is set, and the index i is incremented by 1 to i=i+1. Whether or not i'=x−1 is determined, based on the offset value x between the input data used for interpolation at the first selector 331-k-1 which is the first system and input data used for interpolation at the second selector 331-k-2 which is the second system. In the event that determination is made that i'=x−1 holds, the i'th input signal is taken as being output from two terminals with the second selector 331-k-2 which is the second system, and K'(i)=1 and K'(i+1)=0 are set, and i'=i'+2, is set.

In the event that determination is made that i'=x−1 does not hold, the i'th input signal is taken as being output from one terminal with the second selector 331-k-2 which is the second system, K'(i)=0 is set, and the index i' is incremented by 1 to i'=i'+1.

In the case that determination is made that STATE 1<BFin does not hold, the i'th input signal is taken as being output from two terminals with the first selector 331-k-1 which is the first system, and sets K(i)=1, K(i+1)=0, and i=i+2 are set. The value of the offset value index i' is then initialized so that i'=1.

Next, the parameter STATE 1 is initialized, i.e. STATE 1=STATE 1−BNMFout. N is the frequency division ratio of the decimator connected to the SINC filter, for example, and specifically is the frequency division ratio of the frequency division processing corresponding to the addition processing of the addition processing unit 253, and is 9 here, for example. Also, M is the ratio (frequency division ratio) of decimation before interpolation processing is the signal subjected to AD conversion, and specifically is a ratio (frequency division ratio) of decimation corresponding to the processing in the buffer 142, and is 4 here, for example. The parameter STATE 1 is then incremented by a predetermined value, i.e. STATE 1=STATE 1+B(NMFout−Fin).

Determination is then made regarding whether or not the supplying of input signals has ended. In the case it is determined that the supply of input signals has not ended, the flow returns to step S282, and the processing thereafter is repeated.

In the event that determination is made in step S282 that the leading edge of a clock with the same frequency as the output sampling rate Fout of the sampling rate conversion unit 301, e.g. a 40 MHz clock, has been detected, in step S294 the interpolation data control unit 291 references the register K and register K', and supplies the control information #1 CNT and #2 CNT indicating an input signal to output to two terminals to the first selector 331-k-1, the second selector 331-K-2, and delay amount control unit 212.

Specifically, for example, every time the index i of the first register K indicating input signals to be output to two terminals at the first selector 331-k-1 and the second register K' indicating input signals to be output to two terminals at the second selector 331-k-2, and the offset value index i' are incremented by 1, whether a signal input to which of the terminals is to be output from one terminal, or is to be output from two terminals, is held as a value 0 or 1 respectively, at the first register K or second register K' with regard to the input/output of the first selector 331-k-1 and second selector 331-k2. When the interpolation data control unit 291 detects the leading edge of the 40 MHz clock, i.e., ahead of the output timing of the signal from the selector 261, the first register K and second register K' are referenced to generate first control information #1 CNT indicating input signals to be output from two terminals at the first selector 331-k-1, and second control information #2 CNT indicating input signals to be output from two terminals at the second selector 331-k-2, and this is supplied to the selector 331.

That is to say, an input signal corresponding to an index i wherein K(i)=1 or K'(i)=1 is an input signal to be output to two terminals.

In step S295, the interpolation data control unit 291 initializes the first register K, index i of the first register K and second register K', and the second register K', and the flow is advanced to step S283.

In the case that determination is made in step S293 that the supplying of input signals has ended, the processing is ended.

With such processing, the interpolation control unit 291 of the controller 311 generates a control signal, so that the first selector 331-k-1 and the second selector 331-k-2 of the selector 331 can appropriately select a portion of the input signal, and interpolate at a predetermined ratio, and supplies this to the selector 331. Specifically, the interpolation data control unit 291 of the controller 331 can generate a control signal to indicate the input signal used for N-bit (here, 9 bits) interpolation processing output from each of the first selector 331-$k$-1 and the second selector 331-$k$-2, for each output timing of signals from the selector 331, so that the selector 331 can employ different samples between the first selector 331-$k$-1 and the second selector 331-$k$-2 to interpolate output signals at 360 MHz, as described with reference to FIG. 40.

Thus, by using the sampling rate conversion unit 301 in FIG. 37, the absolute value of spurious component can be reduced, and least-square error can be reduced, in the same way as the case of using the sampling rate conversion unit 241 in FIG. 30. Also, the frequency at which the spurious component occurs can be shifted to a higher frequency, so the spurious component can be effectively removed at a downstream filter.

Next, the interpolating data control processing 4, which is started in step S4 in FIG. 24, in a case of using the sampling rate conversion unit 301 in FIG. 37, will be described with reference to the flowchart in FIG. 41.

In step S281, the interpolation data control unit 291 of the controller 311 initializes a first register K which determines whether to output each input signal to two terminals or whether to output to one terminal at the first selector 331-$k$-1, a second register K' which determines whether to output each input signal to two terminals or whether to output to one terminal at the second selector 331-$k$-2, the index i of K and K', an index i' of the offset value of input signals to be output to two terminals, and the parameter STATE 1 showing a value equivalent to the phase difference of the input/output as to the selector.

With the first selector 331-$k$-1 which is the first system, in the event that the i'th input signal is output from one terminal, the value of register K corresponding to the i'th input signal is 0 (K(i)=0), and in the event that the i'th input signal is output from two terminals, i.e., the output signal is interpolated employing an i'th input signal, the value of the first register K corresponding to the i'th input signal is 1 (K(i)=1). In the same way, with the second selector 331-$k$-2 which is the second system, in the event that the i'th input signal is output from one terminal, the value of the second register K' corresponding to the i'th input signal is 0 (K'(i)=0), and in the event that the i'th input signal is output from two terminals, i.e., the output signal is interpolated employing an i'th input signal, the value of the register K' corresponding to the i'th input signal is 1 (K'(i)=1).

In step S282, the interpolation data control unit 291 determines whether or not a frequency clock the same as the output sampling rate Fout of the sampling rate conversion unit 301, e.g. the leading edge of a 40 MHz clock, is detected. In the event that a frequency clock the same as the output sampling rate Fout of the sampling rate conversion unit 301, e.g. the leading edge of a 40 MHz clock, is detected in step S282, the flow is advanced to the later-described step S294.

In the event that determination is made in step S282 that a clock with the same frequency as the output sampling rate Fout of the sampling rate conversion unit 301, e.g. the leading edge of a 40 MHz clock, is not detected, in step S283 through step S293, processing which is basically the same as that of steps S183 through S193 in FIG. 36 is performed.

That is to say, there is a standby state for (input sampling rate Fin of sampling rate conversion unit 301/frequency division ratio of decimator), i.e., a clock with 300 MHz frequency which is ¼ of 1.2 GHz, for example, and in the event determination is made that (input sampling rate Fin of sampling rate conversion unit 301/frequency division ratio of decimator), i.e., the leading edge of a clock with 300 MHz frequency which is ¼ of 1.2 GHz, for example, has been detected, determination is made regarding whether or not STATE 1<BFin holds with a parameter STATE 1 showing a value equating to the phase difference of the input/output as to the selector.

Here, Fin is an input signal frequency, and for example is 1.2 GHz here. Also, B is a predetermined constant, and for example is $1/(0.24 \times 10^9)$ here.

In the case that determination is made that STATE 1<BFin holds, the i'th input signal is taken as being output from one terminal with the first selector 331-$k$-1 which is the first system, K(i)=0 is set, and the index i is incremented by 1 to i=i+1. Whether or not i'=x−1 is determined, based on the offset value x between the input data used for interpolation at the first selector 331-$k$-1 which is the first system and input data used for interpolation at the second selector 331-$k$-2 which is the second system. In the event that determination is made that i'=x−1 holds, the i'th input signal is taken as being output from two terminals with the second selector 331-$k$-2 which is the second system, and K'(i)=1 and K'(i+1)=0 are set, and i'=i'+2, is set.

In the event that determination is made that i'=x−1 does not hold, the i'th input signal is taken as being output from one terminal with the second selector 331-$k$-2 which is the second system, K'(i)=0 is set, and index i' is incremented by 1 to i'=i'+1.

In the case that determination is made that STATE 1<BFin does not hold, the i'th input signal is taken as being output from two terminals with the first selector 331-$k$-1 which is the first system, and sets K(i)=1, K(i+1)=0, and i=i+2 are set. The value of the offset value index i' is then initialized so that i'=1.

Next, the parameter STATE 1 is initialized, i.e. STATE 1=STATE 1−BNMFout. N is the frequency division ratio of the decimator connected to the SINC filter, for example, and specifically is the frequency division ratio of the frequency division processing corresponding to the addition processing of the addition processing unit 253, and is 9 here, for example. Also, M is the ratio (frequency division ratio) of decimation before interpolation processing is the signal subjected to AD conversion, and specifically is a ratio (frequency division ratio) of decimation corresponding to the processing in the buffer 142, and is 4 here, for example.

The parameter STATE 1 is then incremented by a predetermined value, i.e. STATE 1=STATE 1+B(NMFout−Fin), and determination is then made regarding whether or not the supplying of input signals has ended. In the case it is determined that the supply of input signals has not ended, the flow returns to step S282, and the processing thereafter is repeated.

In the event that determination is made in step S282 that the leading edge of a clock with the same frequency as the output sampling rate Fout of the sampling rate conversion unit 301, e.g., the leading edge of a 40 MHz clock, has been detected, in step S294 the interpolation data control unit 291 references the register K and register K', and supplies the control information #1 CNT and #2 CNT indicating an input signal to output to two terminals to the first selector 331-$k$-1, the second selector 331-K-2 and delay amount control unit 212.

Specifically, for example, every time the index i of the first register K indicating input signals to be output to two terminals at the first selector 331-$k$-1, and the index i' of the second register K' indicating input signals to be output to two terminals at the second selector 331-$k$-2, are incremented by 1, whether a signal input to which one of the input terminals is to be output from one terminal, or a signal input to which one of the input terminals is to be output from two terminals, is held as a value 0 or 1 respectively, at the first register K or second register K' with regard to the input/output of the first selector 331-k-1 and second selector 331-k2. When the interpolation data control unit 291 detects the leading edge of the 40 MHz clock, i.e., ahead of the output timing of the signal from the selector 261, the first register K and second register K' are referenced to generate first control information #1 CNT indicating input signals to be output from two terminals at the first selector 331-k-1, and second control information #2 CNT indicating input signals to be output from two terminals at the second selector 331-k-2, and this is supplied to the selector 331.

That is to say, an input signal corresponding to an index i wherein K(i)=1 or K'(i)=1 is an input signal to be output to two terminals.

In step S295, the interpolation data control unit 291 initializes the first register K, index i of K and K', and the second register K', and the flow is advanced to step S283.

In the case that determination is made in step S293 that the supplying of input signals has ended, the processing is ended.

With such processing, the interpolation control unit 291 generates a control signal, so that the first selector 331-k-1 and the second selector 331-k-2 of the selector 331 can appropriately select a portion of the input signal, and interpolate at a predetermined ratio, and supplies this to the selector 331. Specifically, the interpolation data control unit 291 can generate a control signal to indicate the input signal used for N-bit (here, 9 bits) interpolation processing output from each of the first selector 331-k-1 and the second selector 331-k-2, for each output timing of signals from the selector 331, so that the selector 331 can employ different samples between the first selector 331-k-1 and the second selector 331-k-2 to interpolate output signals at 360 MHz, as described with reference to FIG. 40.

Thus, by using the sampling rate conversion unit 301 in FIG. 37, the absolute value of spurious component can be reduced, and least-square error can be reduced, in the same way as the case of using the sampling rate conversion unit 241 in FIG. 30. Also, the frequency at which the spurious component occurs can be shifted to a higher frequency, so the spurious component can be effectively removed at a downstream filter.

The above-described series of processing can be executed by software. The software is installed in a computer having dedicated hardware in which a program making up the software is installed, or is installed from a recording medium to a general-purpose computer or the like, for example, which is capable of executing various types of functions by installing various types of programs. In this case, the digital block 111 described with FIG. 13 is configured of a personal computer 401 such as shown in FIG. 42, for example.

Figure 42:
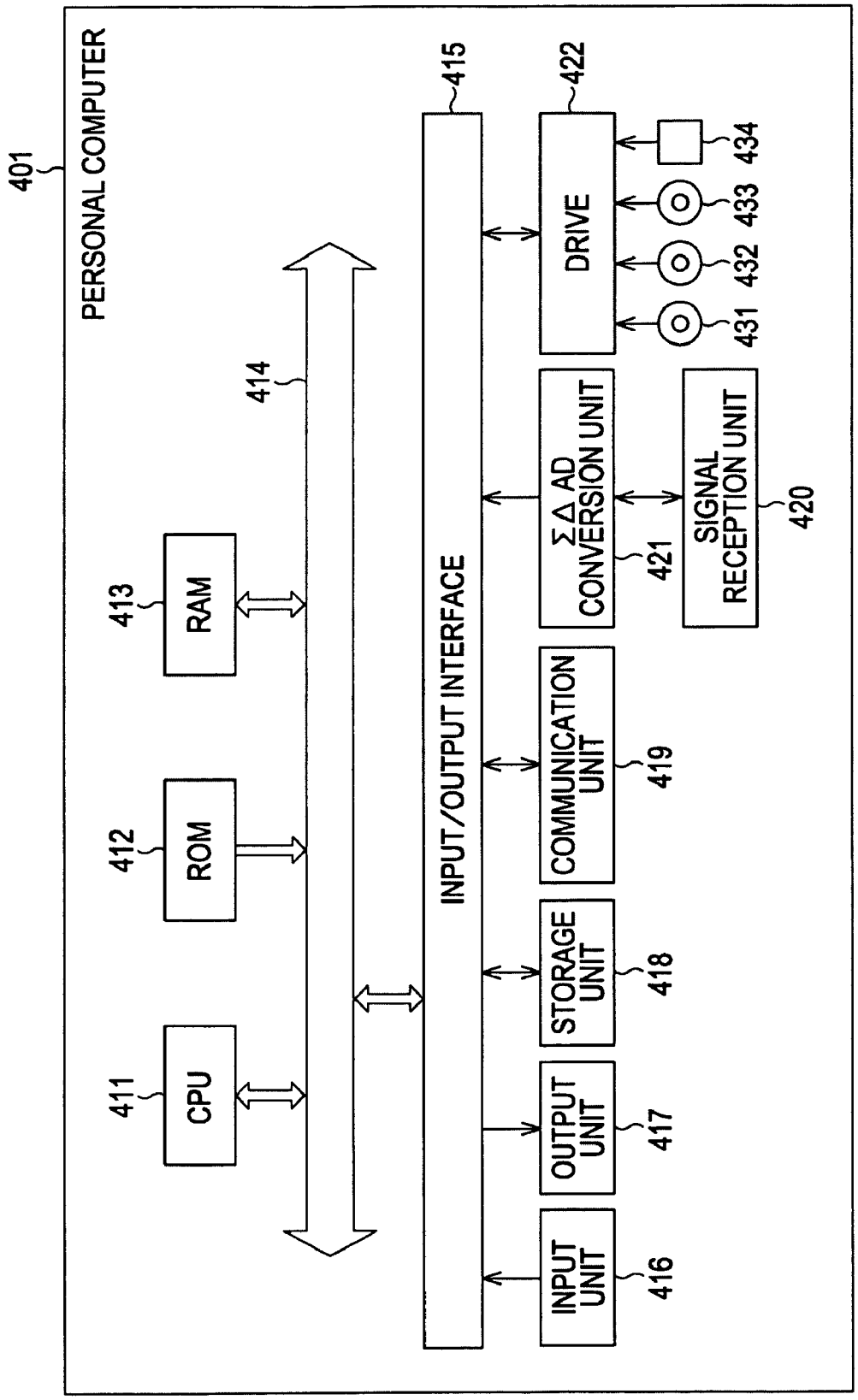
FIG. 42 is a block diagram illustrating the configuration of a personal computer.

In FIG. 42, a CPU (Central Processing Unit) 411 executes various types of processing, following programs stored in ROM (Read Only Memory) 412 or programs loaded from a storage unit 418 to RAM (Random Access Memory) 413. The RAM 413 also stores data necessary for the CPU 411 to execute various types of processing, as appropriate.

The CPU 411, ROM 412, and RAM 413 are mutually connected via a bus 414. The bus 414 is also connected to an input/output interface 415.

Connected to the input/output interface 415 are an input unit 416 including a keyboard, mouse, and so forth, an output unit 417 including a display, speaker, and so forth, a storage unit 418 configured of a hard disk or the like, a communication unit 419 configured of a modem, terminal adapter, and so forth, and a signal reception unit 420. the communication unit 419 performs communication processing via networks including the Internet.

The signal reception unit 420 has an antenna, BPF, and LNA, or is configured so as to be capable of executing similar functions.

The $\Sigma\Delta$ A/D modulator 421 filters supplied RF signals as necessary and performs decimation (in other words, executes processing the same as that of the SINC filter 51 and decimator 131 of the digital block 111 described with FIG. 13), then converts into a 1-bit bit stream, and performs high-order oversampling, so as to convert supplied analog signals into digital signals. Note that the $\Sigma\Delta$ A/D modulator 421 may further have the functions of the LPF 54 and decimator 132 of the digital block 111 described with reference to FIG. 13.

The CPU 411 then obtains the digital signals which have been converted by the $\Sigma\Delta$ A/D modulator 421, and executes processing which is the same as at least a part of the digital block 111 described with FIG. 13, including processing which the sampling rate conversion unit 133 described with FIG. 15 executes.

A drive 422 is also connected if necessary to the input/output interface 415, to which a magnetic disk 431, optical disc 432, magneto-optical disc 433, semiconductor memory 434, or the like are mounted as appropriate, and computer programs read out therefrom are installed in the storage unit 418 as necessary.

In the case of executing this series of processing by software, the software is installed in a computer having dedicated hardware in which a program making up the software is installed, or is installed from a network or a recording medium to a general-purpose computer or the like, for example, which is capable of executing various types of functions by installing various types of programs.

The recording medium is, as shown in FIG. 42, not only configured of packaged media including a magnetic disk 431 (including floppy disks), optical disc 432 (including CD-ROM (Compact Disc-Read Only Memory) and DVD (Digital Versatile Disc), magneto-optical disc 433 (Mini-disc (a registered trademark)), semiconductor memory 434, and so forth, storing the program so as to be distributed to users separately from the main device, but also is configured of ROM 412, a hard disk included in the storage unit 418, and so forth, in which the program is stored, so as to be supplied to the user in a state built into the device main unit beforehand.

In the present Specification, steps describing the program recorded in the recording medium may of course be processed in the described order in time-sequence, but are not restricted to being performed in time-sequence, and may be executed in parallel or individually.

It should be understood by those skilled in the art that various modifications, combinations, sub-combinations and alterations may occur depending on design requirements and other factors insofar as they are within the scope of the appended claims or the equivalents thereof.

What is claimed is:

1. An information processing device for processing reception signals converted into digital signals, comprising:
    first conversion means for executing sampling rate conversion of each of said digital signals to be computed with each tap coefficient of a K'th-order FIR filter, wherein said first conversion means execute sampling rate conversion by subjecting each of said digital signals to thinning out, interpolation, or filtering processing, said first conversion means comprising:
        second conversion means for receiving input of said digital signals, and converting a predetermined L data groups out of said digital signals that have been input, into output of K series corresponding to the tap coefficients of said K'th-order FIR filter;

K third conversion means for subjecting said L data groups output from said second conversion means to interpolation and rate conversion, and outputting N data groups, N being a data count different from the data count L, wherein, of said K third conversion means, said third conversion means output a data series corresponding to the i'th ($0 \leq i \leq K$) tap coefficient receive input of said L data groups delayed by i, i+M, i+2M, . . . , i+(L−1)M samples from the current timing;

digital filter means for providing said K'th order FIR filter for said K digital signals each of which have been subjected to sampling rate conversion by said first conversion means; and control means, responsive to a control input signal, for controlling sampling rate conversion of said digital signals by said first conversion means, and controlling the processing of said K'th order FIR filter.

2. The information processing device according to claim 1, said first conversion means further comprising:

K addition processing means for adding data included in said N data groups output from said third conversion means, and outputting.

3. The information processing device according to claim 2, wherein said second conversion means output, as K series corresponding to the tap coefficients of said K'th order FIR filter, said L data groups, each delayed by integer multiples of an interval M (wherein M is an integer of 1 or greater) from predetermined signals in said digital signals that have been input.

4. The information processing device according to claim 2, said second conversion means further comprising:

a plurality of signal holding means for holding said digital signals;

wherein said plurality of signal holding means sequentially hold said digital signals, thereby receiving input of said digital signals which are serial signals, converting into L-bit parallel signals, and outputting as said L data groups, and also outputting data with an operation clock 1/J (wherein J is an integer of 1 or greater) of the sampling frequency of said digital signals which are serial signals.

5. The information processing device according to claim 2, wherein said second conversion means receive input of said digital signals which are serial signals, convert into L-bit parallel signals, and output as said L data groups, and also output data with an operation clock 1/J (wherein J is an integer of 1 or greater) of the sampling frequency of said digital signals which are serial signals.

6. The information processing device according to claim 5, wherein, of said K third conversion means, said third conversion means execute interpolation processing by making selection regarding each input signal of said L data groups, based on control of said control means, whether to output to one output terminal, output to two output terminals, or output to neither output terminal.

7. The information processing device according to claim 6, wherein said third conversion means receive input of said L data groups at a first rate which is 1/J times the sampling frequency of said digital signals, and output said N data groups that have been interpolated, at a second rate which is different from said first rate.

8. The information processing device according to claim 6, said control means comprising:

first signal generating means for generating first control signals for selecting, of said L data groups input to said third conversion means, signals to be output to two output terminals; and second control signal generating means for generating second control signals for selecting a start point of signals selected from said L data groups input to said third conversion means as said N data groups output from said third conversion means, and third control signals for instructing initialization of a delay amount from the start point in the previous output.

9. The information processing device according to claim 8, wherein said second control signal generating means calculate the difference between the count of signals of said L data groups input to said third conversion means at an immediately-preceding timing that have been output to two output terminals, and a predetermined threshold value, generate said second control signals for increasing the amount of said delay from said start point in the previous output by said difference that has been calculated, and supply said second control signals to said third control means.

10. The information processing device according to claim 9, wherein said second control signal generating means increment a counter value of a first counter by a predetermined value for each first rate which is 1/J times the sampling frequency of said digital signal supplied to said third conversion means, generate said second control signals instructing initialization of the delay amount in the event that the counter value of said first counter exceeds a predetermined threshold, and supply said second control signals to said third control means.

11. The information processing device according to claim 10, wherein said N data groups are parallel signals of N bits;

and wherein said predetermined value is a value determined by said first rate, and a second rate which is the rate of said N-bit parallel signals output from said third conversion means.

12. The information processing device according to claim 9, wherein said N data groups are parallel signals of N bits;

and wherein said first control signal generating means increment the counter value of a second counter for each sampling rate corresponding to a value obtained by subtracting, from the sampling rate of said digital signals supplied to said second conversion means, the delay interval M between each data of the L data groups input to said third conversion means, and also increment the counter value of a third counter by 1, in the event that the counter value of said second counter has exceeded a predetermined threshold, initialize the counter value of said second counter, hold the counter value of said third counter, and increment the counter value of said third counter by 2, and generate said first control signal indicating which of the input signals the signals to be output to two output terminals are, for each rate of said N-bit parallel signals output from said third conversion means, based on the counter value of said third counter that is held, supply said first control signal to said third control means, and initialize the counter value of said third counter.

13. The information processing device according to claim 12, wherein said predetermined value is a value determined by the sampling rate of said digital signals supplied to said second conversion means, the delay interval M between each data of the L data groups input to said third conversion means, the number of bits N, and the rate of said N-bit parallel signals output from said third conversion means.

14. The information processing device according to claim 9, wherein said N data groups are parallel signals of N bits;

and wherein said first control signal generating means increment the counter value of a second counter by a predetermined value for each sampling rate corresponding to a value obtained by subtracting, from the sampling rate of said digital signals supplied to said second conversion means, the delay interval M between each data of the L data groups input to said third conversion means, in the event that the counter value of said second counter has exceeded a predetermined threshold, initialize the counter value of said second counter, and increment the counter value of said third counter, and generate said first control signal indicating the count of the signals to be output to two output terminals, for each rate of said N-bit parallel signals output from said third conversion means, based on the counter value of said third counter that is held, supply said first control signal to said third control means, and initialize the counter value of said third counter.

15. The information processing device according to claim 14, wherein said predetermined value is a value determined by the sampling rate of said digital signals supplied to said second conversion means, the delay interval M between each data of said L data groups input to said third conversion means, the number of bits N, and the rate of said N-bit parallel signals output from said third conversion means.

16. The information processing device according to claim 5, wherein said N data groups are parallel signals of N bits;

and wherein interpolation processing executed by said third conversion means interpolate signals at a rate of one sample per Fin/(MNFout−Fin) samples, based on a sampling rate Fin of said digital signals supplied to said second conversion means, the delay interval M between each data of said L data groups input to said third conversion means, the number of bits N, and a rate Fout of said N bits of parallel signals output from said third conversion means.

17. The information processing device according to claim 5, wherein, of said K third conversion means, said third conversion means execute interpolation processing by making selection regarding each input signal of said L data groups, based on control of said control means, whether to output to one output terminal, output to two output terminals, output to three output terminals, or output to no output terminal.

18. The information processing device according to claim 17, said control means comprising:
first signal generating means for generating first control signals for selecting, of said L data groups input to said third conversion means, signals to be output to three output terminals; and
second control signal generating means for generating second control signals for selecting a start point of signals selected from said L data groups input to said third conversion means as said N data groups output from said third conversion means, and third control signals for instructing initialization of a delay amount from the start point in the previous output.

19. The information processing device according to claim 18, wherein said third conversion means execute interpolation processing such that two systems of output, interpolated on the average at a similar rate;

and wherein said second control signal generating means calculate the difference between the count of signals of said L data groups input to said third conversion means at an immediately-preceding timing that have been output to two output terminals at the time of output of either of the two systems of output, and a predetermined threshold value, generate said second control signals for increasing the amount of said delay from said start point in the previous output by said difference that has been calculated, and supply said second control signals to said third control means.

20. The information processing device according to claim 18, wherein said second control signal generating means increment a counter value of a first counter by a predetermined value for each first rate which is 1/J times the sampling frequency of said digital signal supplied to said third conversion means, generate said second control signals instructing initialization of the delay amount in the event that the counter value of said first counter exceeds a predetermined threshold, and supply said second control signals to said third control means.

21. The information processing device according to claim 18, wherein said N data groups are parallel signals of N bits;

and wherein said first control signal generating means increment the counter value of a second counter by a predetermined value for each sampling rate corresponding to a value obtained by dividing the sampling rate of said digital signals supplied to said second conversion means by the delay interval M between each data of said L data groups input to said third conversion means, and also increment the counter values of a third counter and a fourth counter by 1, in the event that the counter value of said second counter has exceeded a predetermined first threshold, initialize the counter value of said second counter, hold the counter value of said third counter, increment the counter value of said third counter by 2, and initialize said fourth counter, in the event that the counter value of said fourth counter is equal to a predetermined second threshold, hold the counter value of said third counter and increment the counter value of said fourth counter by 2, and generate said first control signal indicating which of the input signals the signals to be output to three output terminals are, for each rate of said N-bit parallel signals output from said third conversion means, based on the counter value of said third counter that is held, supply said first control signal to said third control means, and initialize the counter value of said third counter.

22. The information processing device according to claim 5, wherein said N data groups are parallel signals of N bits;

and wherein said third conversion means generate X sets of N/X-bit signals in which signals have been interpolated at a rate of one sample per Fin/(MNFout−Fin) samples, based on a sampling rate Fin of said digital signals supplied to said second conversion means, the delay interval M between each data of said L data groups, the number of bits N, and a rate Fout of said N bits of parallel signals output from said third conversion means.

23. The information processing device according to claim 5, said third conversion means comprising:
a plurality of interpolation processing means; and
synthesizing means for synthesizing output signals of said plurality of interpolation processing means to generate said N data groups;
wherein said plurality of interpolation processing means which said third conversion means have output a data series corresponding to, of said K third conversion means, the i'th ($0 \leq i \leq K$) tap coefficient, receive input of said L data groups delayed by i, i+M, i+2M, . . . , i+(L−1)M samples from the current timing, and execute interpolation processing by making selection regarding each input signal of said L data groups, based on control of said control means, whether to output to one output terminal, output to two output terminals, or output to neither output terminal, and output N data each; and
synthesize data output from each of said plurality of interpolation means, so as to generate said N data groups.

24. The information processing device according to claim 23, said control means comprising:
first signal generating means for generating, for each of said plurality of interpolation means of said third conversion means, first control signals for selecting, of said L data groups input to said plurality of interpolation means, signals to be output to two output terminals; and
second control signal generating means for generating second control signals for selecting a start point of signals selected from said L data groups input to said plurality of interpolation means of said third conversion means as data output from said interpolation means, and third control signals for instructing initialization of a delay amount from the start point in the previous output.

25. The information processing device according to claim 24, wherein said second control signal generating means calculate the difference between the count of signals of said L data groups input to said interpolation means at an immediately-preceding timing that have been output thereby to two output terminals, and a predetermined threshold value, generate said second control signals for increasing the amount of said delay from said start point in the previous output by said difference that has been calculated, and supply said second control signals to said interpolation means.

26. The information processing device according to claim 24, wherein said second control signal generating means increment a counter value of a first counter by a predetermined value for each first rate which is 1/J times the sampling frequency of said digital signal supplied to said third conversion means, generate said second control signals instructing initialization of the delay amount in the event that the counter value of said first counter exceeds a predetermined threshold, and supply said second control signals to said third control means.

27. The information processing device according to claim 24, wherein said N data groups are parallel signals of N bits;
and wherein said first control signal generating means increment the counter value of a second counter by a predetermined value for each sampling rate corresponding to a value obtained by dividing the sampling rate of said digital signals supplied to said second conversion means by the delay interval M between each data of said L data groups input to said third conversion means, and also increment the counter values of a third counter and a fourth counter by 1, in the event that the counter value of said second counter has exceeded a predetermined first threshold, initialize the counter value of said second counter, hold the counter value of said third counter, increment the counter value of said third counter by 2, and initialize said fourth counter, in the event that the counter value of said fourth counter is equal to a predetermined second threshold, hold the counter value of said third counter and increment the counter value of said fourth counter by 2, and generate, for each of said interpolation means, said first control signal indicating which of the input signals the signals to be output to two output terminals are, for each rate of said N-bit parallel signals output from said third conversion means, based on the counter value of said third counter that is held, supply said first control signal to said plurality of interpolation means of said third control means, and initialize the counter value of said third counter.

28. The information processing device according to claim 23, wherein said N data groups are parallel signals of N bits;
and wherein said interpolation means generate N-bit signals in which signals have been interpolated at a rate of one sample per Fin/(MNFout−Fin) samples, based on a sampling rate Fin of said digital signals supplied to said second conversion means, the delay interval M between each data of said L data groups, the number of bits N, and a rate Fout of said N bits of parallel signals output from said third conversion means.

29. The information processing device according to claim 1, said digital filter means comprising:
tap coefficient storage means for storing tap coefficients corresponding to a plurality of wireless systems;
wherein a tap coefficient corresponding to a currently-used wireless system is selected from the tap coefficients corresponding to a plurality of wireless systems stored by said tap coefficient storage means, and said K'th-order FIR filter computation processing is executed on K digital signals subjected to sampling rate conversion by said first conversion means.

30. The information processing device according to claim 1, said first conversion means further comprising:
K addition or selection processing means for adding data included in said N data groups output from said second conversion means, or selecting one of predetermined signals from said N data groups output from said second conversion means.

31. The information processing device according to claim 30, wherein said addition or selection processing means output, based on a modulation scheme of said reception signals, one or the other of addition results of the signals of said N data groups output from said second conversion means, or the predetermined signal selected from said N data groups output from said second conversion means.

32. The information processing device according to claim 31, wherein, in the event that said reception signals are reception signals to which the IEEE 802.11a or IEEE 802.11g standards have been applied, said addition or selection processing means output addition results of said N data groups output from said second conversion means in the event that the modulation scheme thereof is 16-QAM or 64-QAM, and output the predetermined signal selected from said N data groups output from said second conversion means in the event that the modulation scheme thereof is BPSK or QPSK.

33. The information processing device according to claim 1, said first conversion means further comprising:
K selection processing means for selecting one of predetermined signals from said N data groups output from said second conversion means.

34. An information processing method of an information processing device for processing reception signals converted into digital signals, said method comprising the steps of:
executing sampling rate conversion of each of said digital signals to be computed with each tap coefficient of a K'th-order FIR filter in response to a sampling rate control signal, wherein said executing sampling rate conversion of each of said digital signals to be computed with each tap coefficient of a K'th-order FIR filter comprises the steps of:
decimating said digital signals to be computed with each tap coefficient of said K'th-order FIR filter by a predetermined rate M;
subjecting said decimated signals to interpolation processing and sampling rate conversion, wherein signals that have been subjected to interpolation and sampling rate conversion are parallel signals of N samples; and in the interpolation processing, signals are interpolated at a rate of one sample per Fin/(MNFout−Fin) samples, based on a sampling rate Fin of said digital signals, the decimation rate M, the number of samples N to be added, and a rate Fout of said N samples of parallel signals to be added; and executing in response to a digital filter control signal, computation processing of said K'th order FIR filter on K digital signals each of which have been subjected to sampling rate conversion.

35. The information processing method according to claim 34, said executing sampling rate conversion of each of said digital signals to be computed with each tap coefficient of a K'th-order FIR filter further comprising the steps of:

adding said signals that have been subjected to interpolation and sampling rate conversion, and outputting.

36. The information processing method according to claim 34, said executing sampling rate conversion of each of said digital signals to be computed with each tap coefficient of a K'th-order FIR filter further comprising the steps of:

either adding said signals that have been subjected to interpolation and sampling rate conversion, or selecting one predetermined signal from said predetermined N sample signals, and outputting.

37. The information processing method according to claim 36, wherein, in the adding of signals subjected to rate conversion or selecting and outputting one predetermined signal from signals which have been subjected to interpolation and rate conversion, either the addition results or the selected predetermined signal is output, based on a modulation scheme of said reception signals.

38. The information processing method according to claim 37, wherein, in the outputting of addition results or selecting and outputting of one predetermined signal, in the event that said reception signals are reception signals to which the IEEE 802.11a or IEEE 802.11g standards have been applied, addition results of said N samples are output in the event that the modulation scheme thereof is 16-QAM or 64-QAM, and the predetermined signal selected from said N samples is output in the event that the modulation scheme thereof is BPSK or QPSK.

39. The information processing method according to claim 34, said executing sampling rate conversion of each of said digital signals to be computed with each tap coefficient of a K'th-order FIR filter further comprising the steps of:

selecting one predetermined signal from N predetermined sample signals that have been subjected to interpolation and rate conversion, and outputting.

40. An information processing device for processing reception signals converted into digital signals, comprising:

a first conversion unit for executing sampling rate conversion of each of said digital signals, wherein said first conversion unit executes sampling rate conversion by subjecting each of said digital signals to thinning out, interpolation, or filtering processing, said first conversion unit comprising:

a second conversion unit for receiving input of said digital signals, and converting a predetermined L data groups out of said digital signals that have been input, into output of K series corresponding to the tap coefficients of said K'th-order FIR filter;

K third conversion means for subjecting said L data groups output from said second conversion means to interpolation and rate conversion, and outputting N data groups, N being a data count different from the data count L, wherein, of said K third conversion means, said third conversion means output a data series corresponding to the i'th ($0 \leq i \leq K$) tap coefficient receive input of said L data groups delayed by i, i+M, i+2M, . . . , i+(L−1)M samples from the current timing;

a digital filter computing unit forming a K'th order FIR filter on K digital signals each of which have been subjected to sampling rate conversion by said first conversion unit; and a control unit, responsive to a control signal, for controlling sampling rate conversion of said digital signals by said first conversion unit, and controlling the-processing of said filter computing unit.

* * * * *